US012787638B2

(12) United States Patent
Lu et al.

(10) Patent No.: US 12,787,638 B2
(45) Date of Patent: Nov. 3, 2026

(54) SPIROFLUORENE SILICON COMPOUND AND ELECTROLUMINESCENCE USING THE SAME

(71) Applicant: Shanghai Tianma Micro-Electronics Co., Ltd., Shanghai (CN)

(72) Inventors: Tingting Lu, Wuhan (CN); Wei Gao, Wuhan (CN); Wenpeng Dai, Wuhan (CN); Lu Zhai, Wuhan (CN); Kebin An, Shanghai (CN)

(73) Assignee: Shanghai Tianma Micro-Electronics Co., Ltd., Shanghai (CN)

( * ) Notice: Subject to any disclaimer, the term of this patent is extended or adjusted under 35 U.S.C. 154(b) by 939 days.

(21) Appl. No.: 18/107,623

(22) Filed: Feb. 9, 2023

(65) Prior Publication Data

US 2024/0147840 A1 May 2, 2024

(30) Foreign Application Priority Data

Sep. 26, 2022 (CN) ......................... 202211172952.2

(51) Int. Cl.

| | |
|---|---|
| ***H10K 85/40*** | (2023.01) |
| ***C07F 7/08*** | (2006.01) |
| ***C07F 7/10*** | (2006.01) |
| ***H10K 50/16*** | (2023.01) |
| ***H10K 50/18*** | (2023.01) |

(52) U.S. Cl.

CPC ........... *H10K 85/40* (2023.02); *C07F 7/0816* (2013.01); *C07F 7/10* (2013.01); *H10K 50/16* (2023.02); *H10K 50/18* (2023.02)

(58) Field of Classification Search

None

See application file for complete search history.

(56) References Cited

U.S. PATENT DOCUMENTS

2017/0025627 A1 1/2017 Schaefer et al.

FOREIGN PATENT DOCUMENTS

| | | | | |
|---|---|---|---|---|
| CN | 104311588 B | | 1/2015 | |
| CN | 106946859 B | | 7/2017 | |
| KR | 20200010137 A | * | 1/2020 | ......... H01L 51/0072 |

* cited by examiner

*Primary Examiner* — Joseph R Kosack

(74) *Attorney, Agent, or Firm* — Anova Law Group, PLLC

(57) ABSTRACT

A compound is provided as having the structure of Formula I,

Formula I

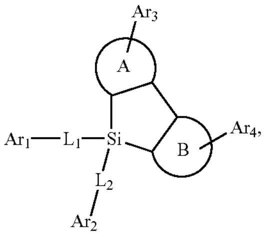

where: A and B are each independently a substituted or unsubstituted aryl group or a substituted or unsubstituted heteroaryl group; $L_1$, $L_2$ are each independently a single bond, a substituted or unsubstituted aryl group, or a substituted or unsubstituted heteroaryl group; $Ar_1$, $Ar_2$, $Ar_3$, and $Ar_4$ are each independently a hydrogen atom, a deuterium atom, a cyano group, a nitro group, an amino group, a hydroxy group, a halogen atom, a substituted or unsubstituted alkyl group, a substituted or unsubstituted aryl group, or a substituted or unsubstituted heteroaryl group.

19 Claims, No Drawings

SPIROFLUORENE SILICON COMPOUND AND ELECTROLUMINESCENCE USING THE SAME

RELATED APPLICATION(S)

This application claims priority to Chinese Patent Application No. CN202211172952.2 filed with the National Intellectual Property Administration, PRC on Sep. 26, 2022, which is incorporated herein by reference in entirety.

FIELD OF THE TECHNOLOGY

The present disclosure relates to the technical field of organic electroluminescent materials, in particular to a spirofluorene silicon compound and electroluminescent implementation of the same.

BACKGROUND

The electron transport material used in certain electroluminescence devices is Alq3, but the electron mobility of Alq3 is relatively low (about $10^{-6}$ $cm^2/Vs$), which often makes the carrier transport of the devices unbalanced. With the commercialization of electroluminescent devices, people hope to obtain ETL materials with higher electron mobility and better performance. In this field, researchers have done a lot of exploratory work.

It is valuable to design and develop stable and efficient electron transport materials and/or electron injection materials, that are of both high electron mobility and high glass transition temperature, and that are effectively doped with metal Yb or Liq, to reduce threshold voltage, improve device efficiency, and extend device life.

SUMMARY

A technical problem to be solved by certain embodiment (s) of the present disclosure is to provide a compound and its electroluminescence implementation, which may effectively improve devices' luminous efficiency and lifespan of usage time. In certain embodiment(s), the compound is named a spirofluorene silicon compound.

In one aspect, the present disclosure provides a compound having a structure of Formula I:

Formula I

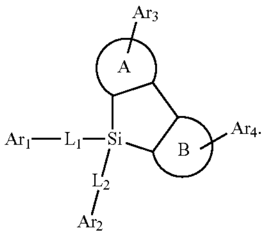

Where: A and B are each independently a substituted or unsubstituted aryl group or a substituted or unsubstituted heteroaryl group; $L_1$, $L_2$ are each independently a single bond, a substituted or unsubstituted aryl group, or a substituted or unsubstituted heteroaryl group; $Ar_1$, $Ar_2$, $Ar_3$, $Ar_4$ are each independently a hydrogen atom, a deuterium atom, a cyano group, a nitro group, an amino group, a hydroxy group, a halogen atom, a substituted or unsubstituted alkyl group, a substituted or unsubstituted aryl group, or a substituted or unsubstituted heteroaryl group.

In another aspect, the present disclosure provides an organic light-emitting device, the organic light-emitting device includes an anode, a cathode, and an organic thin film layer between the anode and the cathode, the organic thin film layer includes a compound, having a structure of Formula I:

Formula I

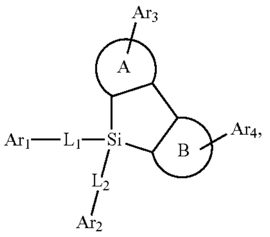

Where: A and B are each independently a substituted or unsubstituted aryl group or a substituted or unsubstituted heteroaryl group; $L_1$, $L_2$ are each independently a single bond, a substituted or unsubstituted aryl group, or a substituted or unsubstituted heteroaryl group; $Ar_1$, $Ar_2$, $Ar_3$, and $Ar_4$ are each independently a hydrogen atom, a deuterium atom, a cyano group, a nitro group, an amino group, a hydroxy group, a halogen atom, a substituted or unsubstituted alkyl group, a substituted or unsubstituted aryl group, or a substituted or unsubstituted heteroaryl group.

In yet another aspect, the present disclosure provides a display panel, which includes an organic light emitting device, and the organic light emitting device includes an anode, a cathode, and an organic thin film layer between the anode and the cathode, the organic thin film layer includes a compound, having a structure of Formula I:

Formula I

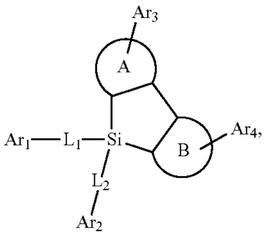

Where: A and B are each independently a substituted or unsubstituted aryl group or a substituted or unsubstituted heteroaryl group; $L_1$, $L_2$ are each independently a single bond, a substituted or unsubstituted aryl group, or a substituted or unsubstituted heteroaryl group; $Ar_1$, $Ar_2$, $Ar_3$, and $Ar_4$ are each independently a hydrogen atom, a deuterium atom, a cyano group, a nitro group, an amino group, a hydroxy group, a halogen atom, a substituted or unsubstituted alkyl group, a substituted or unsubstituted aryl group, or a substituted or unsubstituted heteroaryl group.

DETAILED DESCRIPTION

In one aspect, the present disclosure provides a spirofluorene silicon compound having a structure shown in Formula I:

Formula I

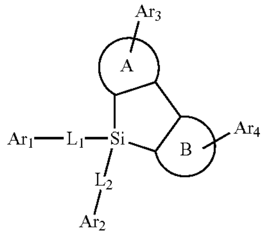

where: A and B are each independently a substituted or unsubstituted aryl group or a substituted or unsubstituted heteroaryl group; $L_1$, $L_2$ are each independently a single bond, a substituted or unsubstituted aryl group, or a substituted or unsubstituted heteroaryl group; $Ar_1$, $Ar_2$, $Ar_3$, $Ar_4$ are each independently a hydrogen atom, a deuterium atom, a cyano group, a nitro group, an amino group, a hydroxy group, a halogen atom, a substituted or unsubstituted alkyl group, a substituted or unsubstituted aryl group, or a substituted or unsubstituted heteroaryl group. The compound may be used as an electron transport layer in organic optoelectronic devices, which may improve the electron transport rate, balance the injection of electrons and holes, and improve the efficiency and life span of the organic light-emitting device (OLED).

In certain embodiment(s), A and B are each independently selected from substituted or unsubstituted C6-C20 aryl or substituted or unsubstituted C3-C20 heteroaryl, and the heteroaryl includes a heteroatom selected from one or more of N, O, S, and Si.

In certain embodiment(s), A and B are each independently selected from one or more of: substituted or unsubstituted monocyclic aryl; substituted or unsubstituted monocyclic heteroaryl; condensed aryl formed by condensing 2-3 substituted or unsubstituted monocyclic aryl groups; condensed heteroaryl formed by condensing 2-3 substituted or unsubstituted monocyclic aryl and monocyclic heteroaryl groups; and condensed heteroaryl formed by condensing 2-3 substituted or unsubstituted monocyclic heteroaryl groups.

In certain embodiment(s), the monocyclic aryl group is a phenyl, wherein the monocyclic heteroaryl is a five-membered, six-membered, or seven-membered monocyclic heteroaryl, and wherein the monocyclic heteroaryl includes a heteroatom selected from one or more of N, O, and S.

In certain embodiment(s), the monocyclic heteroaryl group includes one or more selected from pyrrolyl, furyl, thienyl, imidazolyl, pyrazolyl, isothiazolyl, isoxazolyl, oxazolyl, thiazolyl, thiadiazole, triazole, tetrazolyl, pyridyl, pyranyl, pyrimidinyl, pyridazinyl, pyrazinyl, and triazinyl.

In certain embodiment(s), the A and B are each independently selected from substituted or unsubstituted phenyl, pyrrolyl, furyl, thienyl, imidazolyl, pyrazolyl, isothiazolyl, isoxazolyl, oxazolyl, thiazolyl, triazolyl, tetrazolyl, pyridyl, pyranyl, pyrimidinyl, pyridazinyl, pyrazinyl, triazinyl, naphthyl, quinolinyl, quinoxalinyl, isoquinolinyl, quinazolinyl, benzimidazolyl, benzothiazolyl, benzoxazolyl, imidazo[1,2-a]pyrimidine, 4-azabenzimidazolyl, 5-azabenzimidazolyl, 4,7-Azabenzimidazolyl, benzothiadiazolyl, benzotriazolyl, anthracenyl, phenanthryl, acridinyl, carbazolyl, fluorenyl, dibenzofuranyl, or dibenzothienyl.

In certain embodiment(s), the spirofluorene silicon compound is of a structure represented by Formula II or Formula III:

Formula II

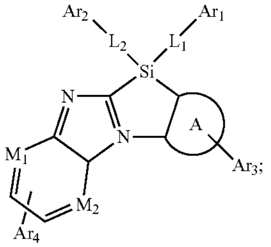

Formula III

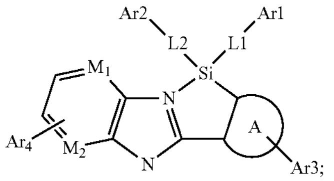

where M1 and M2 are each independently selected from C or N.

In certain embodiment(s), A is substituted or unsubstituted phenyl, pyrrolyl, furyl, thienyl, imidazolyl, pyrazolyl, isothiazolyl, isoxazolyl, oxazolyl, thiazolyl, triazolyl, tetrazolyl, pyridyl, pyranyl, pyrimidinyl, pyridazinyl, pyrazinyl, or triazinyl.

In certain embodiment(s), $L_1$ and $L_2$ are each independently selected from a single bond, substituted or unsubstituted C6-C20 aryl group or substituted or unsubstituted C3-C20 heteroaryl group, the C3-C20 heteroaryl group includes a heteroatom selected from one or more of N, O, S, and Si.

In certain embodiment(s), $L_1$ and $L_2$ are each independently selected from a single bond, or any one of: substituted or unsubstituted monocyclic aryl; substituted or unsubstituted monocyclic heteroaryl; condensed aryl formed by condensing 2-3 substituted or unsubstituted monocyclic aryl groups; condensed heteroaryl formed by condensing 2-3 substituted or unsubstituted monocyclic aryl and monocyclic heteroaryl groups; and condensed heteroaryl formed by condensing 2-3 substituted or unsubstituted monocyclic heteroaryl groups.

In certain embodiment(s), the monocyclic acryl is a phenyl, and wherein the monocyclic heteroaryl includes one or more of pyrrolyl, furyl, thienyl, imidazolyl, pyrazolyl, isothiazolyl, isoxazolyl, oxazolyl, thiazolyl, thiadiazole, triazole, tetrazolyl, pyridyl, pyranyl, pyrimidinyl, pyridazinyl, pyrazinyl, and triazinyl.

In certain embodiment(s), $L_1$, $L_2$ are each independently selected from a single bond, substituted or unsubstituted phenyl, pyrrolyl, furyl, thienyl, imidazolyl, pyrazolyl, isothiazolyl, isoxazolyl, oxazolyl, thiazolyl, triazolyl, tetrazolyl, pyridyl, pyranyl, pyrimidinyl, pyridazinyl, pyrazinyl, triazinyl, naphthyl, quinolinyl, quinoxalinyl, isoquinolinyl, quinazolinyl, benzimidazolyl, benzothiazolyl, benzoxazolyl, imidazo[1,2-a]pyrimidine, 4-azabenzimidazolyl, 5-azabenzimidazolyl, 4,7-Azabenzimidazolyl, benzothiadiazolyl, benzotriazolyl, anthracenyl, phenanthryl, 1-Azaphenanthrenyl, 1,10-phenanthroline, acridinyl, carbazolyl, fluorenyl, dibenzofuranyl, or dibenzothienyl.

In certain embodiment(s), $Ar_1$, $Ar_2$, $Ar_3$, and $Ar_4$ are each independently selected from H, D, cyano, nitro, amino, hydroxyl, halogen, substituted or unsubstituted C1-C10 alkyl, C6-C20 aryl, or C3-C20 heteroaryl, and the heteroaryl includes a heteroatom selected from one or more of N, O, S, Si.

In certain embodiment(s), $Ar_1$, $Ar_2$, $Ar_3$, and $Ar_4$ are each independently selected from H, D, cyano, nitro, amino, hydroxyl, halogen, substituted or unsubstituted C1-C6 alkyl, or any one of: substituted or unsubstituted monocyclic aryl; substituted or unsubstituted monocyclic heteroaryl; condensed aryl formed by condensing 2-3 substituted or unsubstituted monocyclic aryl groups; condensed heteroaryl formed by condensing 2-3 substituted or unsubstituted monocyclic aryl and monocyclic heteroaryl groups; and condensed heteroaryl formed by condensing 2-3 substituted or unsubstituted monocyclic heteroaryl groups.

In certain embodiment(s), $Ar_1$, $Ar_2$, $Ar_3$, and $Ar_4$ are each independently selected from H, D, cyano, nitro, amino, hydroxyl, F, Cl, Br, substituted or unsubstituted methyl, ethyl, n-propyl, isopropyl, n-butyl, isobutyl, tert-butyl, n-pentyl, isopentyl, neopentyl, phenyl, pyrrolyl, furyl, thienyl, imidazolyl, pyrazolyl, isothiazolyl, isoxazolyl, oxazolyl, thiazolyl, triazolyl, tetrazolyl, pyridyl, pyranyl, pyrimidinyl, pyridazinyl, pyrazinyl, triazinyl, naphthyl, quinolinyl, quinoxalinyl, isoquinolinyl, quinazolinyl, benzimidazolyl, benzothiazolyl, benzoxazolyl, imidazo[1,2-a] pyrimidine, 4-azabenzimidazolyl, 5-azabenzimidazolyl, 4,7-Azabenzimidazolyl, benzothiadiazolyl, benzotriazolyl, anthracenyl, phenanthryl, 1-Azaphenanthrenyl, 1,10-phenanthroline, acridinyl, carbazolyl, fluorenyl, dibenzofuranyl, or dibenzothienyl.

In certain embodiment(s), substituents of the A, B, $L_1$, $L_2$, $Ar_1$, $Ar_2$, $Ar_3$, $Ar_4$ are each independently selected from D, cyano, nitro, amino, hydroxy, halogen, substituted or unsubstituted alkyl, aryl, or heteroaryl.

In certain embodiment(s), substituents of A, B, $L_1$, $L_2$, $Ar_1$, $Ar_2$, $Ar_3$, and $Ar_4$ are each independently selected from D, cyano, nitro, amino, hydroxyl, halogen, substituted or unsubstituted C1-C10 alkyl, C6-C20 aryl, or C3-C20 heteroaryl.

In certain embodiment(s), substituents of A, B, $L_1$, $L_2$, $Ar_1$, $Ar_2$, $Ar_3$, $Ar_4$ are each independently selected from D, cyano, nitro, amino, hydroxyl, F, Cl, Br, phenyl, biphenyl, pyridyl, pyrimidinyl, pyrazinyl, pyridazinyl, triazinyl, furyl, thienyl, pyrrolyl, pyranyl, benzimidazolyl, benzothiazolyl, benzoxazolyl, naphthyl, anthracenyl, phenanthryl, carbazolyl, fluorenyl, dibenzofuranyl, dibenzothienyl, quinolinyl, isoquinolinyl, quinoxalinyl, or quinazolinyl.

In certain embodiment(s), the hydrogen atoms employed as a substitute may be further substituted by a phenyl group.

In certain embodiment(s), the spirofluorence silicone compound is of a structure of any of:

A1

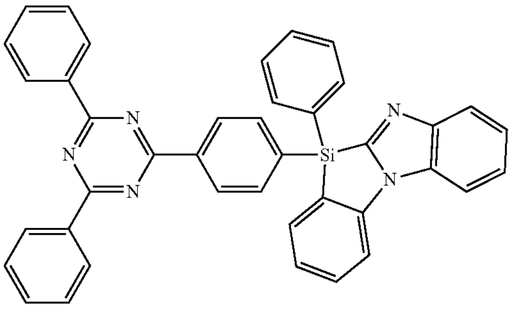

-continued

A2

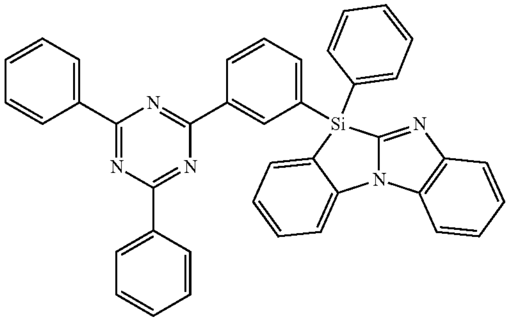

A3

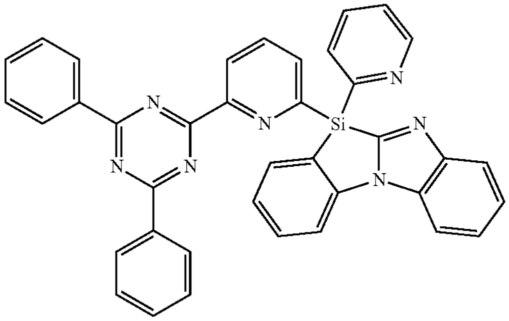

A4

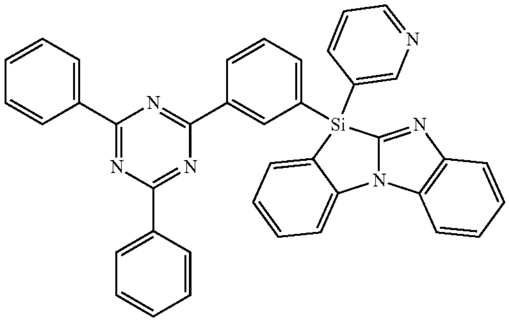

A5

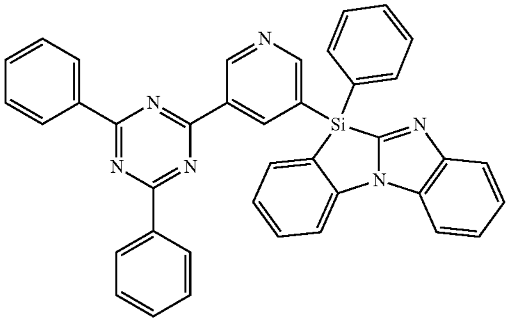

A6

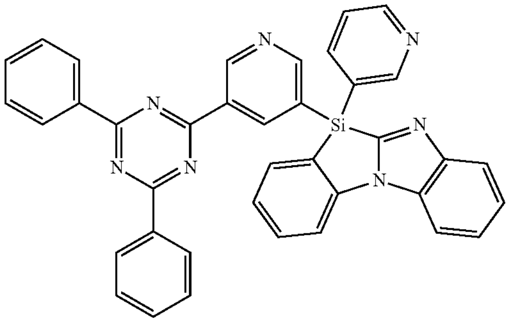

-continued
A7
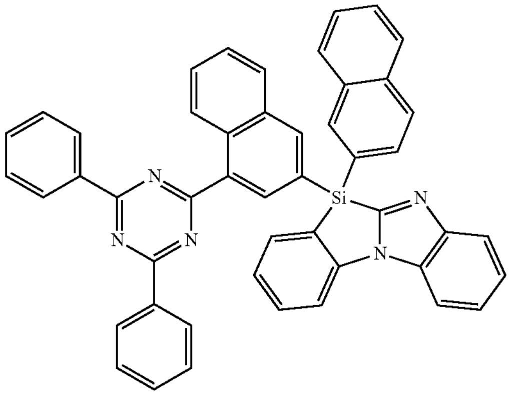
A8
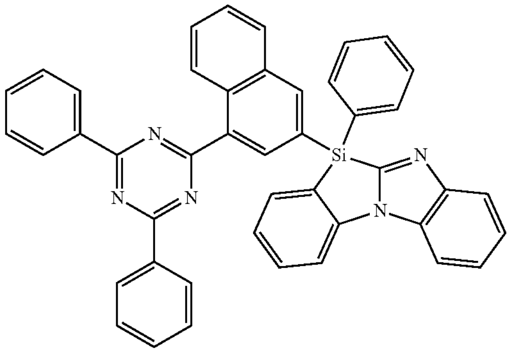
A9
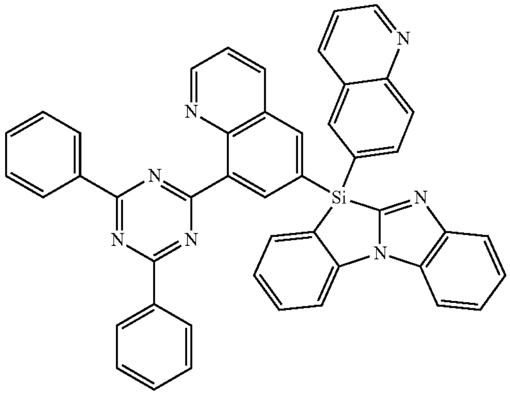
A10
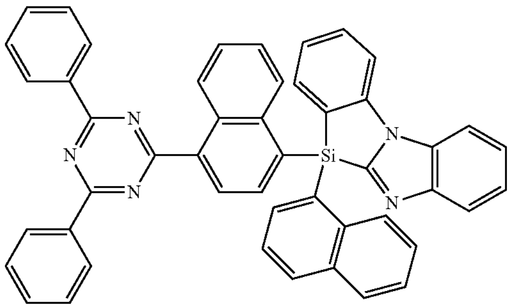
-continued
A11
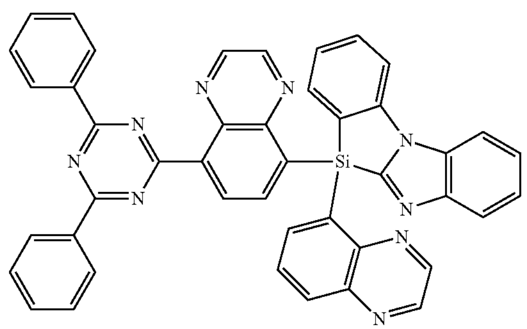
A12
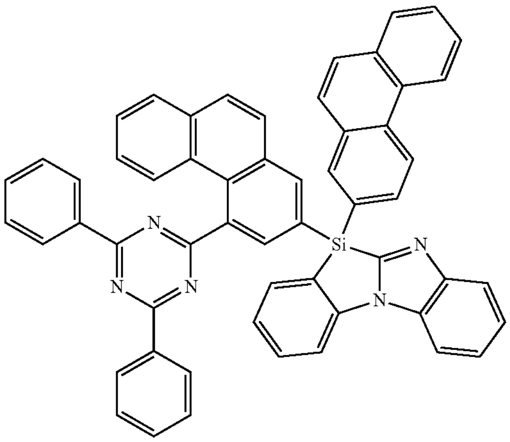
A13
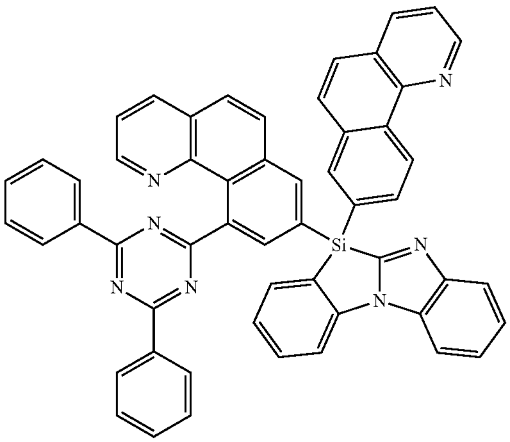

-continued
A14
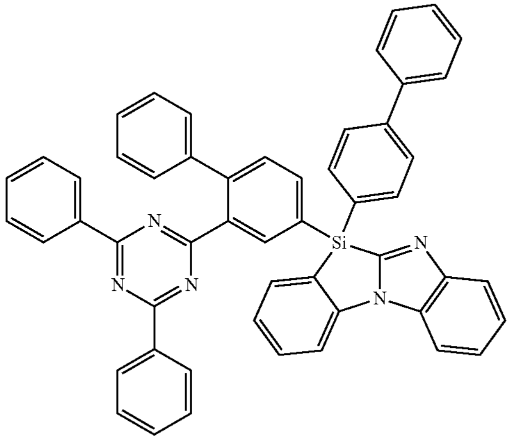
A15
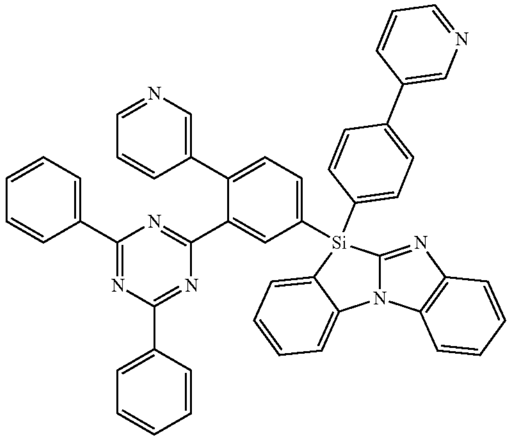
A16
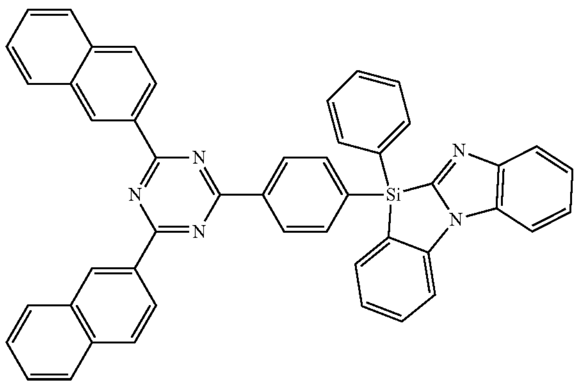
-continued
A17
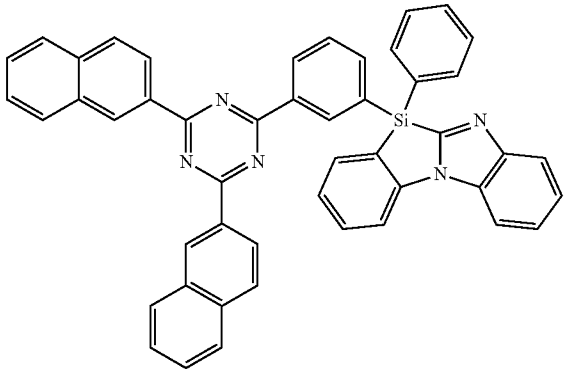
A18
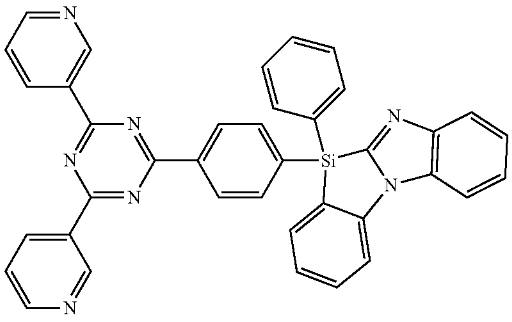
A19
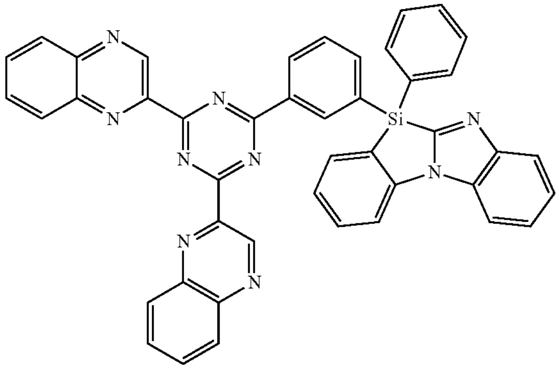
A20
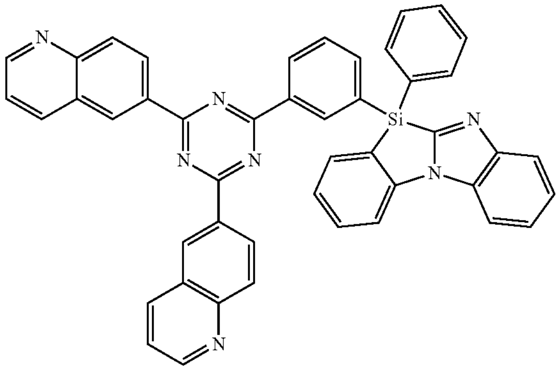

-continued
A21
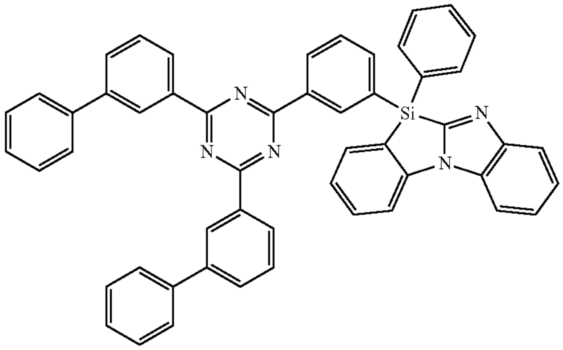
A22
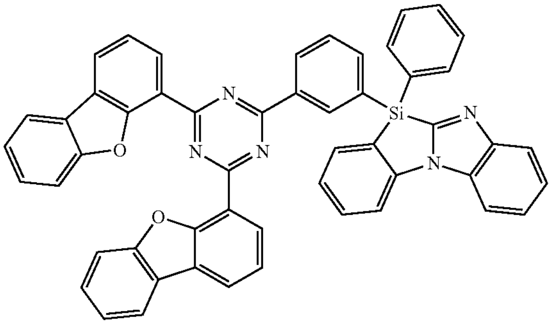
A23
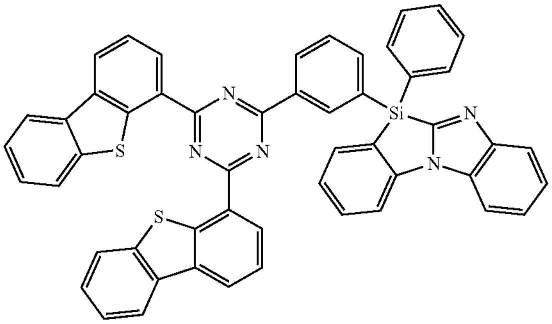
A24
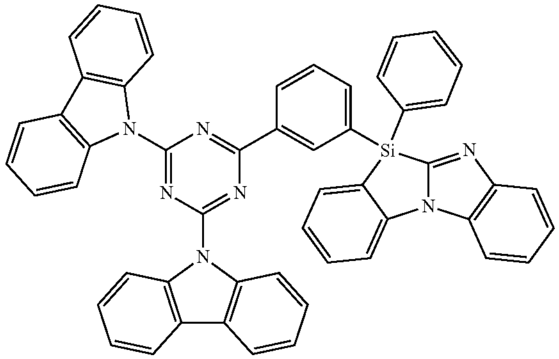
-continued
A25
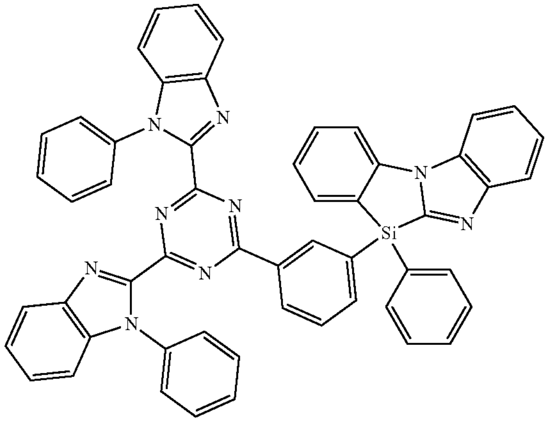
A26
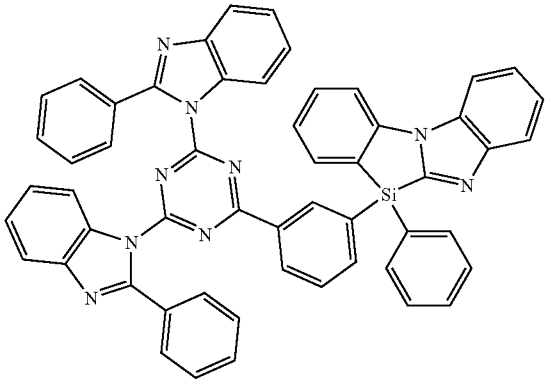
A27
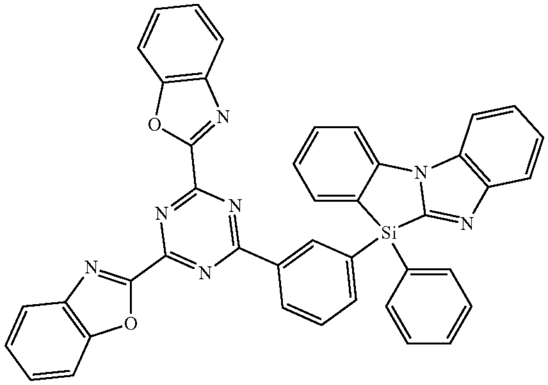

-continued
A28
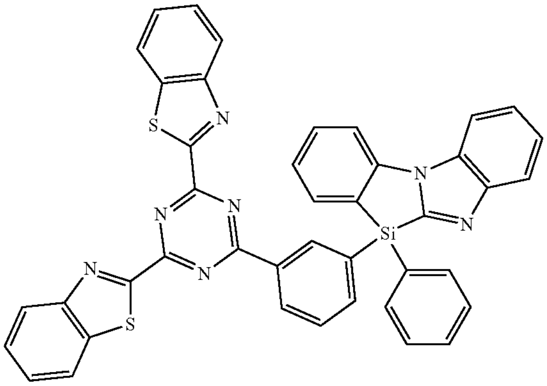
A29
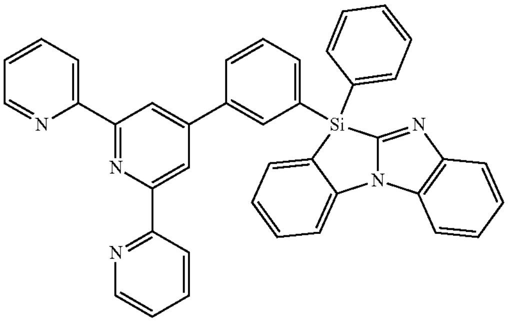
A30
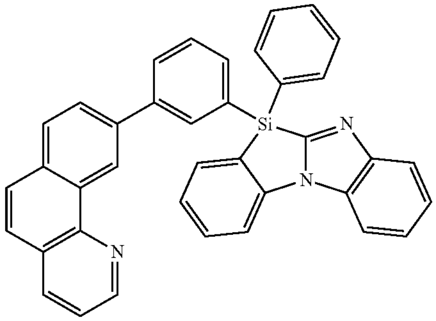
A31
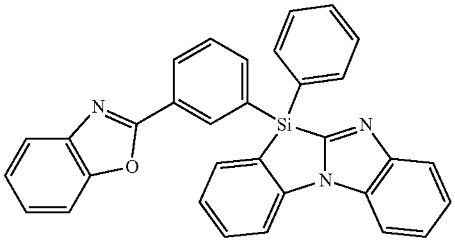
A32
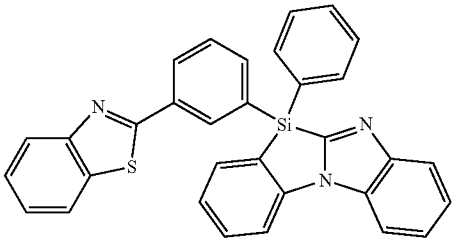
-continued
A33
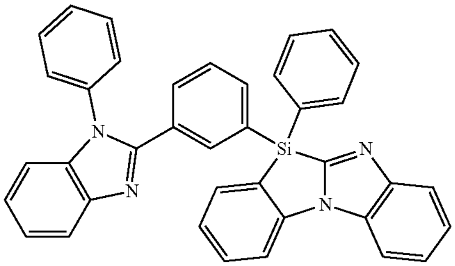
A34
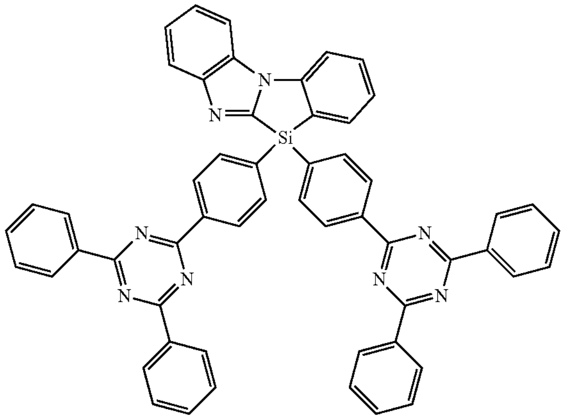
A35
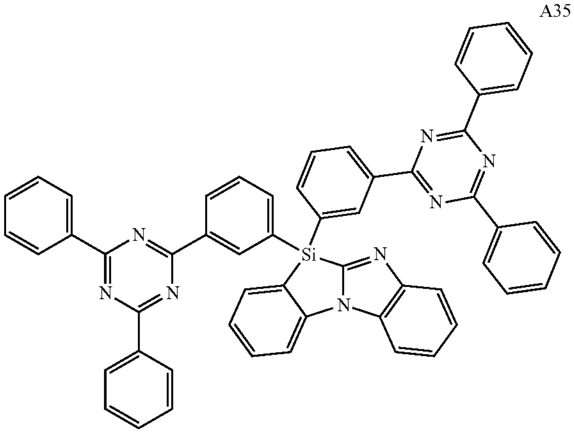
A36
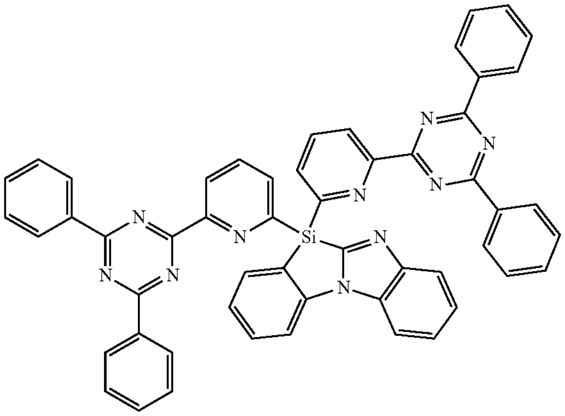

-continued
A37
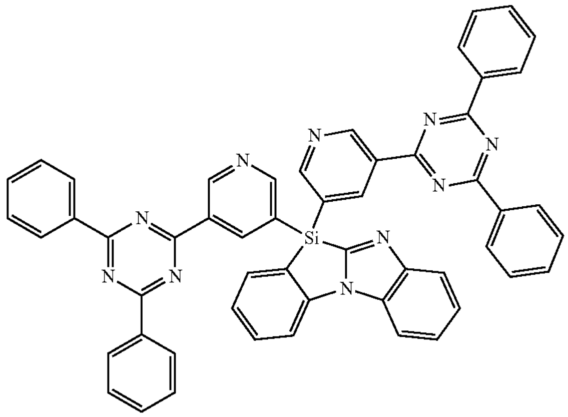
A38
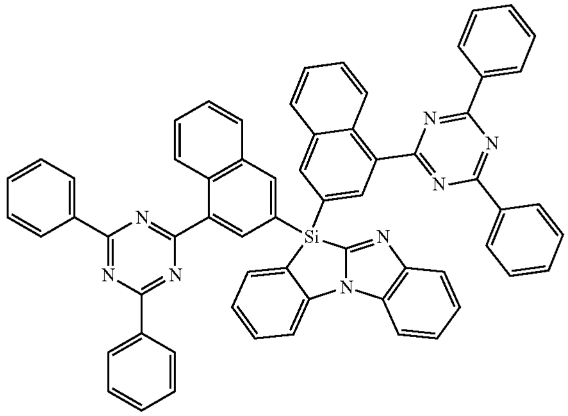
A39
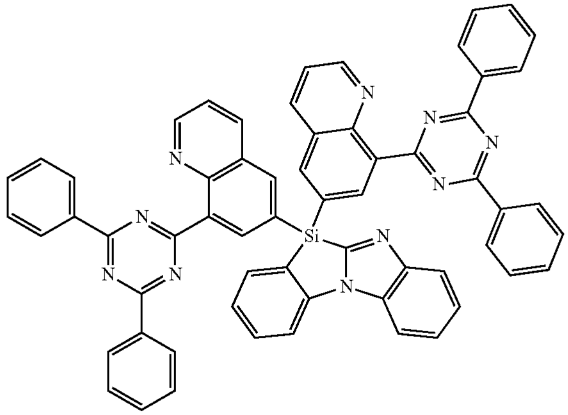
-continued
A40
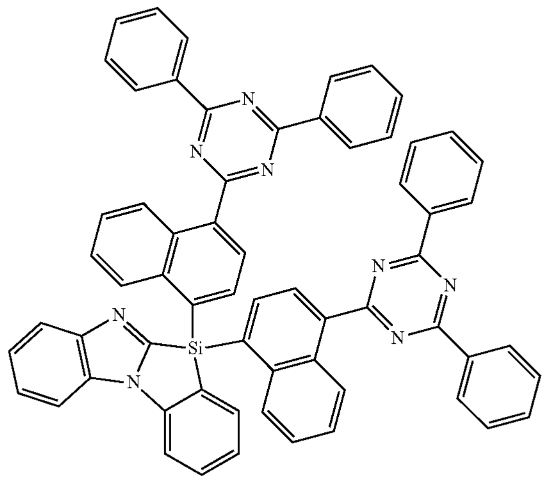
A41
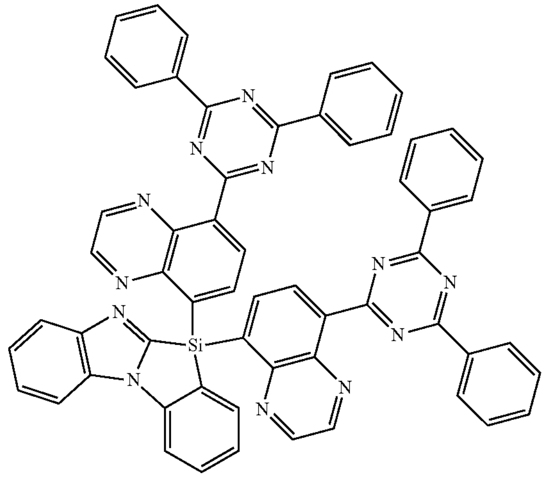
A42
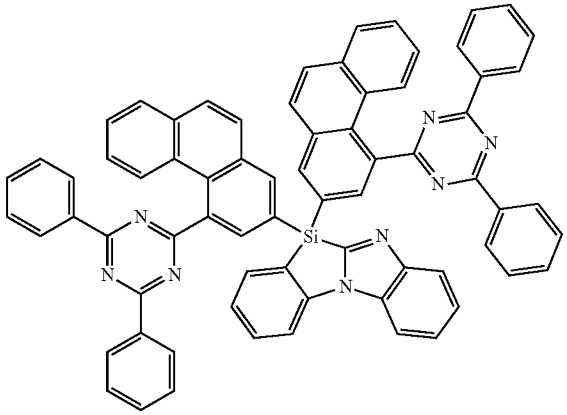

-continued
A43
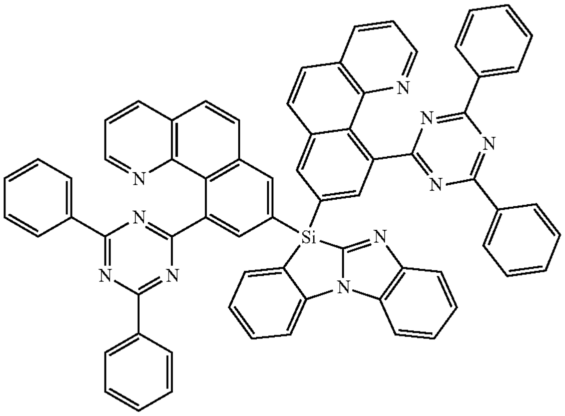
A44
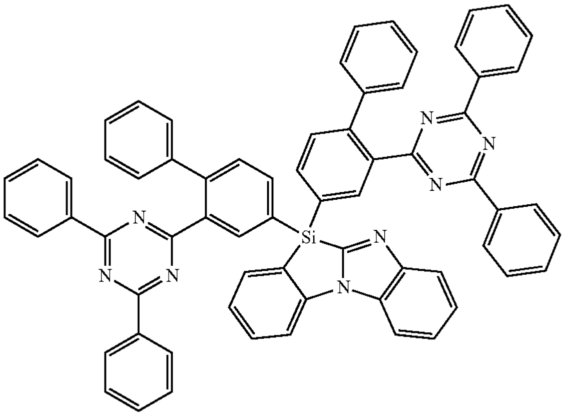
A45
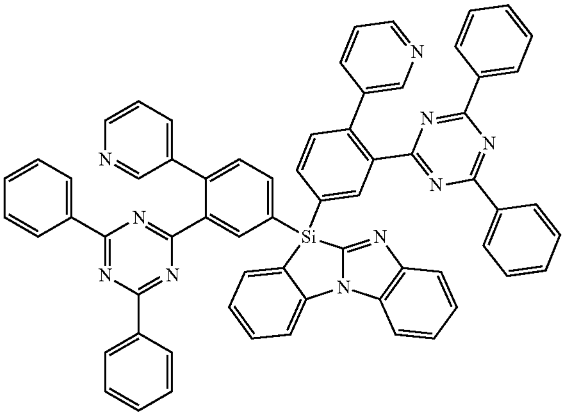
-continued
A46
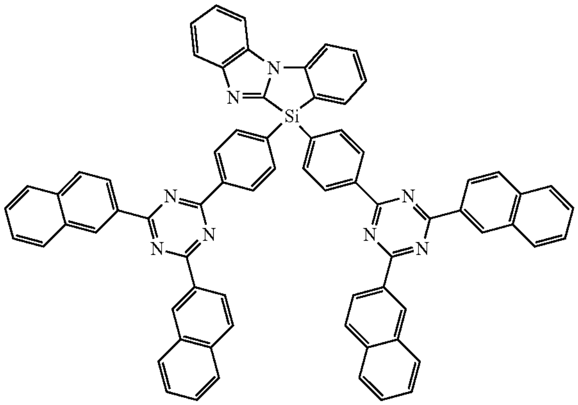
A47
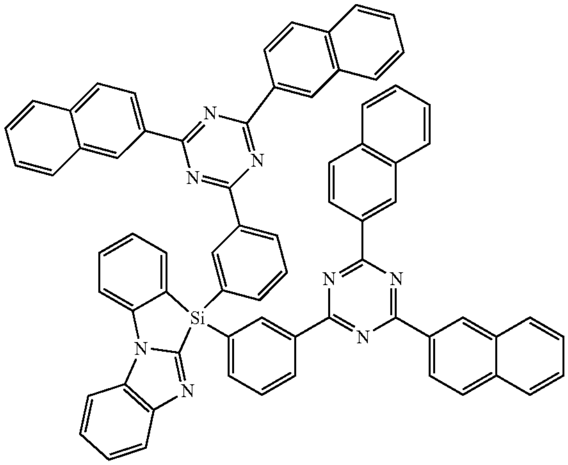
A48
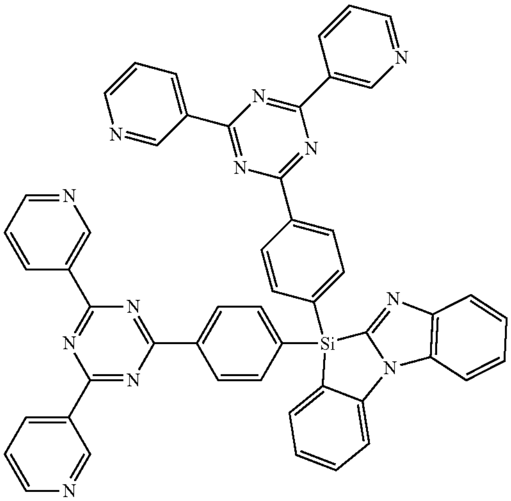

-continued
A49
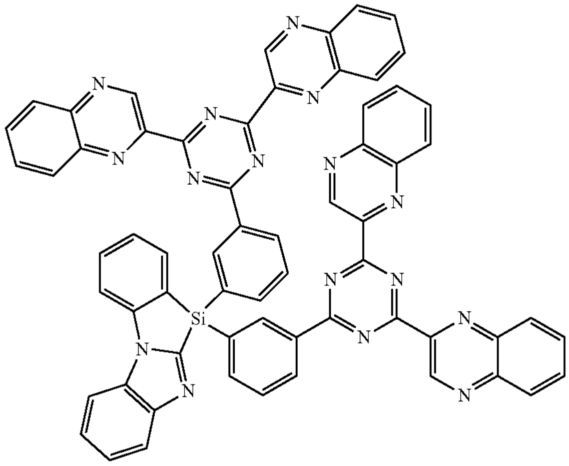
A50
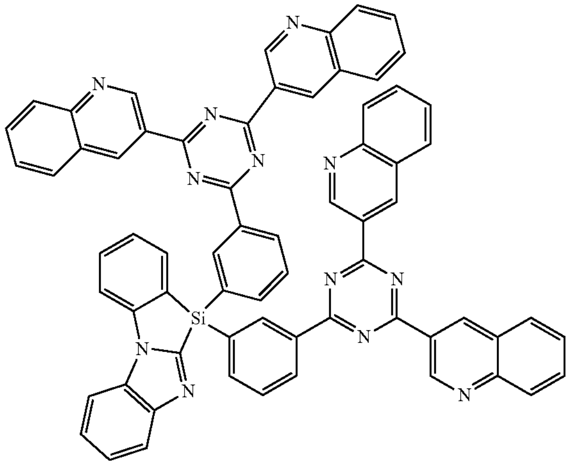
A51
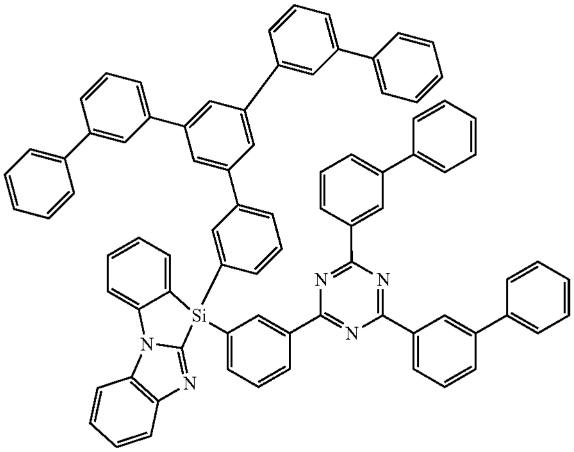
-continued
A52
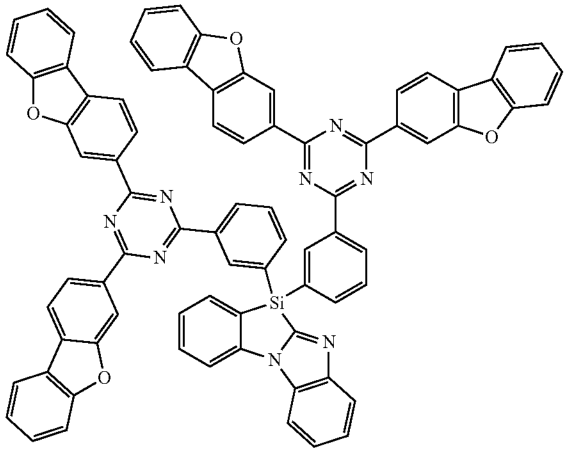
A53
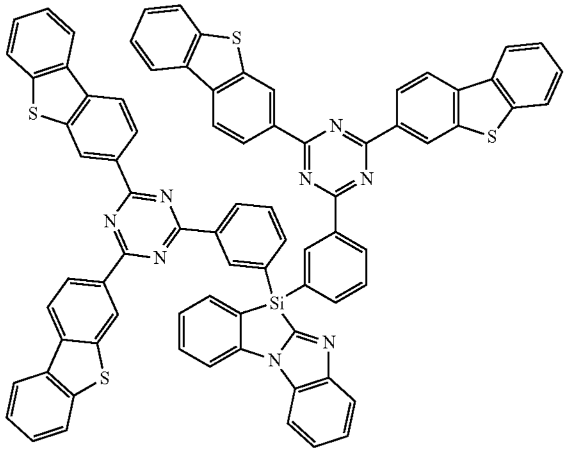
A54
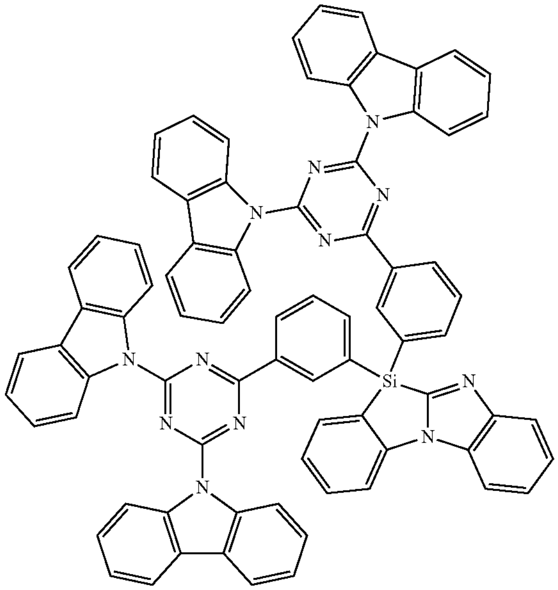

-continued
A55
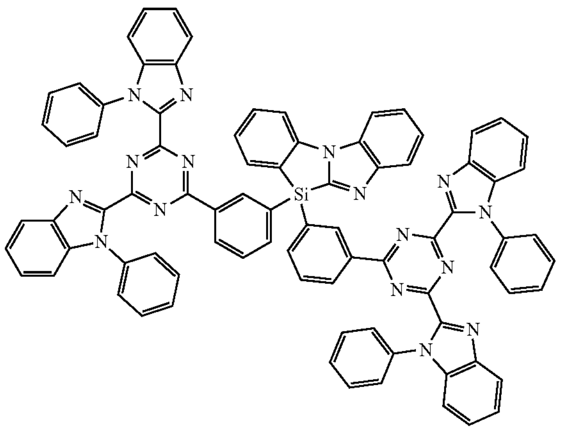
A56
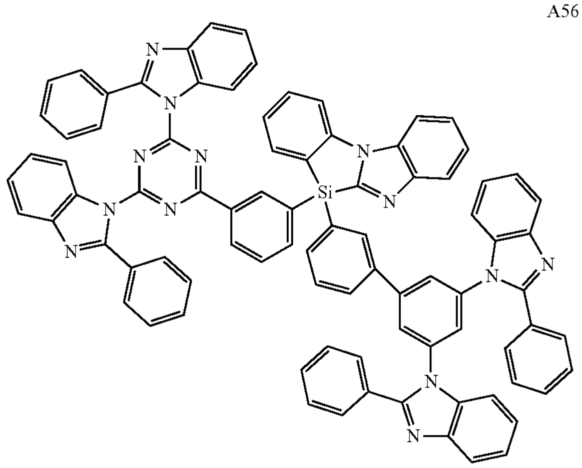
A57
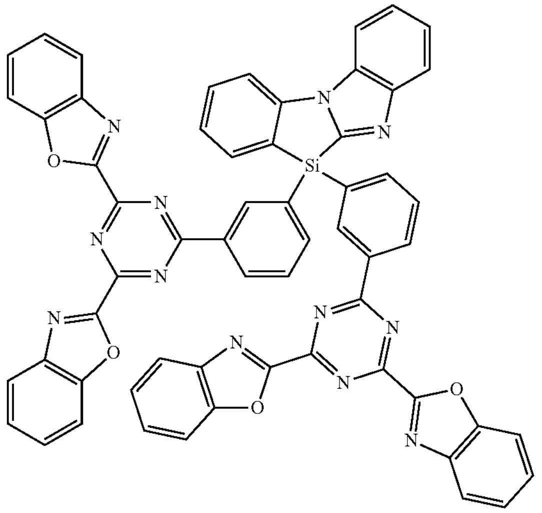
-continued
A58
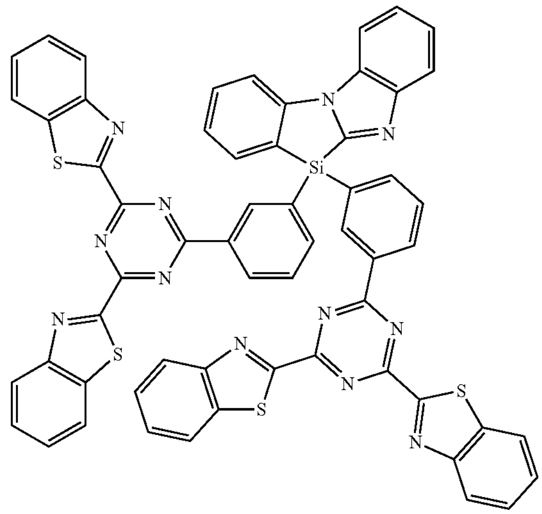
A59
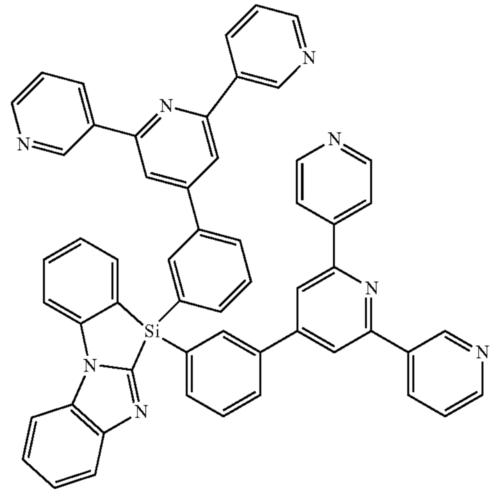
A60
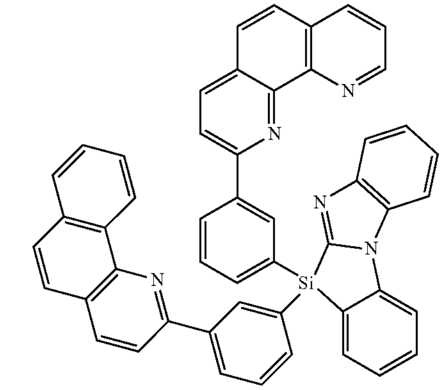

-continued
A61
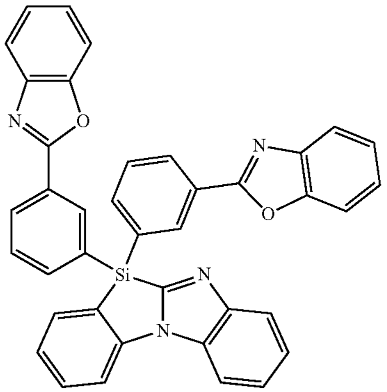
A62
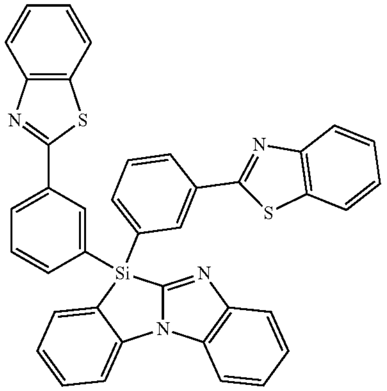
A63
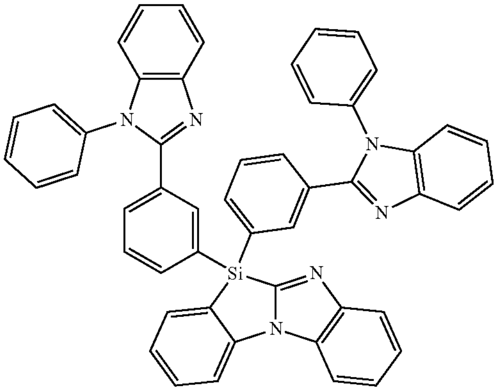
A64
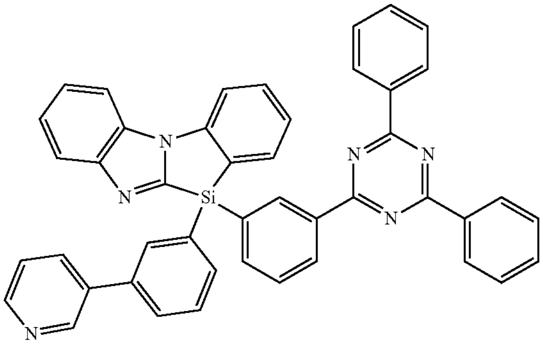
-continued
A65
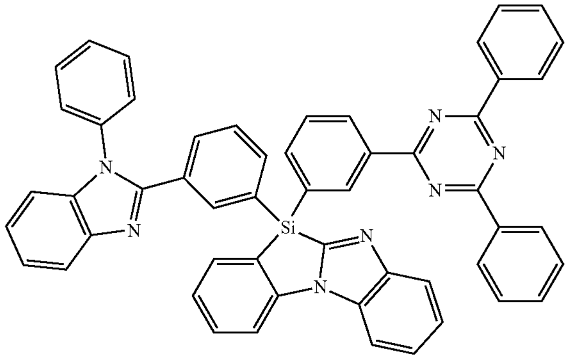
A66
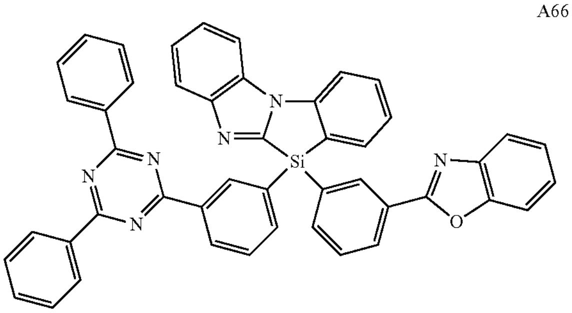
A67
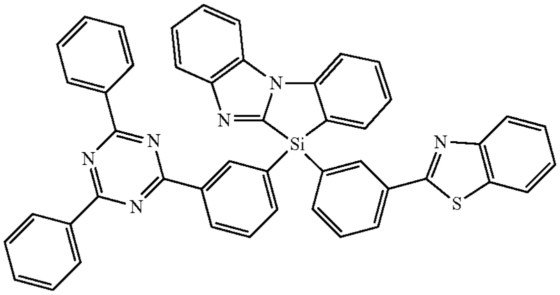
A68
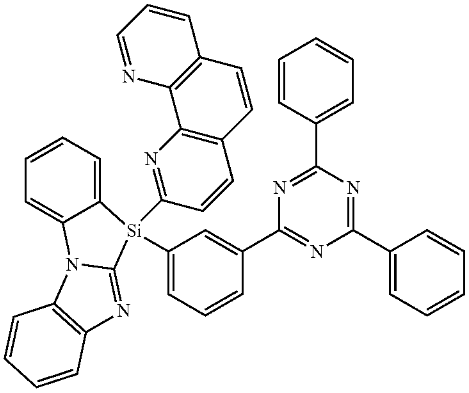

-continued
A69
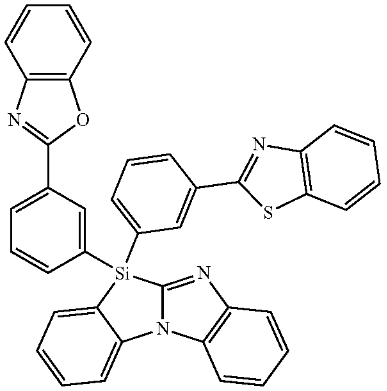
A70
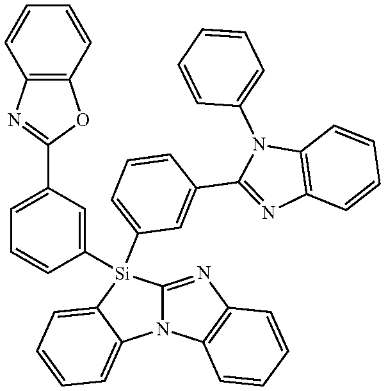
A71
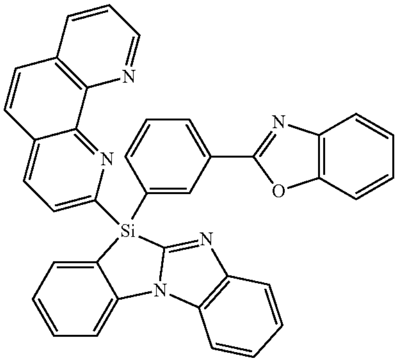
A72
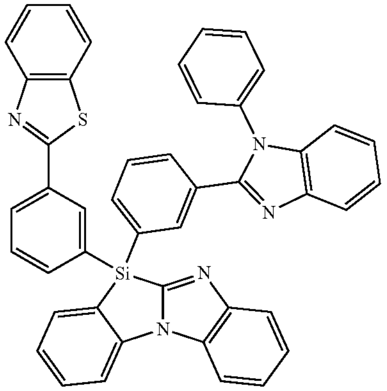
-continued
A73
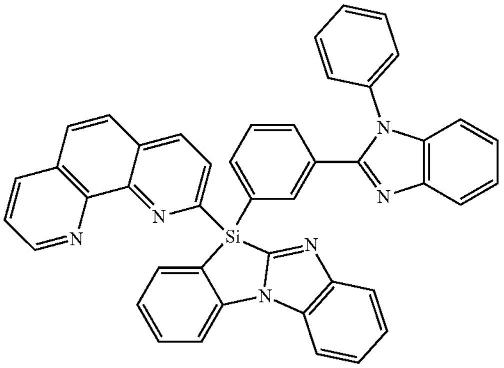
A74
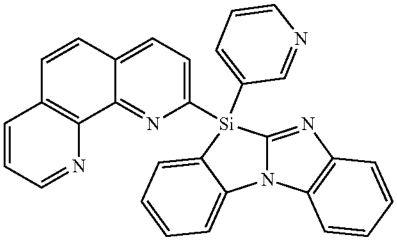
75
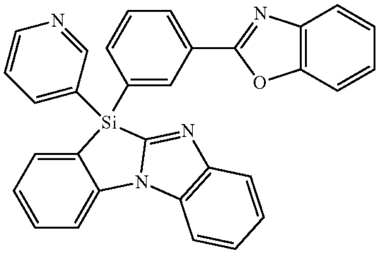
A76
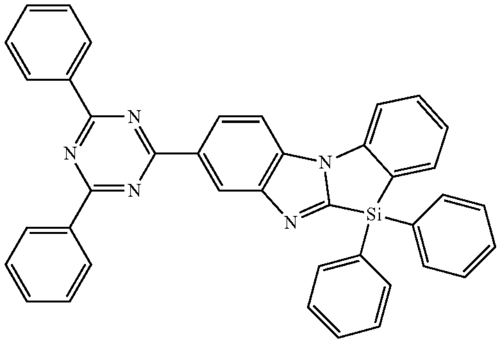
A77
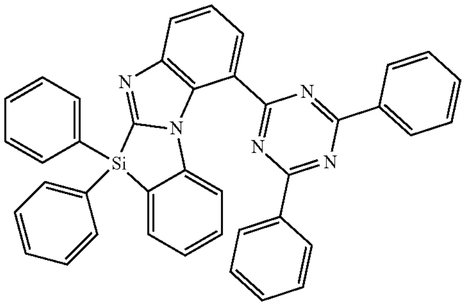

-continued
A78
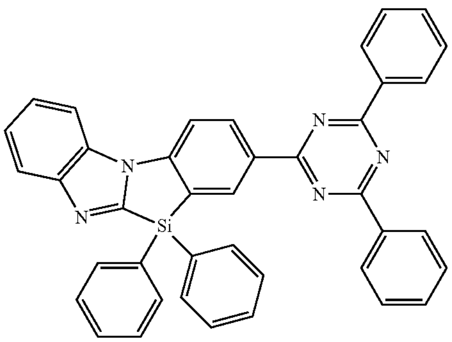
A79
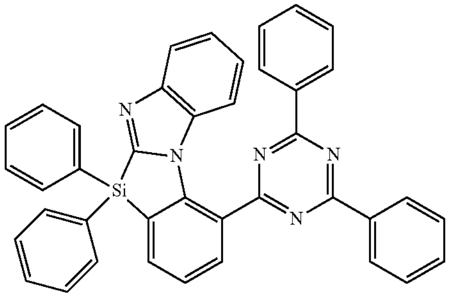
A80
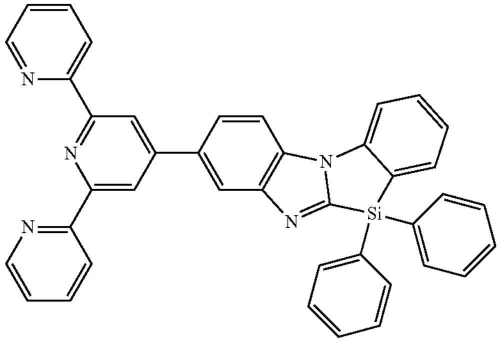
A81
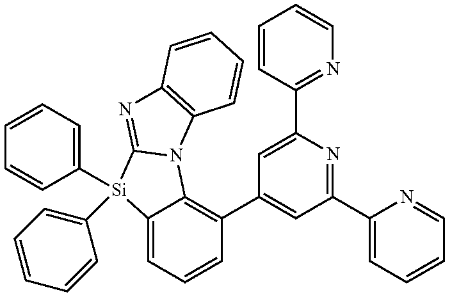
B1
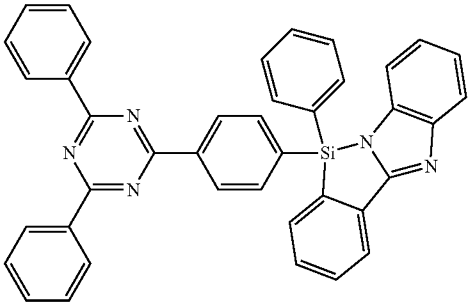
-continued
B2
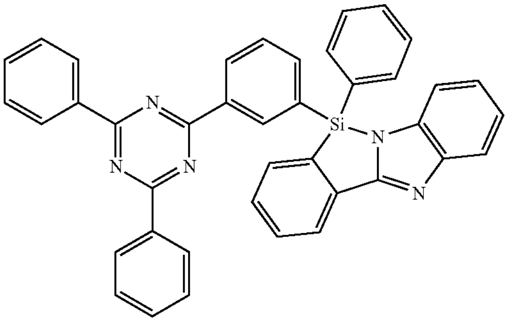
B3
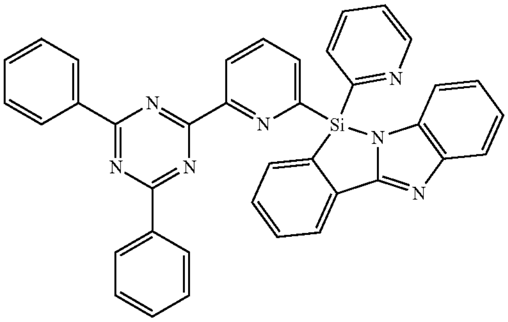
B4
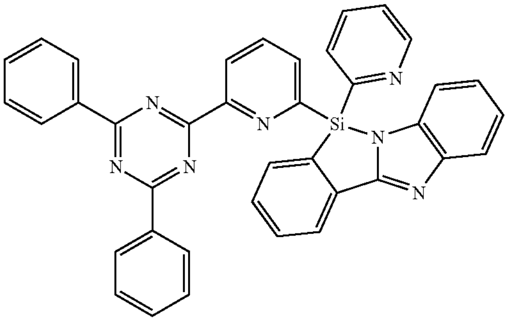
B5
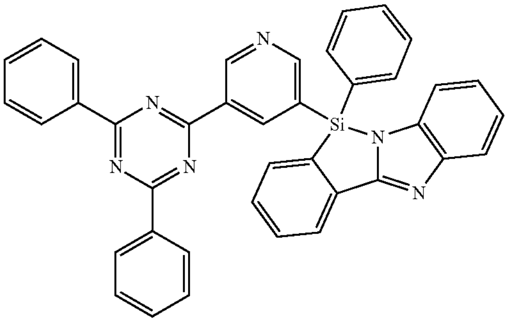
B6
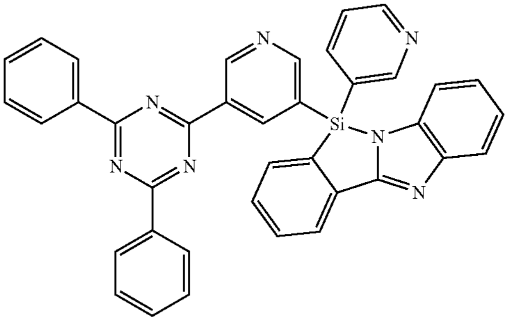

-continued
B7
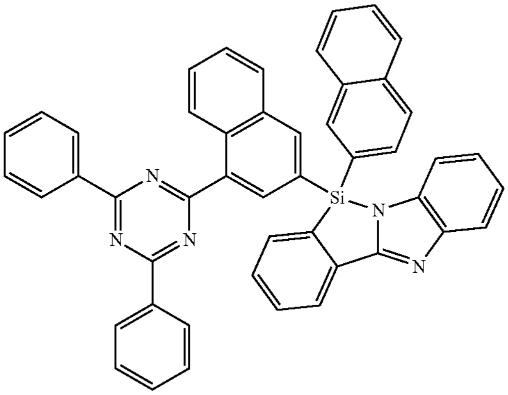
B8
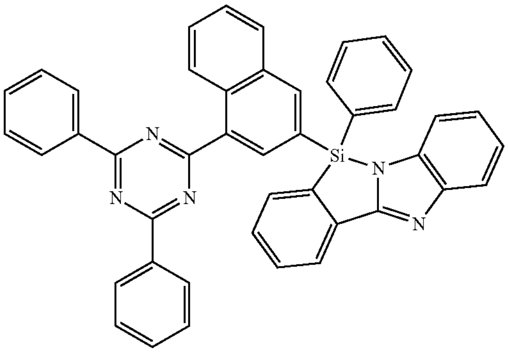
B9
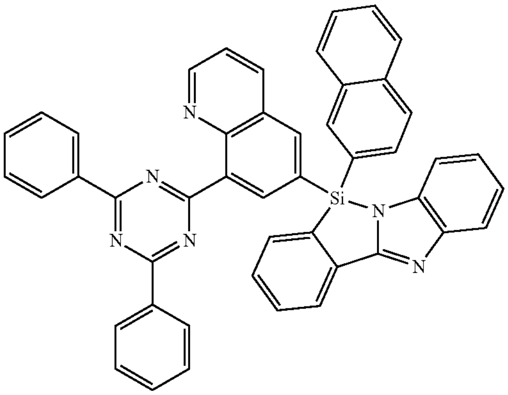
B10
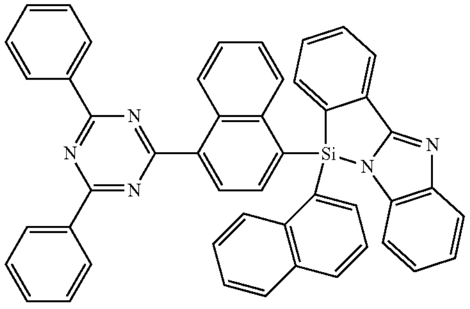
-continued
B11
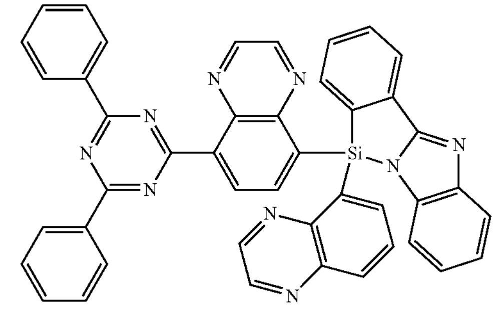
B12
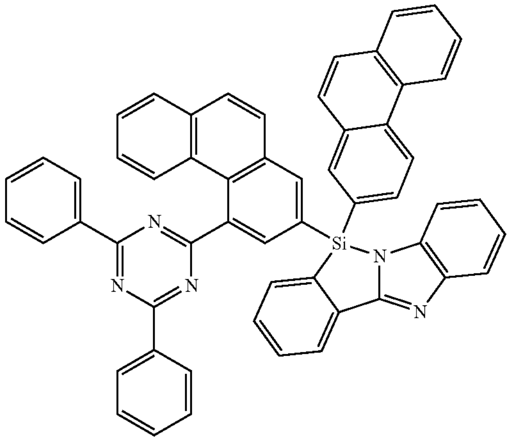
B13
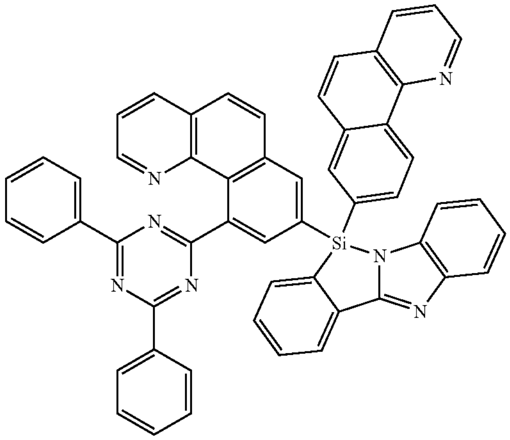
B14
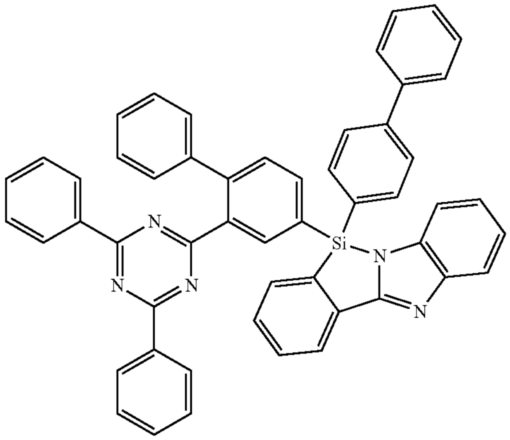

-continued
B15
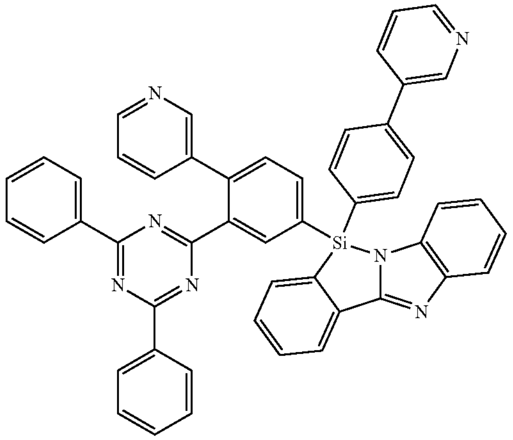
B16
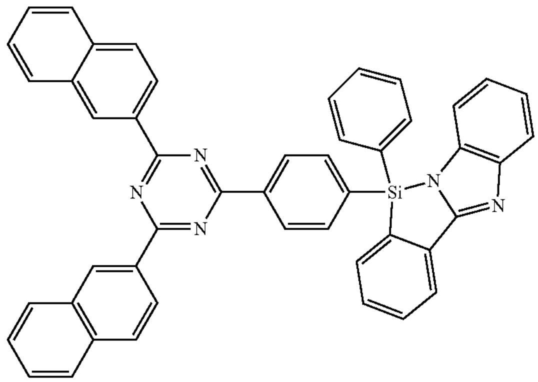
B17
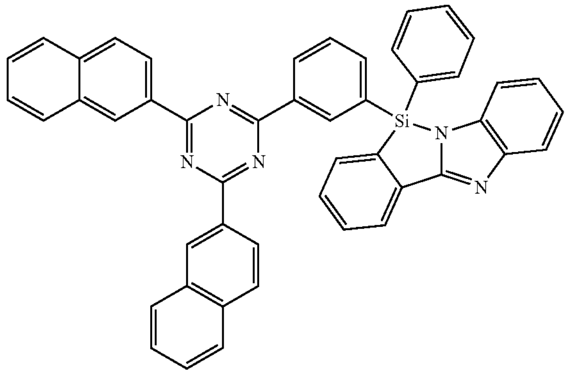
B18
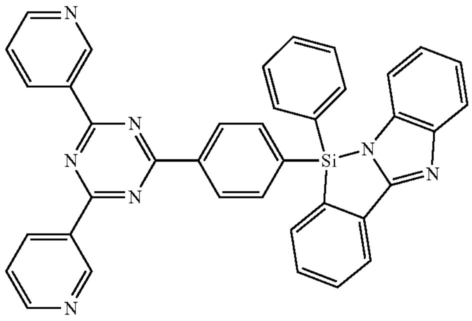
-continued
B19
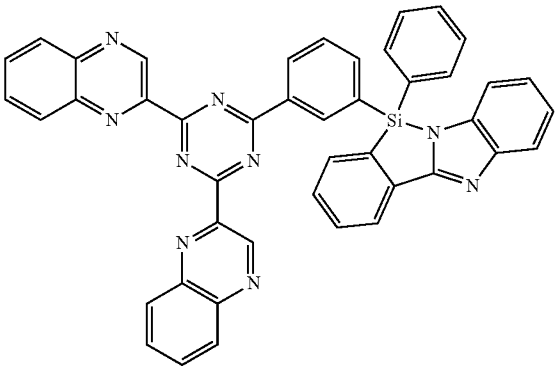
B20
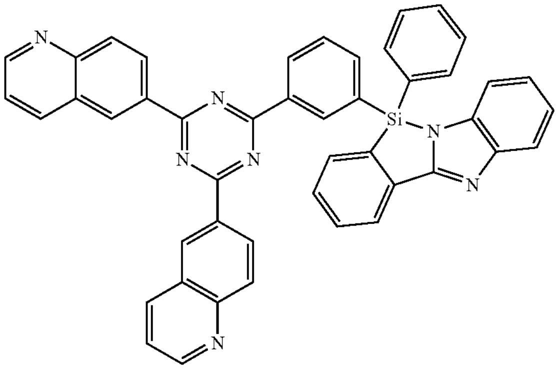
B21
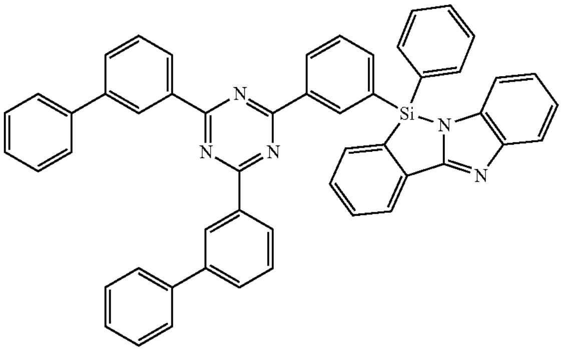
B22
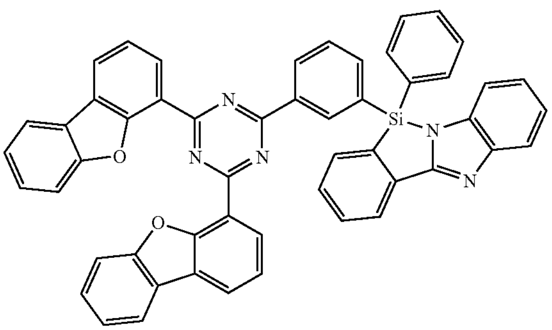

-continued
B23
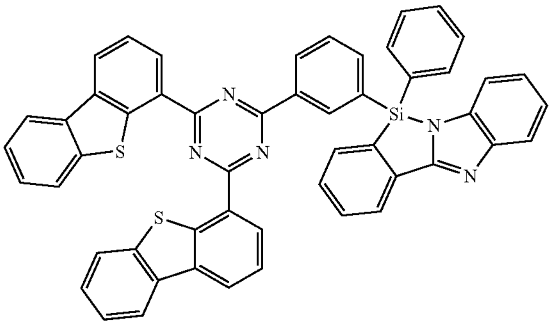
B24
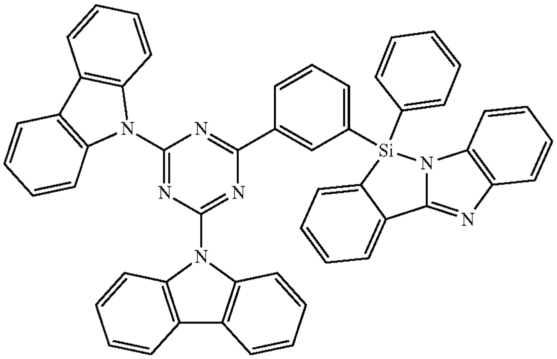
B25
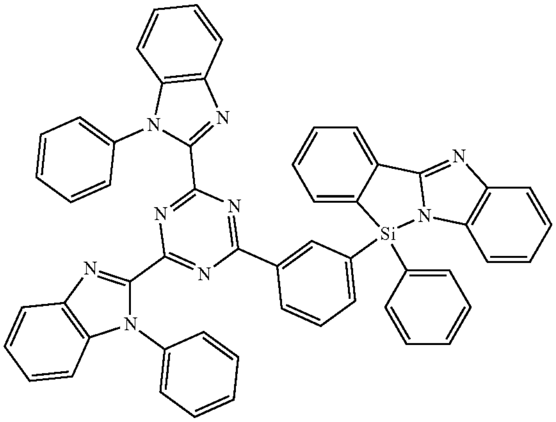
B26
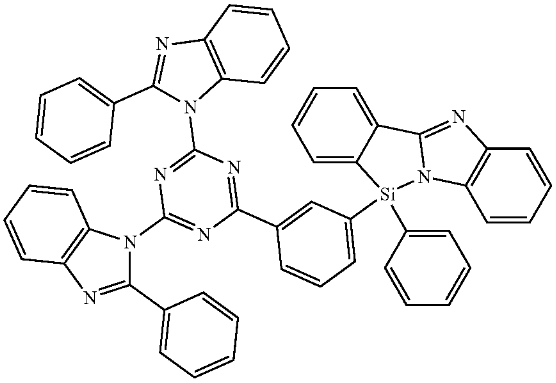
-continued
B27
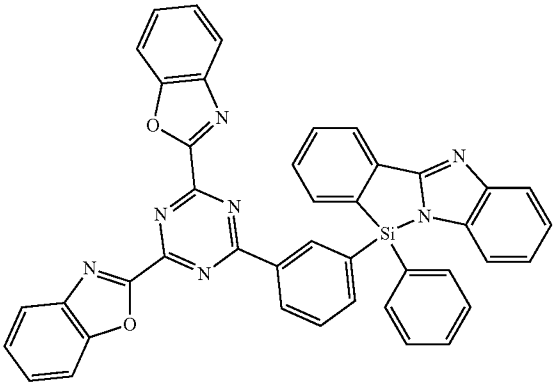
B28
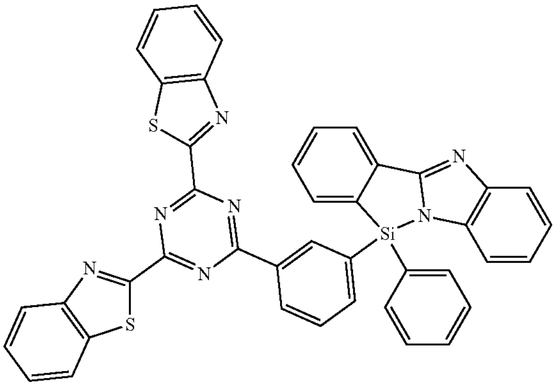
B29
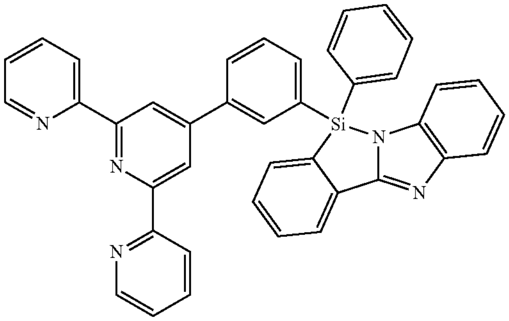
B30
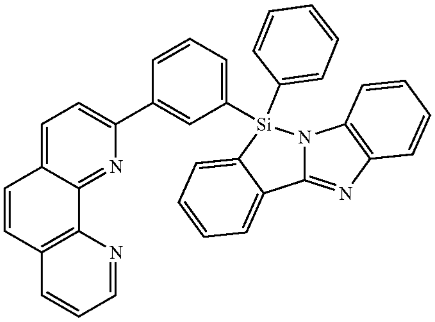

-continued
B31
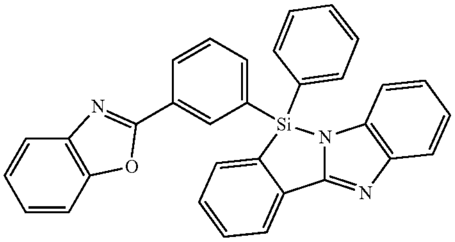
B32
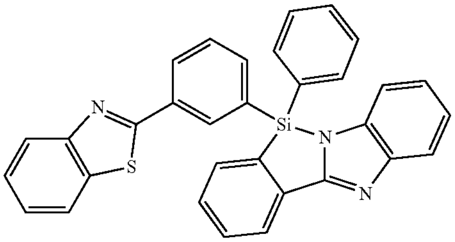
B33
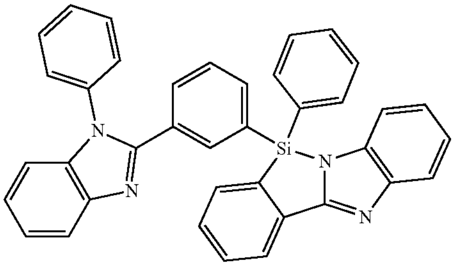
A34
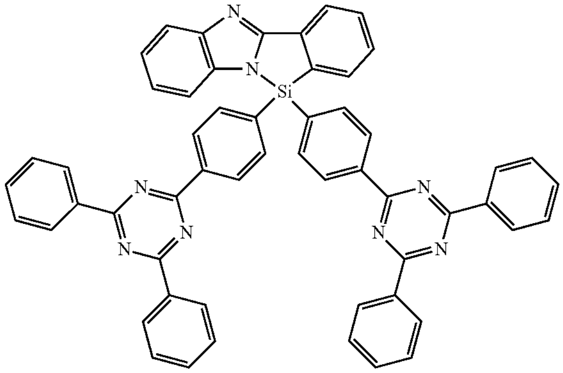
B35
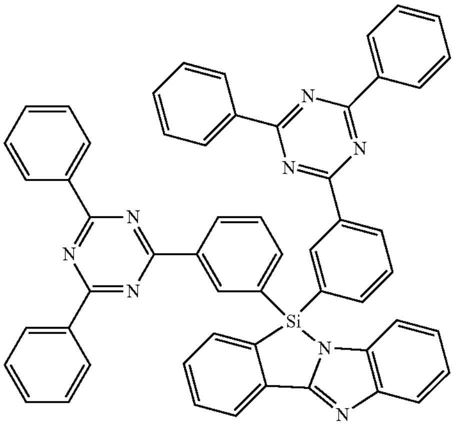
-continued
B36
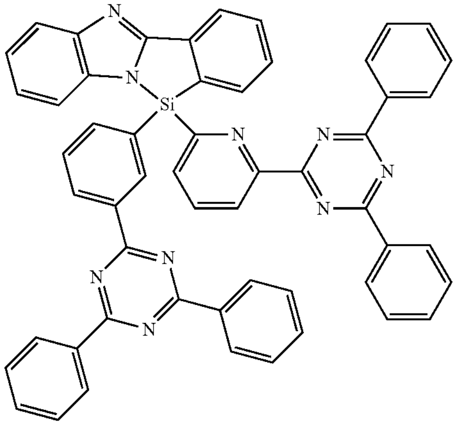
B37
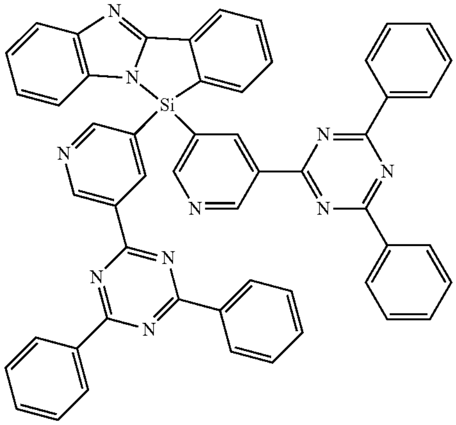
B38
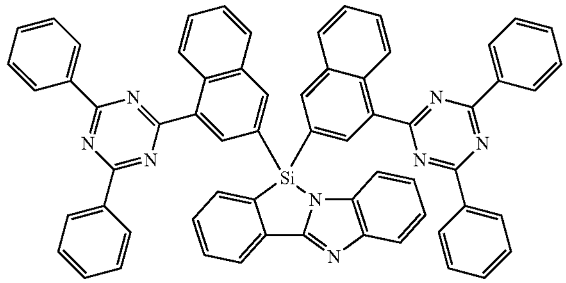
B39
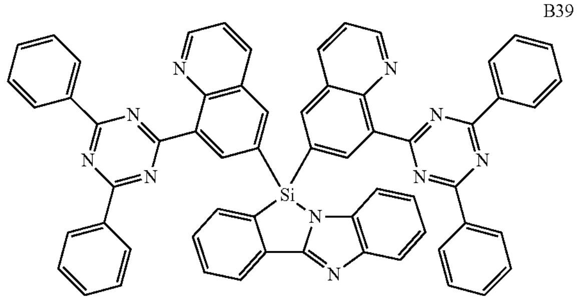

-continued
B40
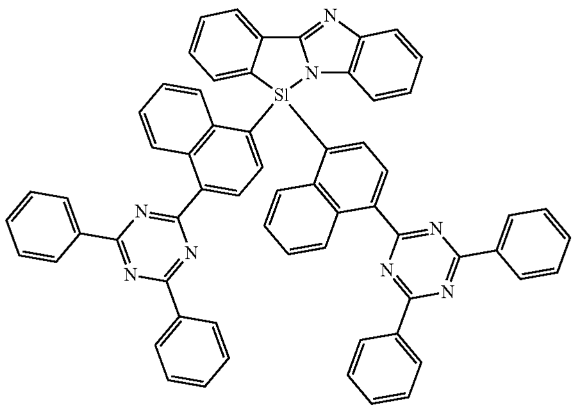
B41
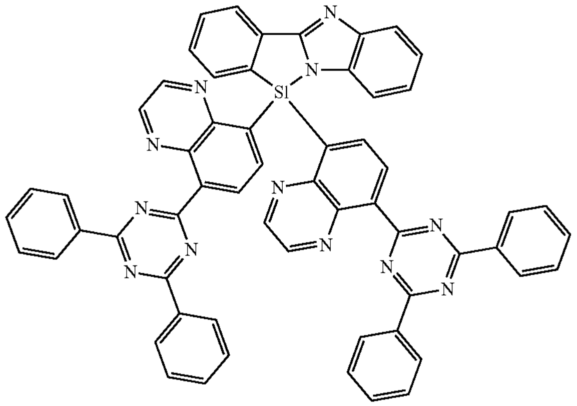
B42
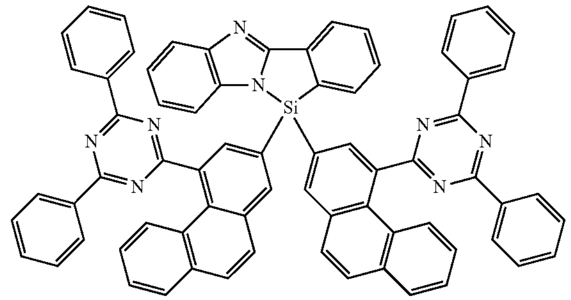
B43
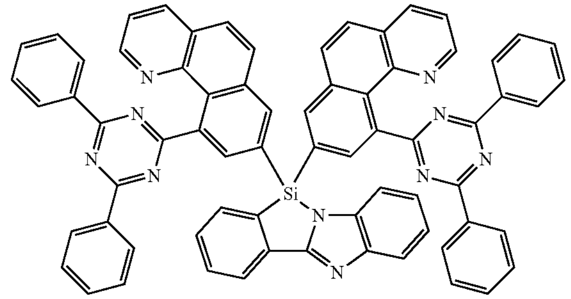
-continued
B44
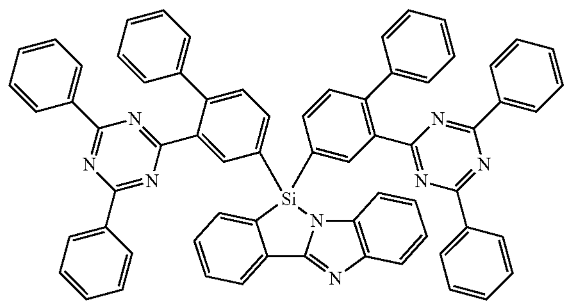
B45
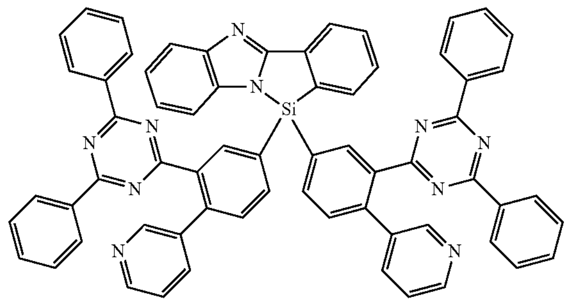
B46
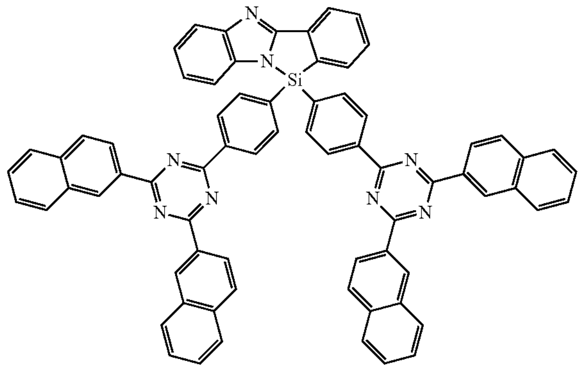
B47
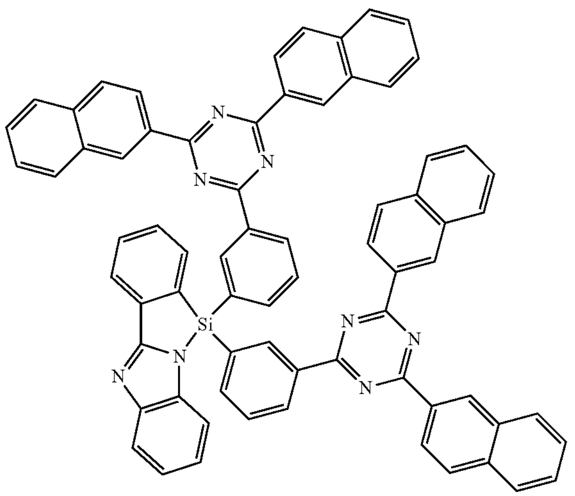

-continued
B48
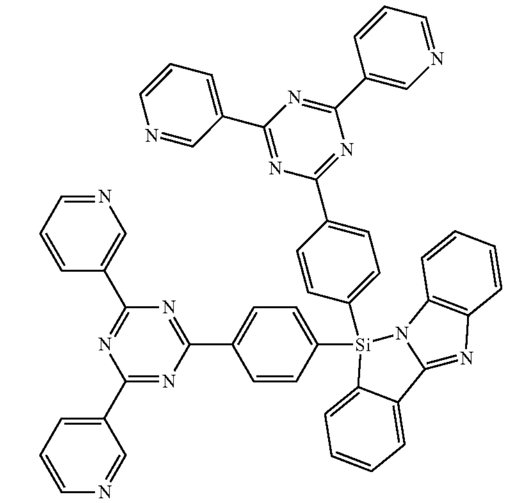
B49
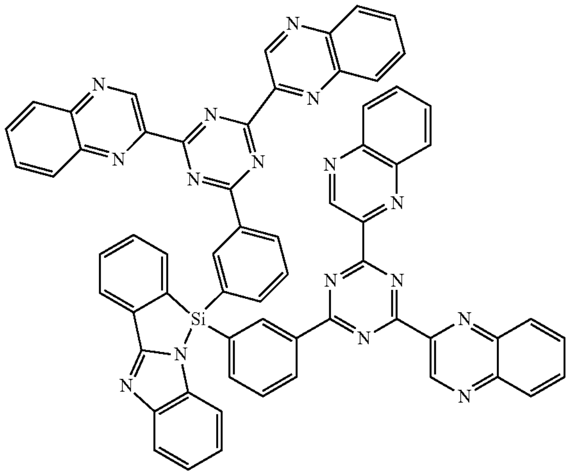
B50
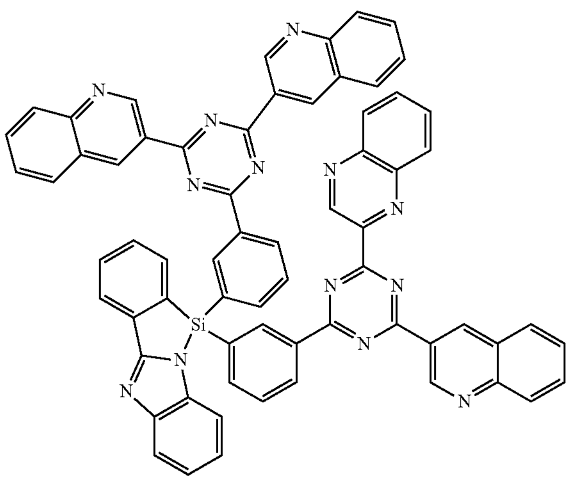
-continued
B51
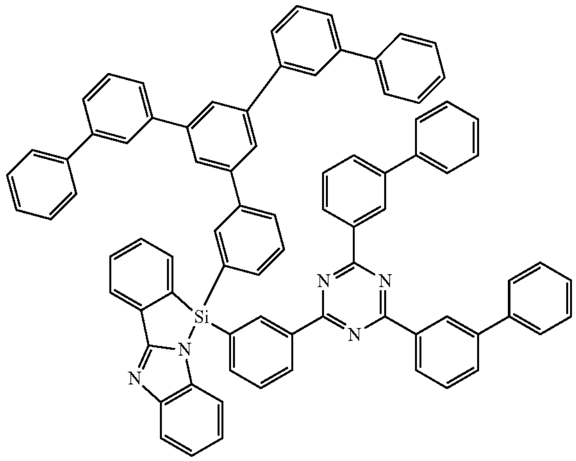
B52
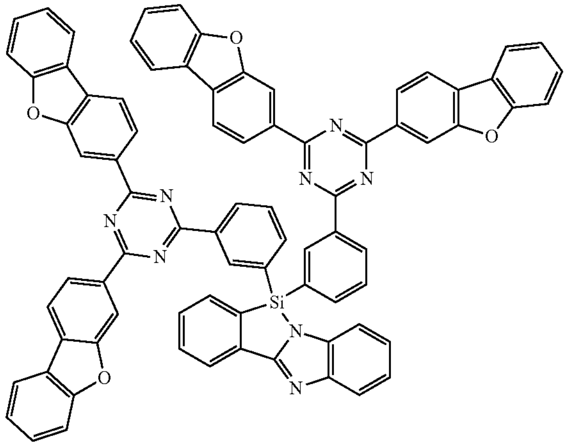
B53
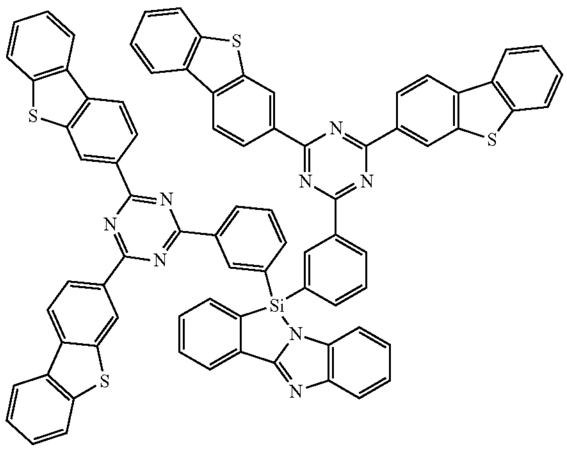

-continued
B54
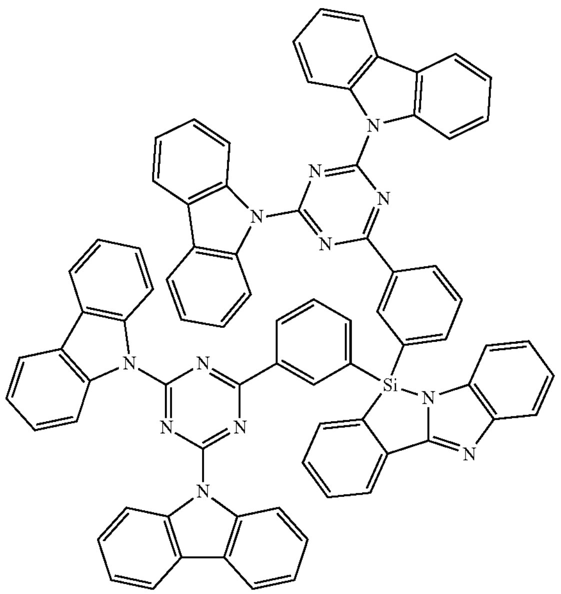
B55
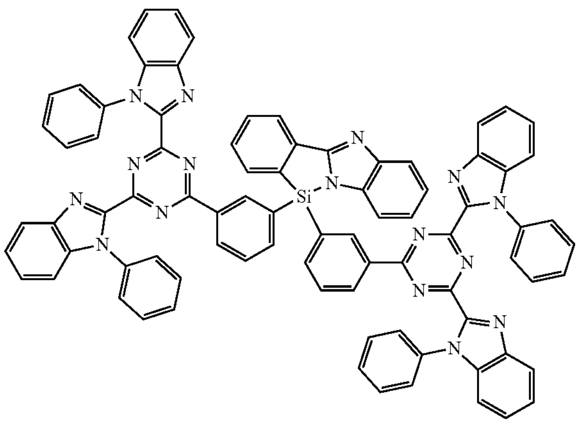
B56
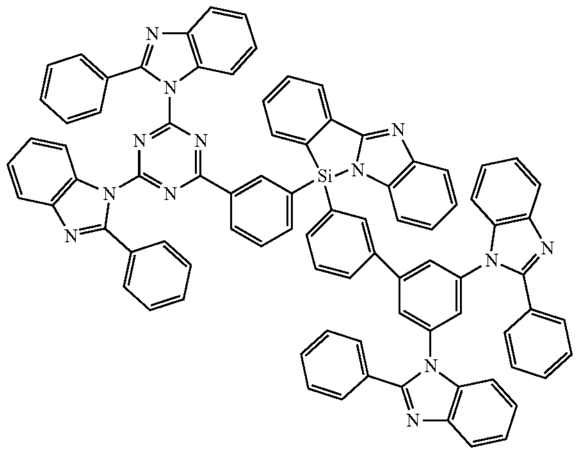
-continued
B57
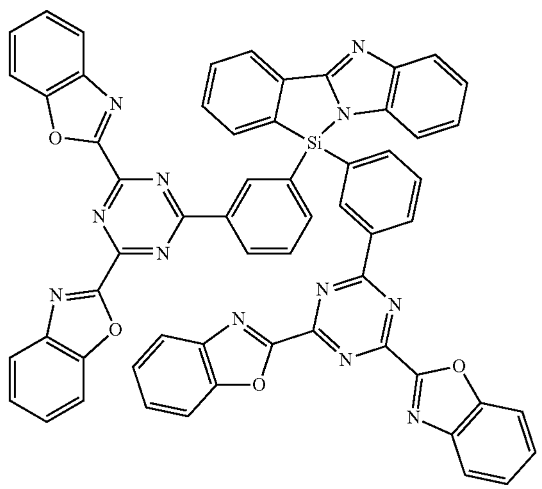
B58
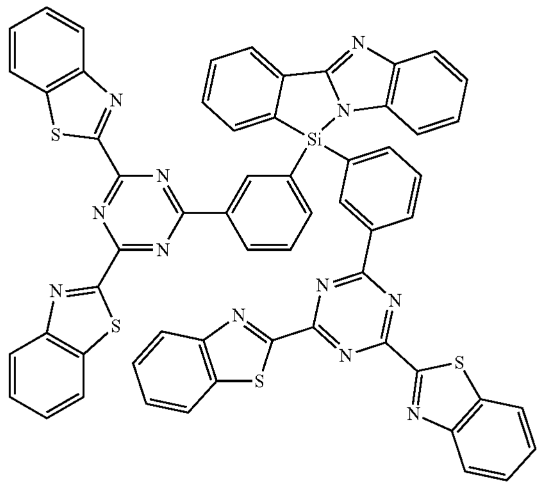
B59
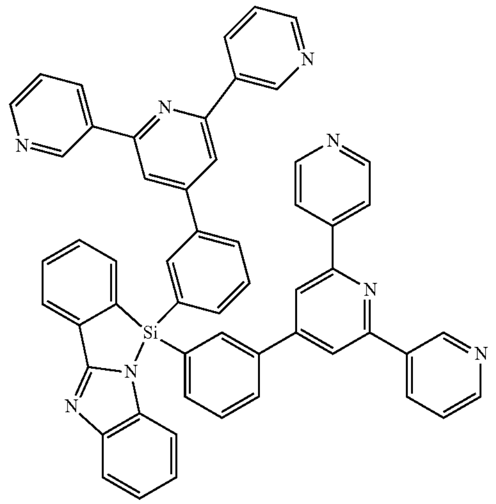

-continued
B60
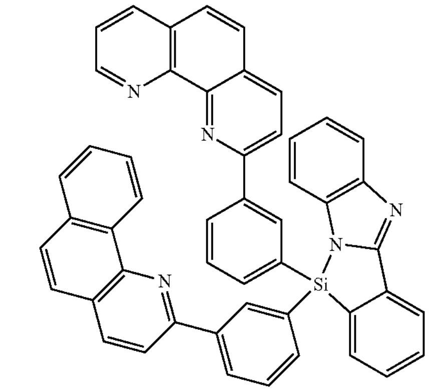
B61
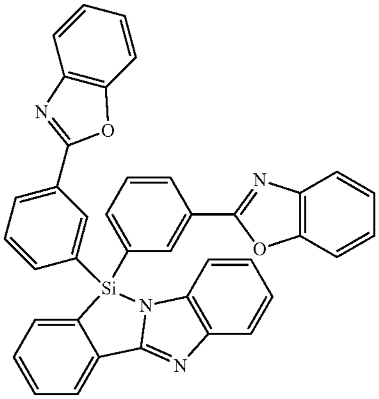
B62
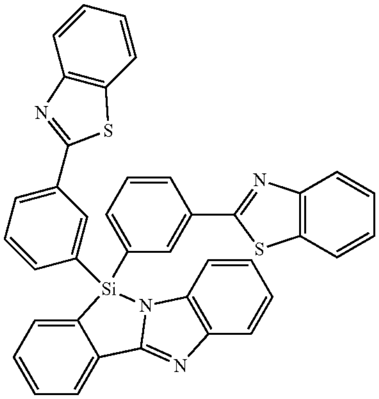
B63
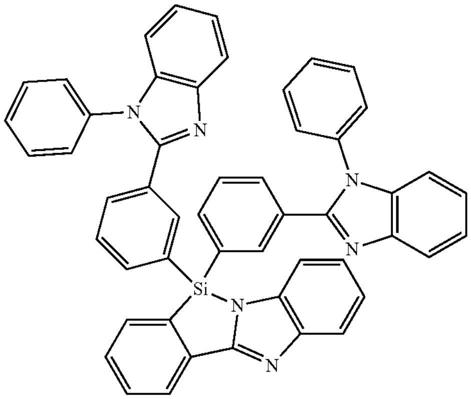
-continued
B64
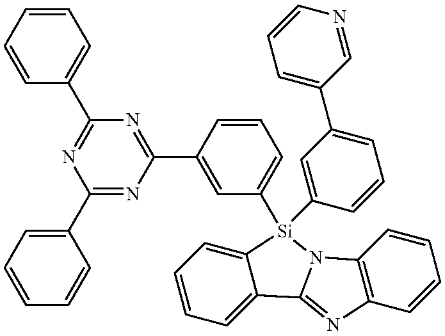
B65
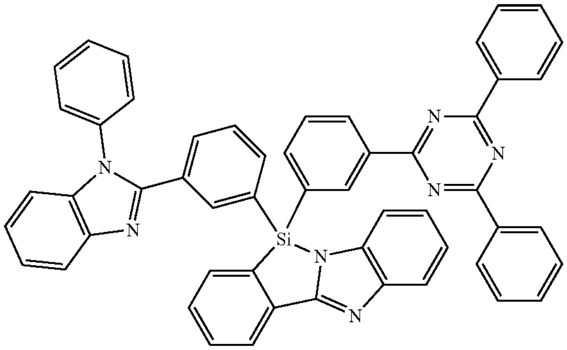
B66
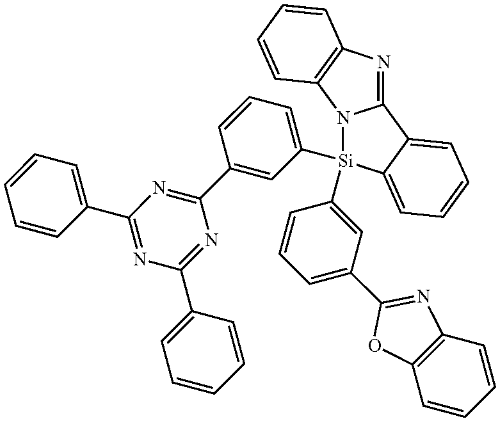
B67
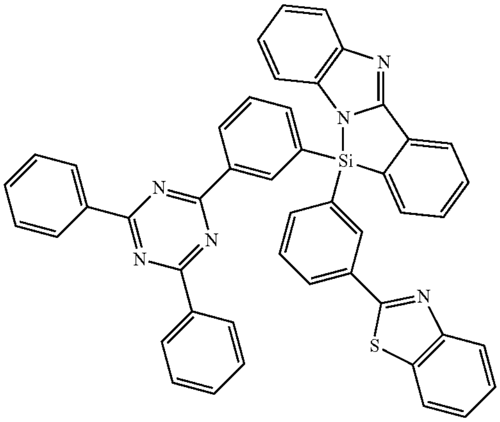

-continued
B68
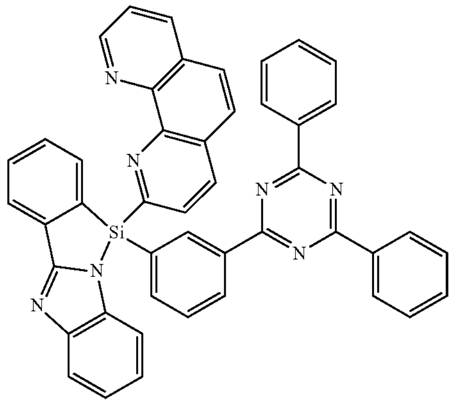
B69
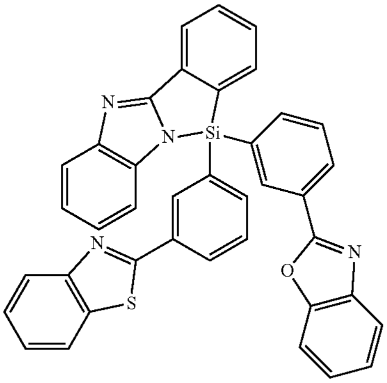
B70
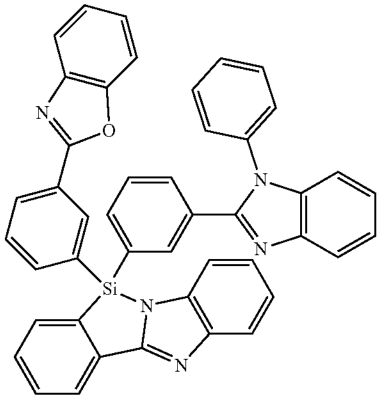
B71
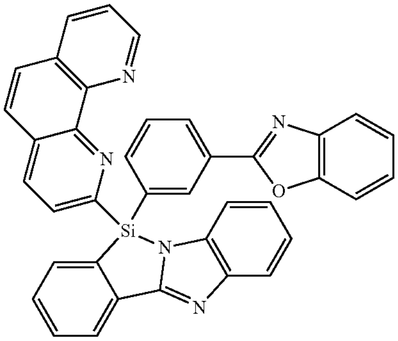
-continued
B72
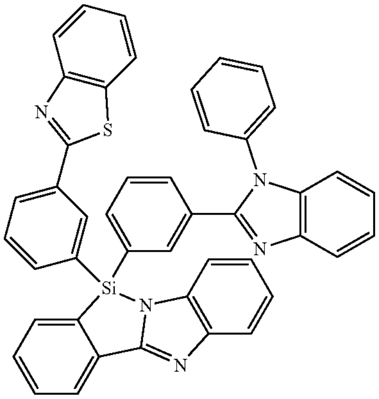
B73
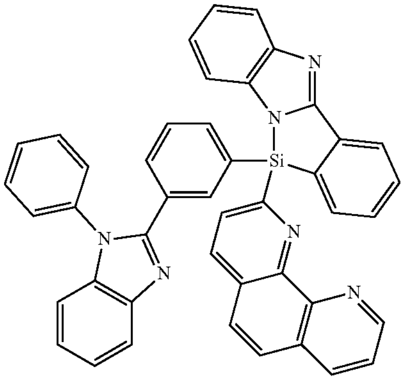
B74
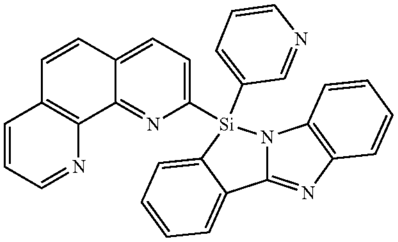
B75
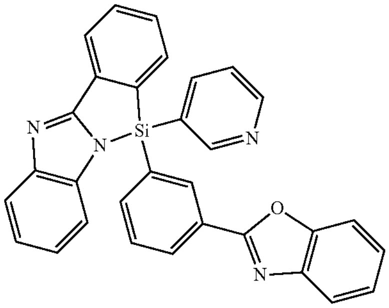

-continued

B76

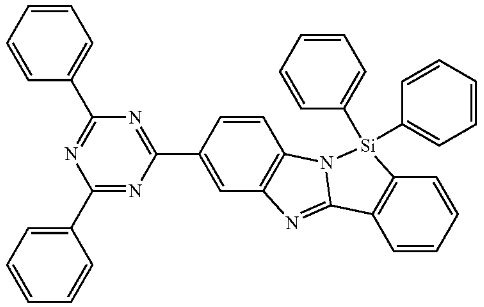

B77

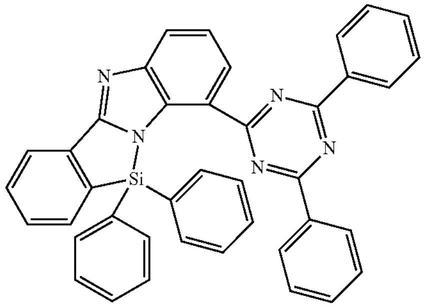

B78

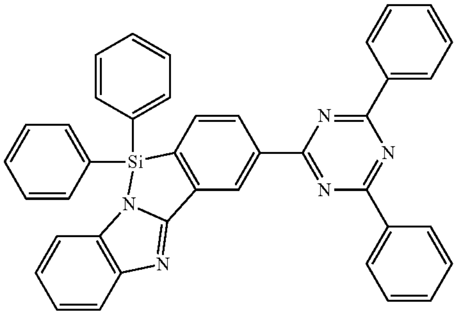

B79

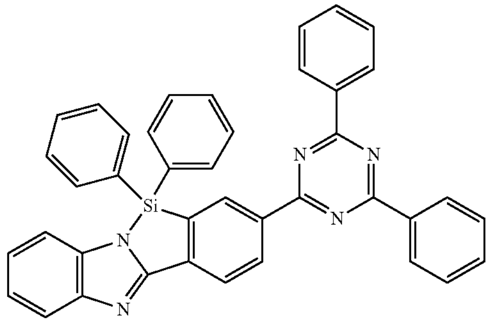

B80

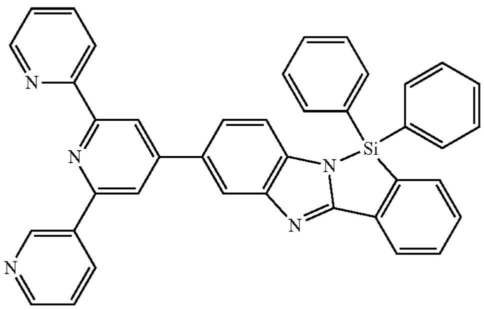

-continued

B81

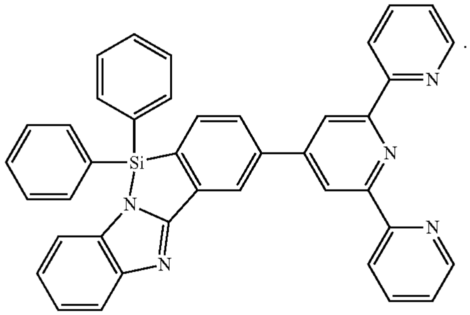

The spirofluorene silicon compound provided according to certain embodiment(s) of the present disclosure is of relatively lower LUMO value and wider LUMO distribution, effectuates relatively easier electron injection and electron transfer, increases material's Tg temperature, lowers injection barrier, lowers device operating voltage, improves electron transfer rate, and balances electron and hole injection to improve the luminous efficiency and lifetime of the devices.

The present disclosure, in certain embodiment(s), provides an organic light-emitting device, the organic light-emitting device includes an anode, a cathode, and an organic thin film layer between the anode and the cathode, the organic thin film layer includes an electron transport layer, and the electron transport layer including at least one of the spirofluorene silicon compounds disclosed herein.

The present disclosure provides a display panel including the organic light-emitting device described herein.

The organic light-emitting device provided by the present disclosure includes a substrate, an ITO anode, a first hole transport layer, a second hole transport layer, an electron blocking layer, a light-emitting layer, a first electron transport layer, a second electron transport layer, a cathode (magnesium-silver electrode, the mass ratio of magnesium-silver is 1:9), and a capping layer (CPL).

The anode material of the organic light-emitting device may be selected from metals such as copper, gold, silver, iron, chromium, nickel, manganese, palladium, platinum, and their alloys; may include metal oxides such as indium oxide, zinc oxide, indium tin oxide (ITO), and indium zinc oxide (IZO); may include conductive polymers such as polyaniline, polypyrrole, poly(3-methylthiophene); and in addition to the materials that contribute to hole injection and their combinations, may also include any existing materials suitable for anodes.

The cathode material of the organic light-emitting device may be selected from metals such as aluminum, magnesium, silver, indium, tin, titanium, and their alloys; and may be selected from multi-layer metal materials such as LiF/Al, $LiO_2$/Al, $BaF_2$/Al. In addition to the materials and alloys that facilitate electron injection, the cathode material may also include other suitable cathode materials.

The organic light-emitting device includes an organic thin film layer, which includes at least one light-emitting layer (EML), and may also include other functional layers, including hole injection layer (HIL), hole transport layer (HTL), electron blocking layer (EBL), hole blocking layer (HBL), electron transport layer (ETL), and electron injection layer (EIL).

The organic light-emitting device is prepared according to one or more methods stated herein.

The anode is formed on a transparent or opaque smooth substrate, an organic thin layer is formed on the anode, and the cathode is formed on the organic thin layer.

In certain embodiment(s), the organic thin layer may be formed by film forming methods such as evaporation, sputtering, spin coating, dipping, and ion plating.

The present invention provides a display device including the display panel described herein.

In certain embodiment(s) of the present disclosure, an organic light-emitting device (OLED device) may be used in a display device, where the organic light-emitting display device may be a mobile phone display, computer display, TV display, smart watch display, smart car display panel, VR or AR helmet displays, displays of various smart devices.

Described herein are technical solutions of certain embodiments of the present disclosure. The described embodiments are only a part of the embodiments of the present disclosure, rather than all the embodiments. Based on the embodiments of the present disclosure, all other embodiments obtained by persons of ordinary skill in the art without creative work shall fall within the protection scope of the present disclosure.

EXAMPLES—PREPARATION OF MATERIALS

Preparation of A2

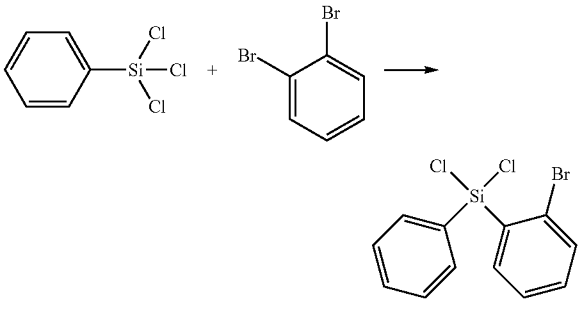

M1-1

Under a stream of nitrogen, 1,2-dibromobenzene (23.4 g, 100 mmol), magnesium (2.4 g, 100 mmol) and 200 ml of tetrahydrofuran are added and stirred for 1 hour. After cooling the reaction solution to 0° C., a tetrahydrofuran solution (100 ml) containing trichlorophenylsilane (22.0 g, 104 mmol) is slowly added dropwise. The reaction solution is returned to room temperature and stirred for 3 hours. The solids are filtered off under nitrogen and the filtrate is concentrated under reduced pressure. The residue is isolated by column chromatography to give 17.8 g of M1-1 (55% yield).

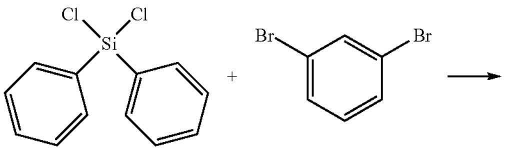

-continued

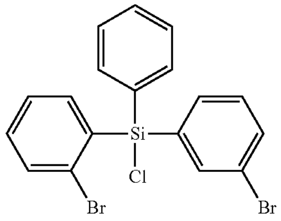

M1-2

The preparation method of M1-2 is consistent with the preparation method of M1-1. Of the preparation method of M1-1, the same molar ratio is used, 1,2-dibromobenzene is replaced with 1,3-dibromobenzene, and trichlorophenylsilane is replaced with M1-1.

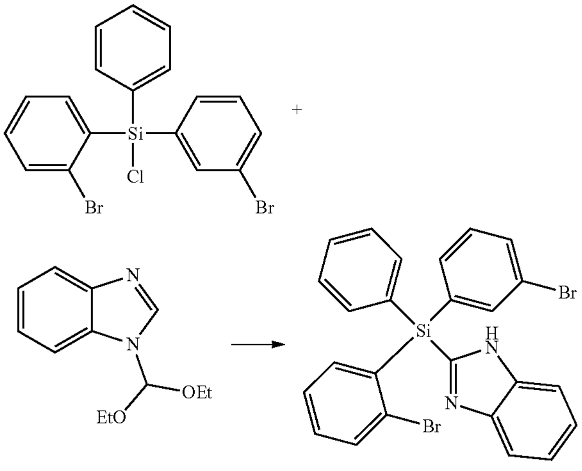

M1-3

Under an argon atmosphere, into a vessel is added 1-(diethoxymethyl)-1H-imidazole (44.0 g, 200 mmol) and 500 ml of tetrahydrofuran (THF). n-Butyllithium (132 ml, 3.3 mmol, 2.5M hexanes) is added dropwise at −40° C. The reaction mixture is stirred at −40° C. for 20 minutes, and a solution of phenyldiisopropylchlorosilane (73.5 g, 300 mmol) in 500 ml of THF is added dropwise. The resulting mixture is warmed to room temperature, quenched (saturated $NH_4Cl$), extracted with ethyl acetate, and dried and concentrated. The residue is separated by column chromatography to give 69.2 g of M1-3 (65% yield).

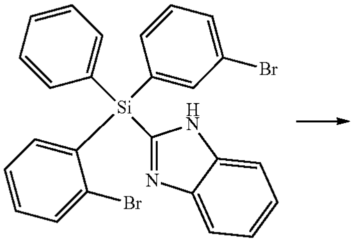

-continued

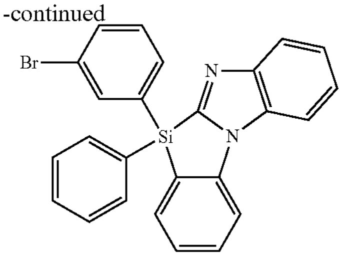

M1-4

To the reactor/vessel is added $K_2CO_3$ (57.2 g, 210 mmol), CuI (38 mg, 20 mmol), per-6-amino-beta-cyclodextrin (10 g, 8 mmol) and DMSO (100 ml). A solution of M1-3 (53.2 g, 100 mmol) in DMSO (100 ml) is added. Stir at 110° C. for 24 hours under nitrogen atmosphere. After completion of the reaction, water (500 ml) is added to the reaction mixture. It is concentrated by extraction and drying. The residue is purified by silica gel column chromatography to obtain 38.4 g of M1-4 (85%).

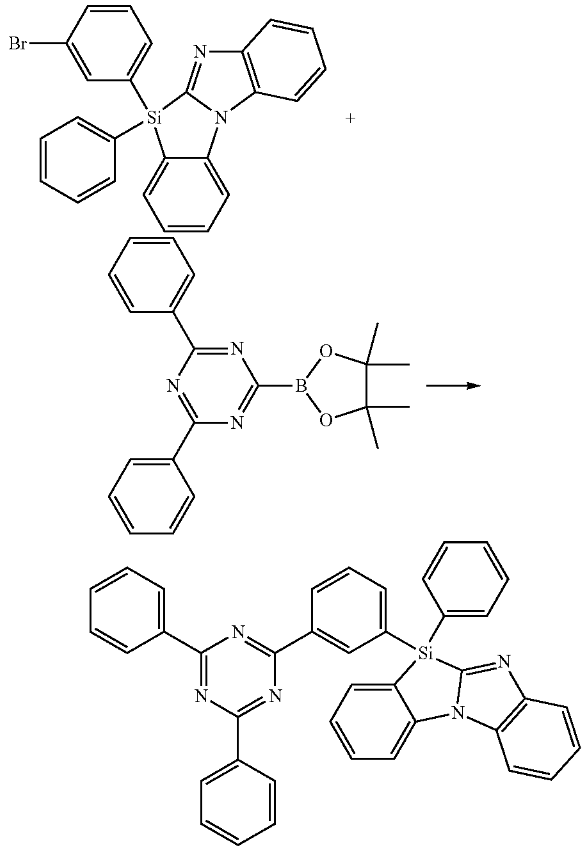

A2

Under nitrogen atmosphere, compound 2,4-diphenyl-6-(4,4,5,5-tetramethyl-1,3,2-dioxaborolan-2-yl)-1,3,5-triazine (3.6 g, 10 mmol) and M1-4 (4.5 g, 10 mmol) are dissolved in 100 ml of tetrahydrofuran, to the reaction mixture is added PdP(Ph)3 (320 mg, 0.268 mmol), the reaction is let on for half an hour, and then added is $K_2CO_3$ (3.7 g, 53.7 mmol) dissolved in 20 ml of water. The reaction mixture is heated and stirred for 7 hours. The reaction temperature is lowered to room temperature to complete the reaction, then the $K_2CO_3$ solution is removed by filtration and the filter residue is washed twice with tetrahydrofuran and ethyl acetate to obtain A2 (4.84 g, 80%).

Preparation of A21

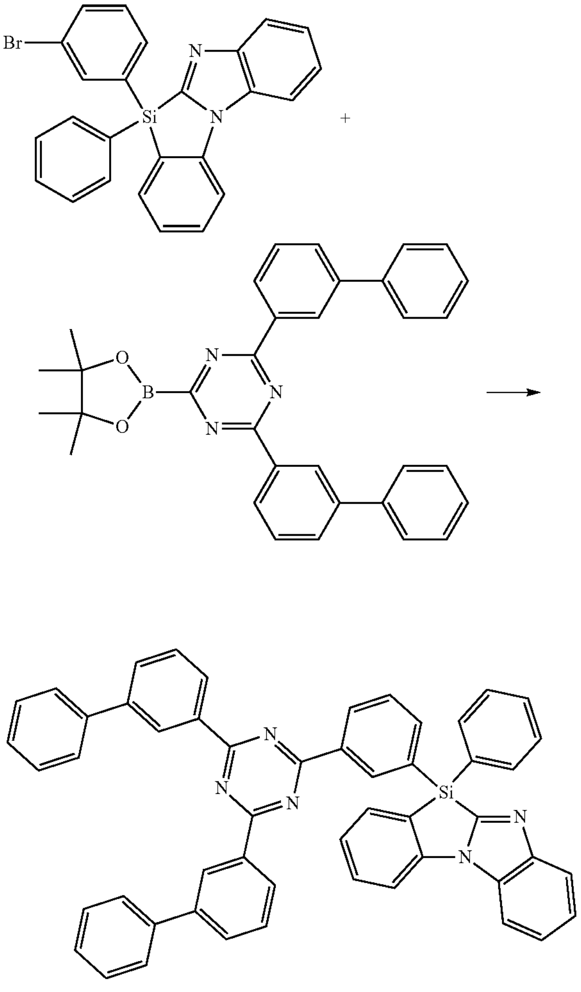

A21

The preparation method of A21 is consistent with the preparation method of A2. According to the preparation method of A2, same molar ratio is used, and 2,4-diphenyl-6-(4,4,5,5-tetramethyl-1,3,2-dioxaborolan-2-yl)-1,3,5-triazine is replaced with 2,4-di(1,1'-diphenyl-3-yl)-6-(4,4,5,5-tetramethyl-1,3,2-dioxaborolan-2-yl)-1,3,5-triazine.

Preparation of A29

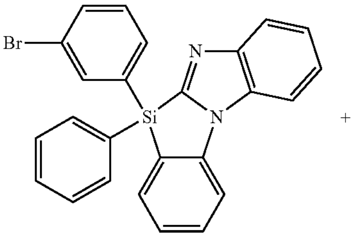

-continued

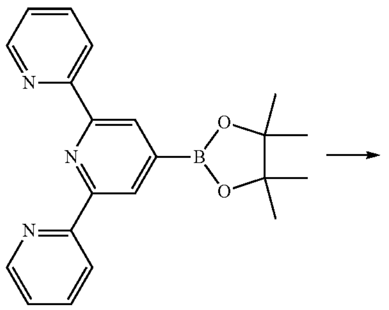

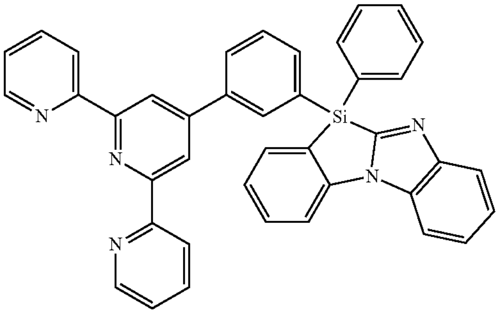

A29

The preparation method of A29 is consistent with the preparation method of A2. According to the preparation method of A2, same molar ratio is used, and 2,4-diphenyl-6-(4,4,5,5-tetramethyl-1,3,2-dioxaborolan-2-yl)-1,3,5-triazine is replaced with 4'-(4,4,5,5-tetramethyl-1,3,2-dioxaborolan-2-yl)-2,2':6',2"-terpyrindine.

Preparation of A76

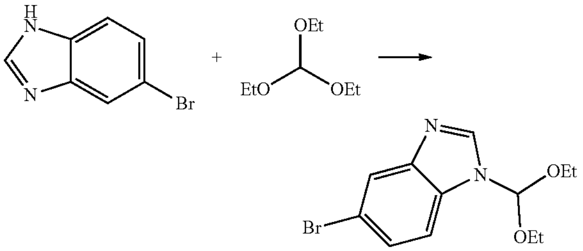

M2-1

Solution of 6-bromo-1H-benzimidazole (19.6 g, 100 mmol) and benzenesulfonic acid (0.5 g, 3.2 mmol) in triethyl orthoformate (100 ml) is heated with reflux for 10 hours. The reaction mixture is slowly distilled for 2 hours. The product M2-1 (19.4 g, 65%) is isolated by fractional distillation.

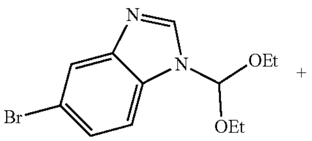

-continued

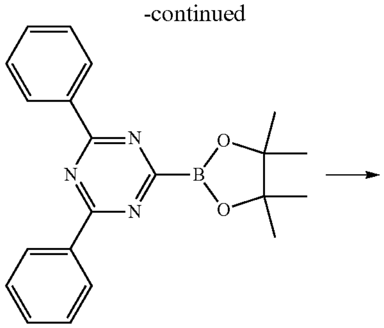

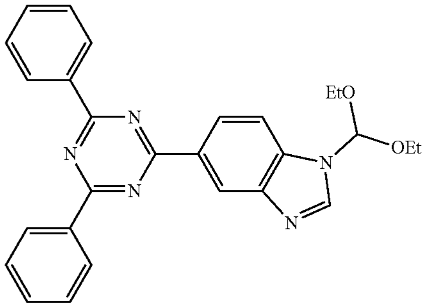

M2-2

The preparation method of M2-2 is consistent with the preparation method of A2. According to the preparation method of A2, the same molar ratio is employed, and M1-4 is replaced with M2-1.

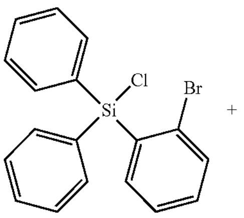

-continued

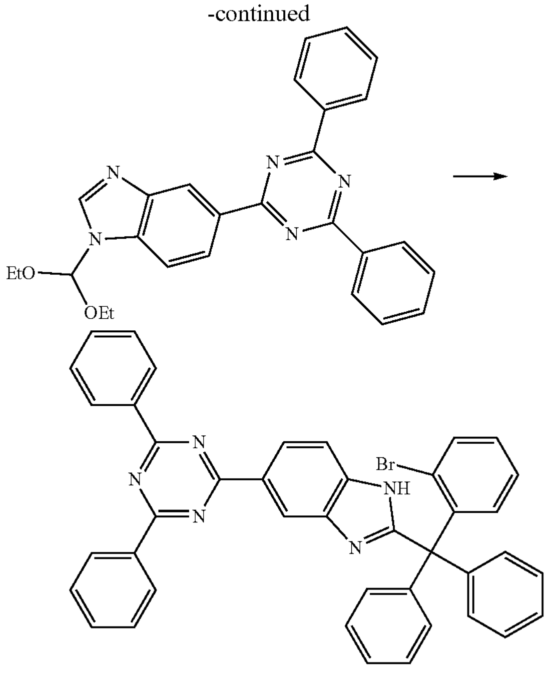

M2-3

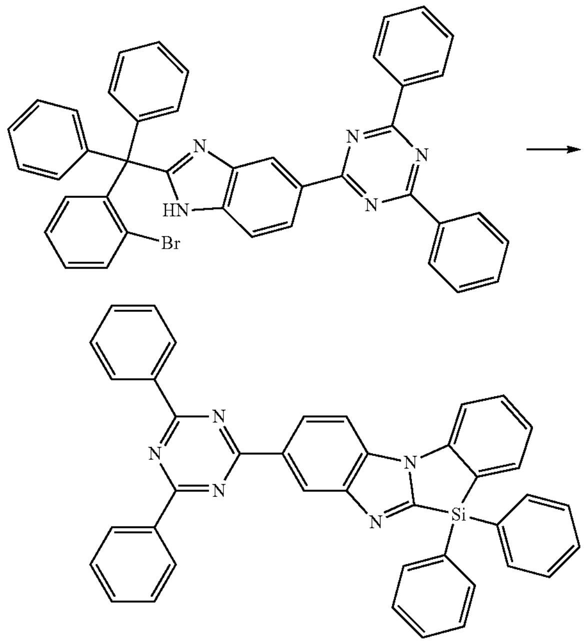

A76

The preparation method of M2-3 is consistent with the preparation method of M1-3. According to the preparation method of M1-3, the same molar ratio is used, 1-(diethoxymethyl)-1H-imidazole is replaced with M2-2, and M1-2 is replaced with 1-bromo-2-(chlorodiphenylsilyl)benzene.

The preparation method of A76 is consistent with the preparation method of M1-4. According to the preparation method of M1-4, the same molar ratio is used, and M1-3 is replaced with M2-3.

Preparation of A80

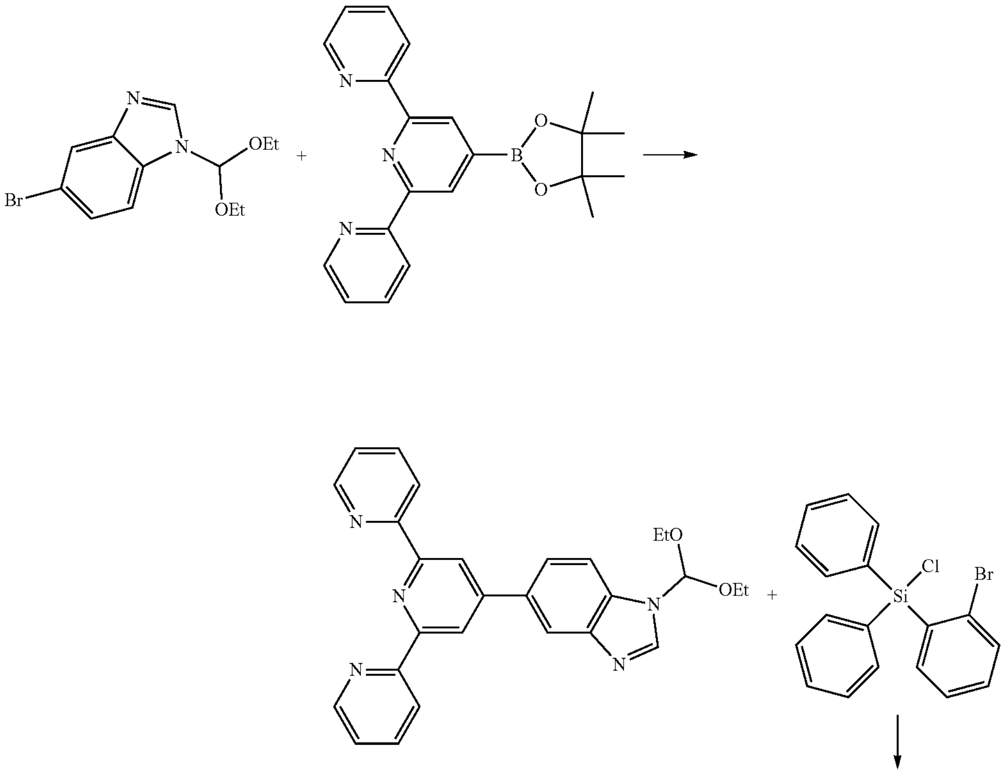

-continued

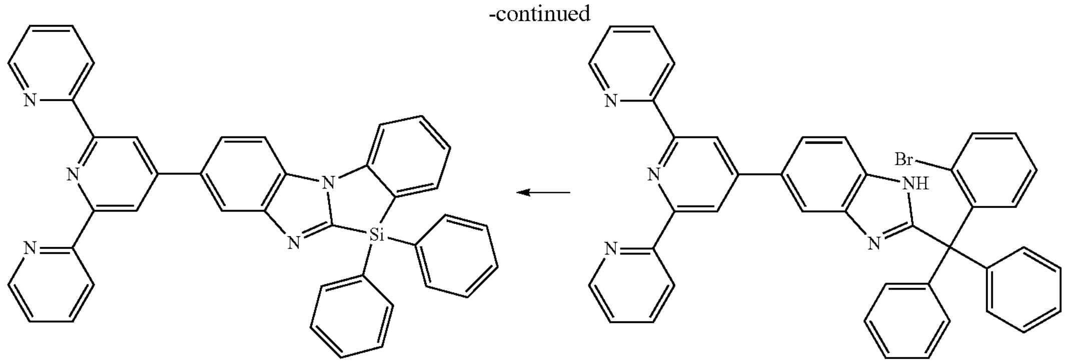

A80

The preparation method of A80 is consistent with the preparation method of A76.

Preparing A81

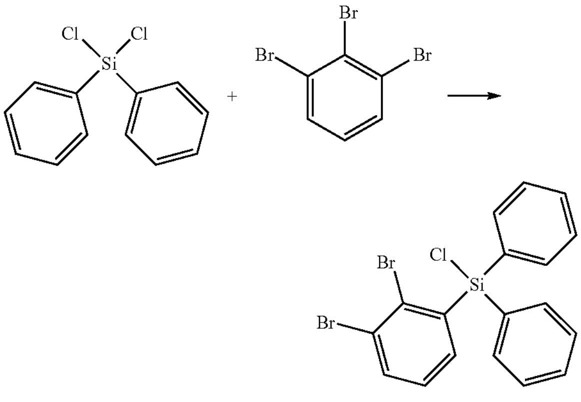

M3-1

The preparation method of M3-1 is consistent with the preparation method of M1-1. According to the preparation method of M1-1, same molar ratio is used, 1,2-dibromobenzene is replaced with 1,2,3-tribromobenzene, and trichlorophenylsilane is replaced with dichlorodiphenylsilane.

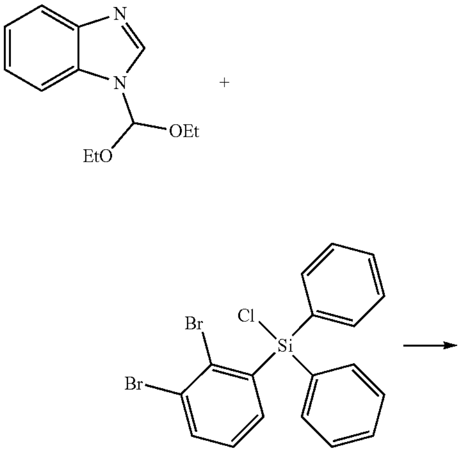

-continued

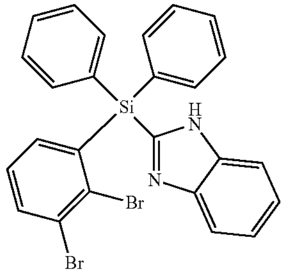

M3-2

The preparation method of M3-2 is consistent with the preparation method of M1-3. According to the preparation method of M1-3, same molar ratio is used, and M1-2 is replaced with M3-1.

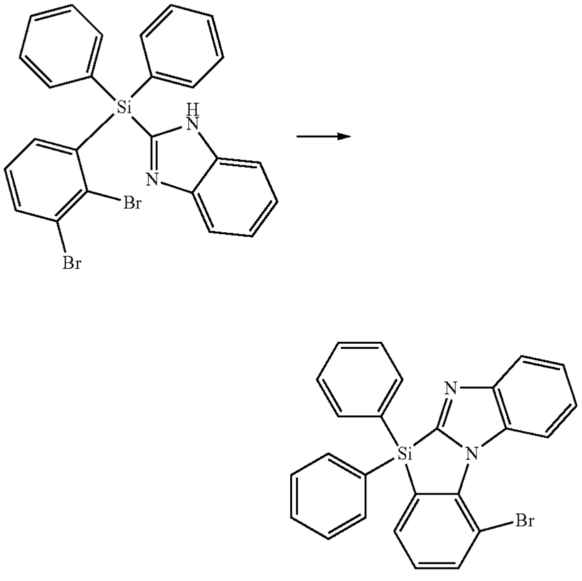

M3-3

The preparation method of M3-3 is consistent with the preparation method of M1-4. According to the preparation method of M1-4, same molar ratio is used, and M1-3 is replaced with M3-2.

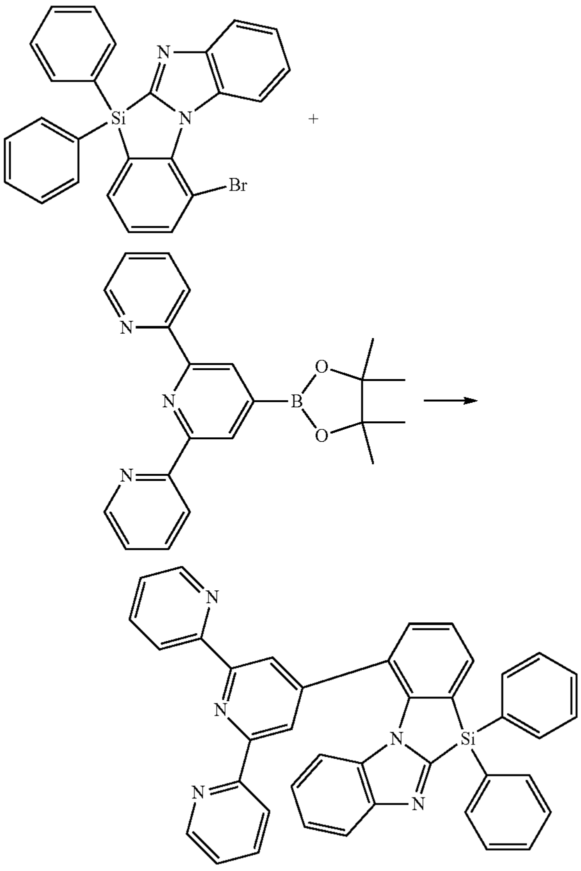

A-81

The preparation method of A81 is consistent with the preparation method of A2. According to the preparation method of A2, same molar ratio is used, M1-4 is replaced with M3-3, and 2,4-diphenyl-6-(4,4,5,5-tetramethyl-1,3,2-dioxaborolan-2-yl)-1,3,5-triazine is replaced with 4'-(4,4,5,5-tetramethyl-1,3,2-dioxaborolan-2-yl)-2,2':6',2"-terpyridine.

Preparation of B2

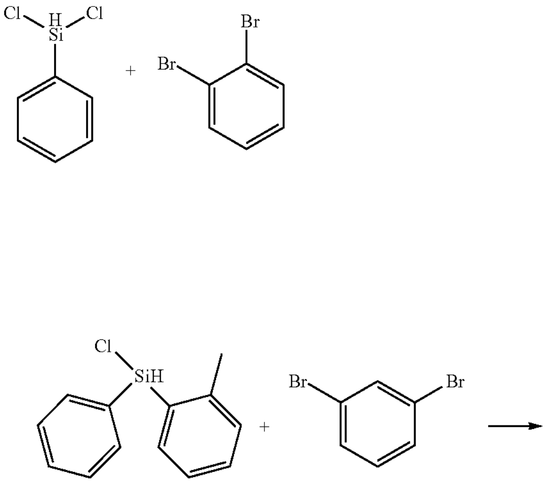

-continued

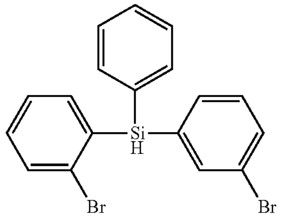

M4-1

Preparation method of M4-1 is consistent with the preparation method of M1-2.

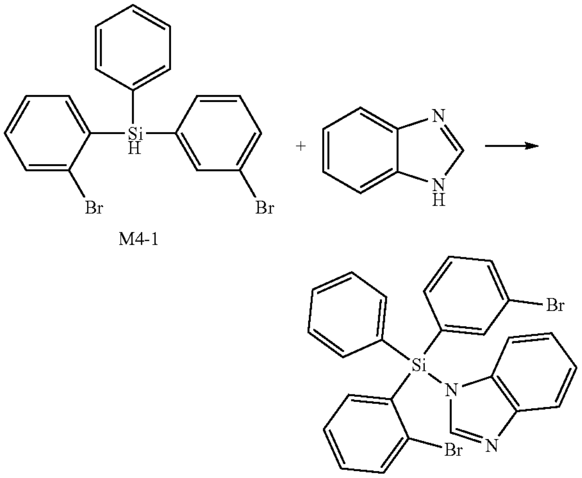

M4-1

M4-2

To the reactor are added benzimidazole (11.8 g, 100 mmol), M4-1 (62.4 g, 150 mmol), $Ru_3(CO)_{12}$ (0.95 g, 1.5 mmol), and dry toluene (1 L), and the mixture is placed under argon atmosphere. The reaction is carried out at 120° C. for 12 hours. The reaction mixture is diluted with $CH_2Cl_2$, where silica is added to the reaction flask and the solvent is evaporated. M4-2 (34.6 g, 65%) is isolated by column chromatography.

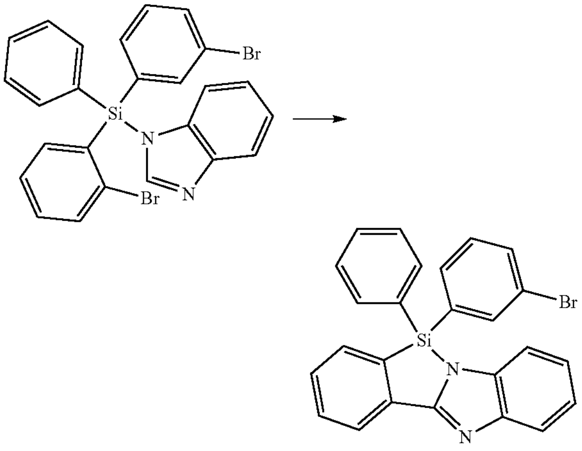

M4-3

M4-2 (53.2 g, 100 mmol), $K_2CO_3$ (20.7 g, 150 mmol) and copper

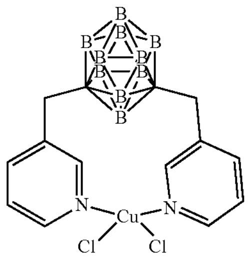

complex (0.45 g, 1 mmol) are dissolved in 300 ml of toluene, and the reaction is carried out at room temperature for 6 hours. After the reaction comes to an end, the reaction solution is concentrated and passed through a silica gel column layer to obtain M4-3 (42.9 g, 95%).

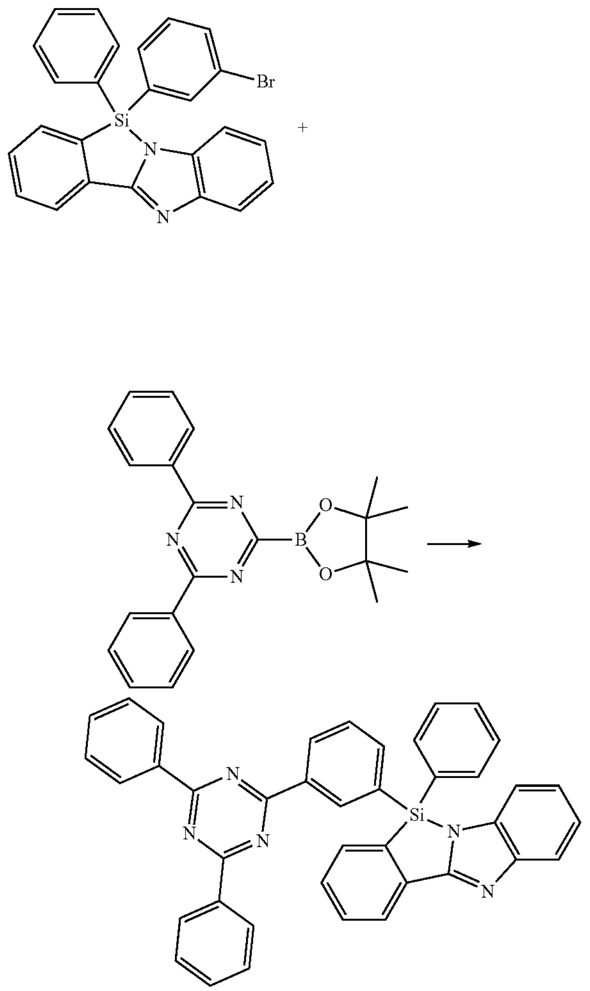

B2

The preparation method of B2 is consistent with the preparation method of A2. According to the preparation method of A2, same molar ratio is used, and M1-4 is replaced with M4-3.

Preparation of B21

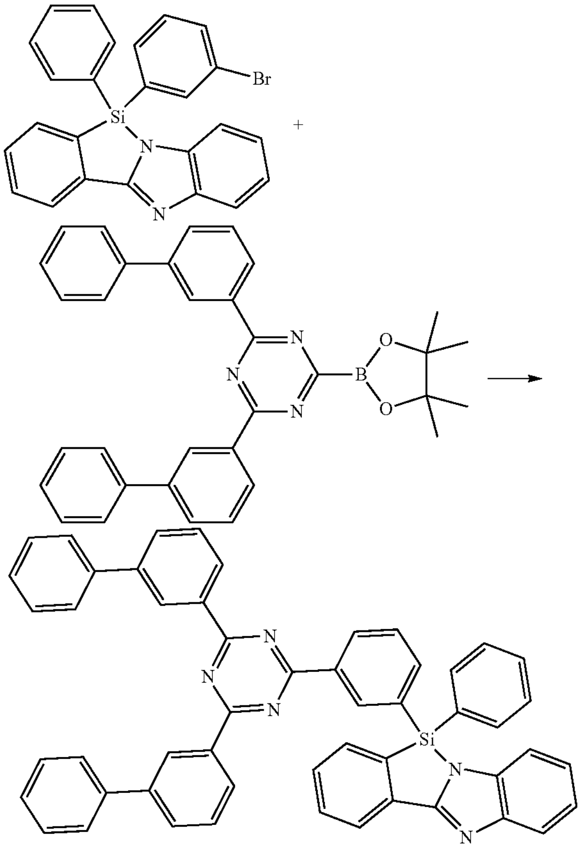

B21

The preparation method of B21 is consistent with the preparation method of A2. According to the preparation method of A2, same molar ratio is used, M1-4 is replaced with M4-3, and 2,4-diphenyl-6-(4,4,5,5-tetramethyl-1,3,2-dioxaborolan-2-yl)-1,3,5-triazine is replaced with 2,4-di(1,1'-diphenyl-3-yl)-6-(4,4,5,5-tetramethyl-1,3,2-dioxaborolan-2-yl)-1,3,5-triazine.

Preparation of B29

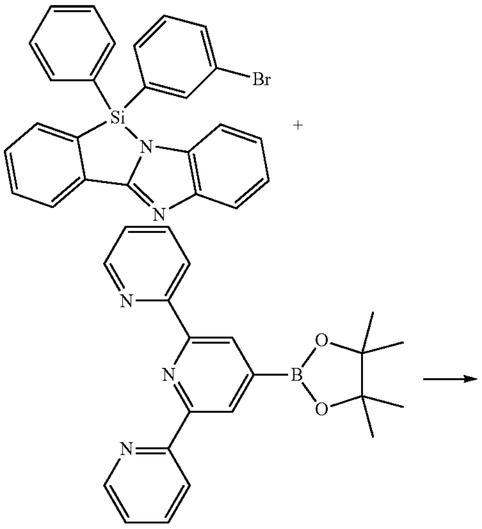

-continued

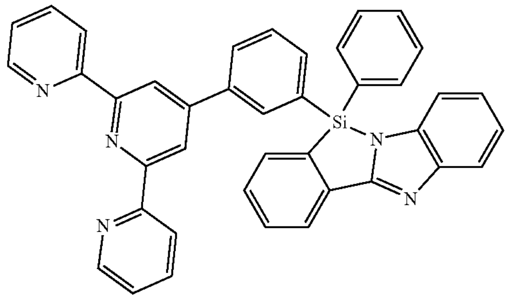

B29

The preparation method of B29 is consistent with the preparation method of A2. According to the preparation method of A2, same molar ratio is used, M1-4 is replaced with M4-3, and 2,4-diphenyl-6-(4,4,5,5-tetramethyl-1,3,2-dioxaborolan-2-yl)-1,3,5-triazine is replaced with 4'-(4,4,5,5-tetramethyl-1,3,2-dioxaborolan-2-yl)-2,2':6',2"-terpyrindine.

Preparation of B76

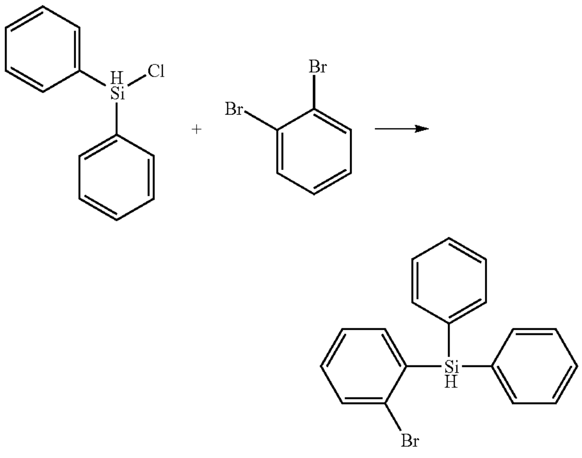

M5-1

The preparation method of M5-1 is consistent with the preparation method of M1-1. According to the preparation method of M1-1, same molar ratio is used, and trichlorophenylsilane is replaced with chlorodiphenylsilane.

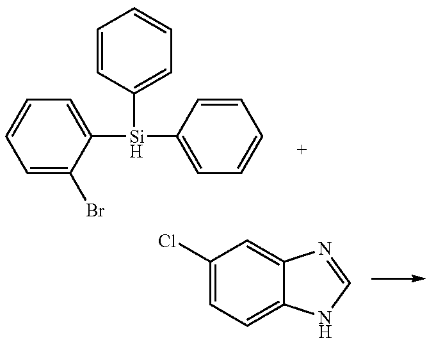

-continued

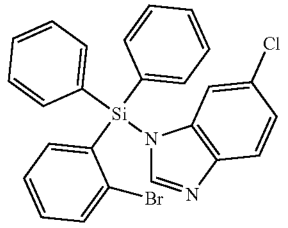

M5-2

The preparation method of M5-2 is consistent with the preparation method of M4-2. According to the preparation method of M4-2, same molar ratio is used, M4-1 is replaced with M5-1, and benzimidazole is replaced with 5-chlorobenzimidazole.

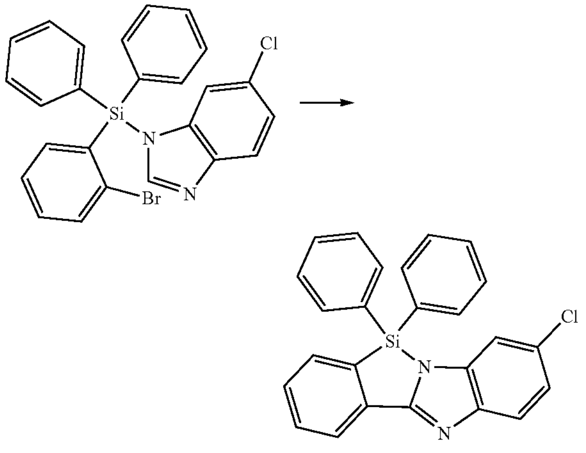

M5-3

The preparation method of M5-3 is consistent with the preparation method of M4-3. According to the preparation method of M4-3, same molar ratio is used, and M4-2 is replaced with M5-2.

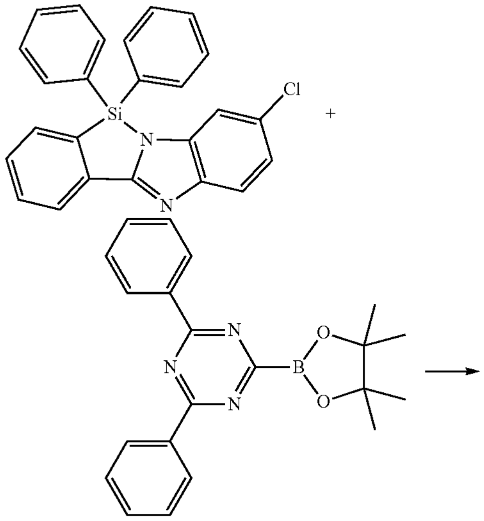

-continued

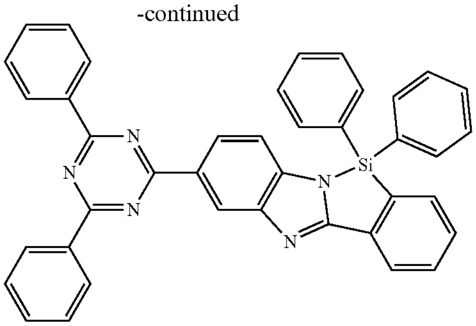

B76

The preparation method of B76 is consistent with the preparation method of A2. According to the preparation method of A2, same molar ratio is used, and M1-4 is replaced with M5-3.

Preparation of B80

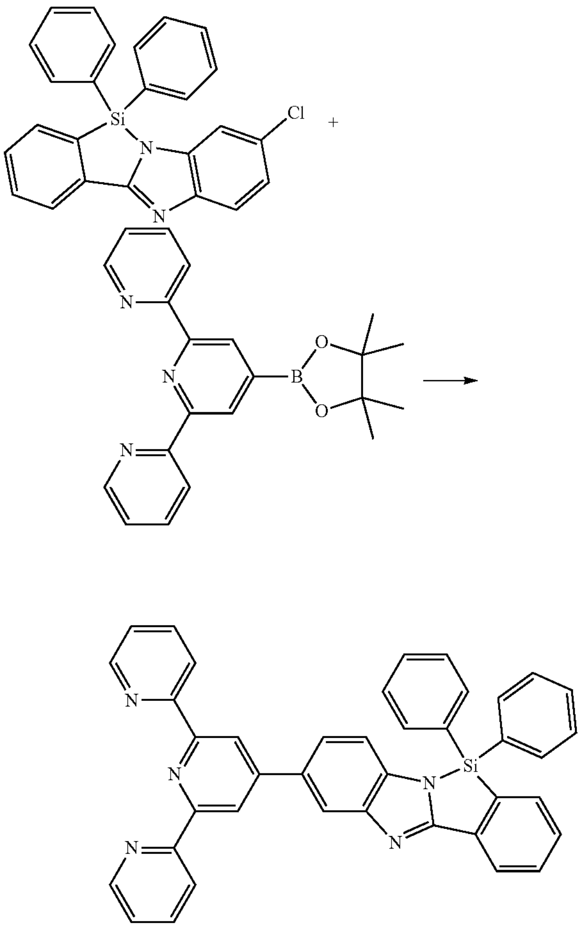

B80

The preparation method of B80 is consistent with the preparation method of A2. According to the preparation method of A2, same molar ratio is used, and M1-4 is replaced with M5-3, and 2,4-diphenyl-6-(4,4,5,5-tetramethyl-1,3,2-dioxaborolan-2-yl)-1,3,5-triazine is replaced with 4'-(4,4,5,5-tetramethyl-1,3,2-dioxaborolan-2-yl)-2,2':6',2"-terpyrindine.

Preparation of B81

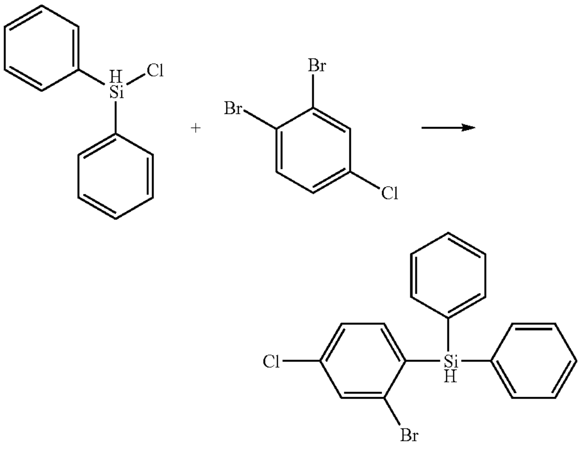

M6-1

The preparation method of M6-1 is consistent with the preparation method of M1-1. According to the preparation method of M1-1, same molar ratio is used, 1,2-dibromobenzene is replaced with 1,2-dibromo-4-chlorobenzene, and trichlorophenylsilane is replaced with chlorodiphenylsilane.

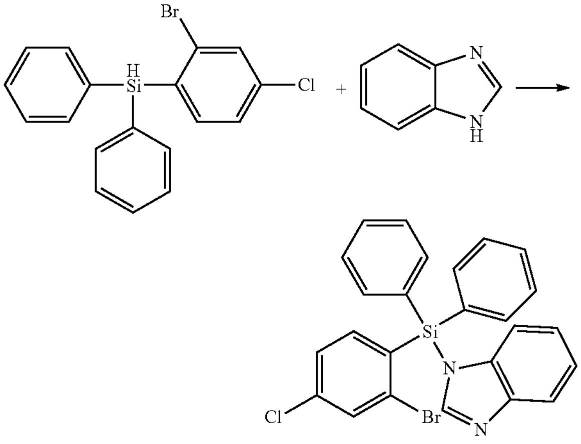

M6-2

The preparation method of M6-2 is consistent with the preparation method of M4-2. According to the preparation method of M4-2, same molar ratio is used, and M4-1 is replaced with M6-1.

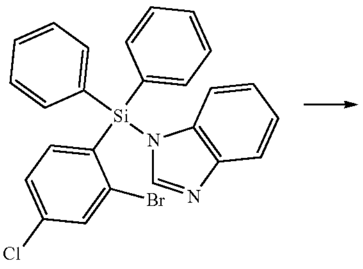

-continued

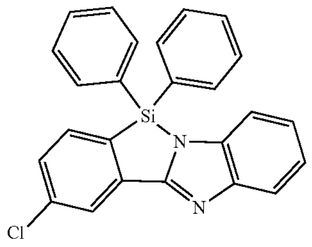

M6-3

The preparation method of M6-3 is consistent with the preparation method of M4-3. According to the preparation method of M4-3, same molar ratio is used, and M4-2 is replaced with M6-2.

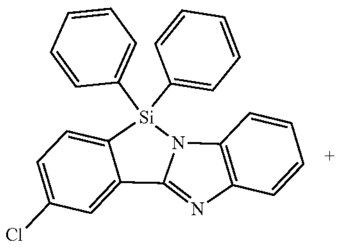

-continued

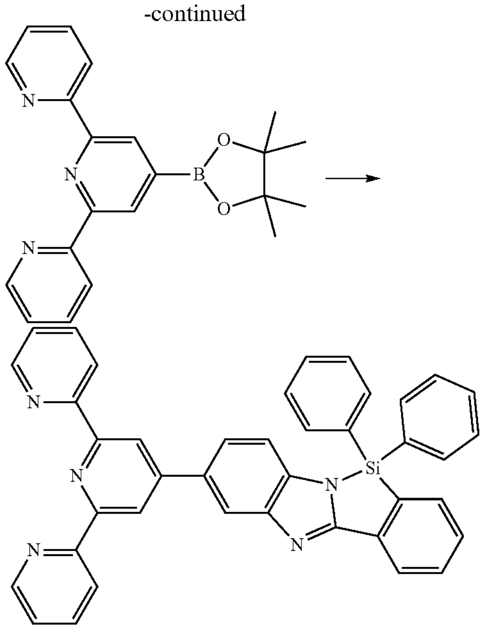

B81

The preparation method of B81 is consistent with the preparation method of A2. According to the preparation method of A2, same molar ratio is used, and M1-4 is replaced with M6-3, and 2,4-diphenyl-6-(4,4,5,5-tetramethyl-1,3,2-dioxaborolan-2-yl)-1,3,5-triazine is replaced with 4'-(4,4,5,5-tetramethyl-1,3,2-dioxaborolan-2-yl)-2,2':6',2"-terpyrindine.

The compounds are identified by matrix-assisted laser desorption ionization time-of-flight mass spectrometry and elemental analysis, and the results are shown in Table 1 below.

TABLE 1

| Compounds | MALDI-TOF MS Theoretical Values (m/z) | MALDI-TOF MS Test Values (m/z) | Ultraviolet (UV) Absorption (nm) | Elemental Analysis Theoretical Values | Elemental Analysis Test Values |
|---|---|---|---|---|---|
| A2 | 605.20 | 605.75 | 363 | C: 79.31; H: 4.49; N: 11.56; Si: 4.64 | C: 79.29; H: 4.50; N: 11.57; Si: 4.64 |
| A21 | 757.27 | 757.91 | 375 | C: 82.40; H: 4.65; N: 9.24; Si: 3.71 | C: 82.41; H: 4.65; N: 9.23; Si: 3.71 |
| A29 | 605.20 | 605.84 | 360 | C: 79.31; H: 4.49; N: 11.56; Si: 4.64 | C: 79.32; H: 4.49; N: 11.55; Si: 4.64 |
| A76 | 605.20 | 606.01 | 339 | C: 79.31; H: 4.49; N: 11.56; Si: 4.64 | C: 79.30; H: 4.49; N: 11.56; Si: 4.65 |
| A80 | 605.20 | 605.93 | 344 | C: 79.31; H: 4.49; N: 11.56; Si: 4.64 | C: 79.32; H: 4.48; N: 11.57; Si: 4.63 |
| A81 | 605.20 | 605.69 | 357 | C: 79.31; H: 4.49; N: 11.56; Si: 4.64 | C: 79.30; H: 4.50; N: 11.55; Si: 4.65 |
| B2 | 605.20 | 605.78 | 396 | C: 79.31; H: 4.49; N: 11.56; Si: 4.64 | C: 79.32; H: 4.50; N: 11.55; Si: 4.63 |
| B21 | 757.27 | 757.79 | 412 | C: 82.40; H: 4.65; N: 9.24; Si: 3.71 | C: 82.39; H: 4.66; N: 9.25; Si: 3.71 |
| B29 | 605.20 | 605.93 | 395 | C: 79.31; H: 4.49; N: 11.56; Si: 4.64 | C: 79.34; H: 4.48; N: 11.55; Si: 4.63 |
| B76 | 605.20 | 605.87 | 369 | C: 79.31; H: 4.49; N: 11.56; Si: 4.64 | C: 79.28; H: 4.50; N: 11.57; Si: 4.65 |
| B80 | 605.20 | 605.92 | 376 | C: 79.31; H: 4.49; N: 11.56; Si: 4.64 | C: 79.33; H: 4.48; N: 11.56; Si: 4.63 |
| B81 | 605.20 | 605.86 | 391 | C: 79.31; H: 4.49; N: 11.56; Si: 4.64 | C: 79.32; H: 4.47; N: 11.55; Si: 4.64 |

Using density functional theory (DFT), for the organic compounds provided according to certain embodiment(s) of the present disclosure, through the Gaussian 09 package (Gaussian Inc.) at the B3LYP/6-31G(d) calculation level, optimization and calculations are performed to obtain the molecular frontier orbitals HOMO and the distribution of LUMO. The singlet energy level Es and triplet energy level ET of the compounds are calculated based on time-dependent density functional theory (TDDFT) simulations. The results are shown in Table 2.

TABLE 2

| Compounds | HOMO (eV) | LUMO (eV) | $E_S$ (eV) | $E_T$ (eV) |
|---|---|---|---|---|
| A2 | −5.77 | −1.96 | 3.42 | 2.99 |
| A21 | −5.71 | −1.92 | 3.31 | 2.90 |
| A29 | −5.64 | −1.90 | 3.44 | 2.92 |
| A76 | −5.84 | −1.78 | 3.66 | 2.94 |
| A80 | −5.82 | −1.70 | 3.60 | 2.90 |
| A81 | −5.82 | −1.93 | 3.47 | 2.75 |
| B2 | −5.60 | −2.06 | 3.13 | 2.83 |
| B21 | −5.61 | −2.02 | 3.01 | 2.80 |
| B29 | −5.53 | −2.00 | 3.14 | 2.79 |
| B76 | −5.74 | −1.88 | 3.36 | 2.81 |
| B80 | −5.72 | −1.80 | 3.30 | 2.80 |
| B81 | −5.70 | −1.84 | 3.17 | 2.66 |

Comparative Example 1

A glass substrate coated with ITO (indium tin oxide) in a thin film at a thickness of 1000 Å is placed in distilled water with dissolved detergent, and washed with ultrasonic waves. After washing the ITO for 30 minutes, ultrasonic washing for 10 minutes is repeated twice with distilled water. After washing with distilled water, ultrasonically wash with isopropanol, acetone, and methanol, and dry, and then transport to a plasma cleaning machine. After cleaning the substrate for 5 minutes by oxygen plasma, the substrate is transported to a vacuum vapor deposition machine.

Onto the ITO transparent electrode as prepared, compounds HI (650 Å) and HAT (50 Å), whose formulas are stated below, are sequentially thermally vacuum deposited to form a hole injection layer. Onto the hole injection layer, compound HT (600 Å), whose formula is stated below, is vacuum deposited to form a hole transport layer. Subsequently, vacuum evaporation of EB (50 Å), whose formula is stated below, is performed to form an electron blocking layer.

Onto the electron blocking layer, compounds [BH] and [BD], whose formulas are stated below, are vacuum deposited at a weight ratio of 96:4 and at a film thickness of 200 Å to form a light-emitting layer.

On the light-emitting layer, HB (50 Å) is vacuum deposited as a hole blocking layer, followed by vacuum evaporation of ET and Liq, whose formulas are stated below, in a weight ratio of 1:1 to 310 Å, followed by vacuum deposition of Liq compound to a thickness of 5 Å to form electron injection layer. On the electron injection layer, magnesium and silver are sequentially deposited in a weight ratio of 10:1, at a thickness of 220 Å, and aluminum is at a thickness of 1000 Å to form a cathode, thereby forming an organic light-emitting diode.

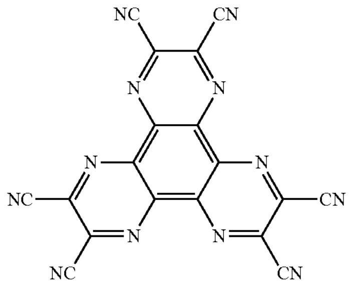

[HAT]

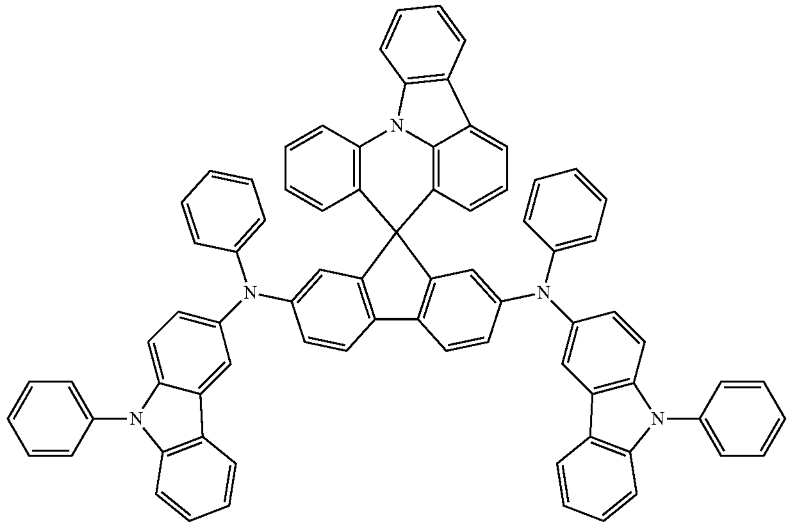

[HI]

-continued
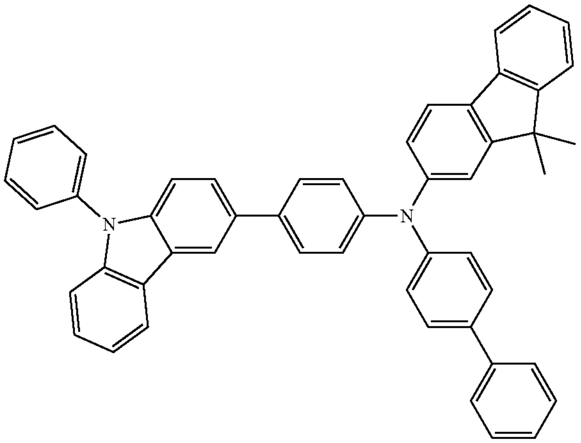
[HT]
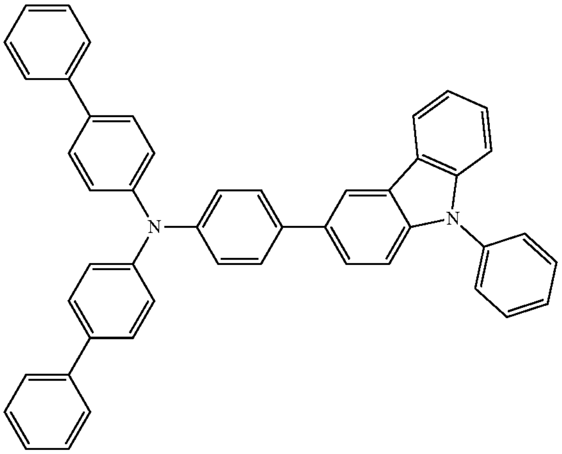
[EB]
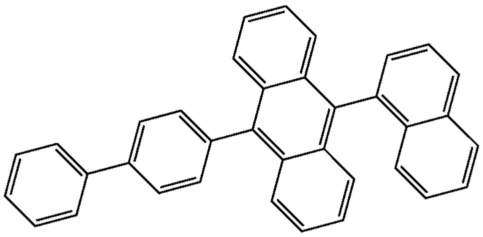
[BH]
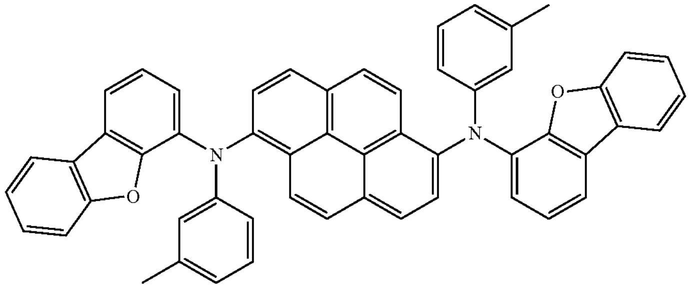
[BD]
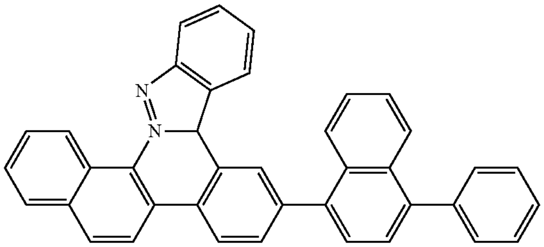
[HB]

-continued

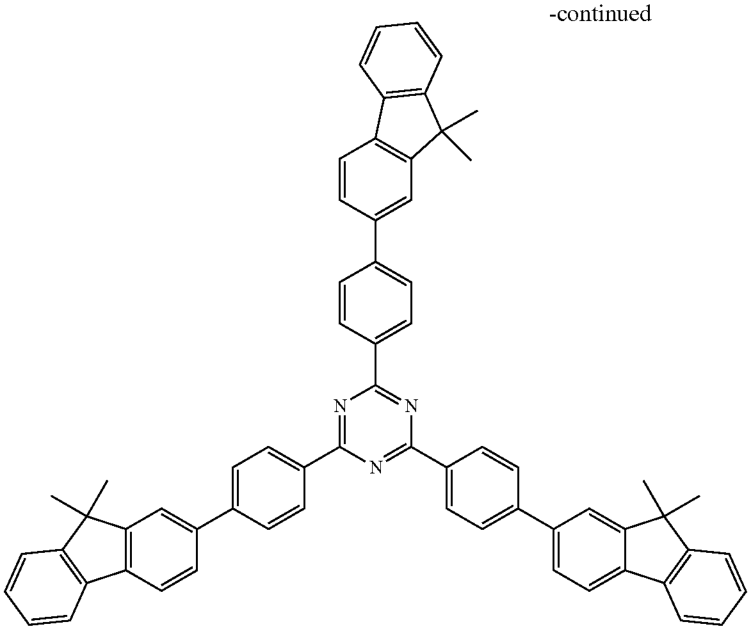

[ET]

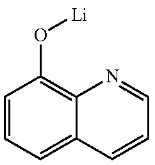

[Liq]

Examples 1-1 to 1-12 use the same method as the method of comparative example 1, except that the compounds shown in Table 3 are employed, electron transport layer materials, and corresponding light-emitting devices are produced.

On the organic light-emitting devices, the driving voltage and the luminous efficiency are measured at an electric current density of 10 $mA/cm^2$, and the time required to achieve 95% of the initial brightness (LT95) is measured at an electric current density of 20 $mA/cm^2$. The results are shown in Table 3.

TABLE 3

| Items | electron transport layer | Voltage (V) | electric current efficiency (cd/A) | LT95(h) |
|---|---|---|---|---|
| Comparative Example | HB | 5.14 | 4.12 | 94 |
| Test Example 1-1 | A2 | 4.92 | 5.18 | 125 |
| Test Example 1-2 | A21 | 5.08 | 4.95 | 121 |
| Text Example 1-3 | A29 | 5.11 | 5.06 | 119 |
| Test Example 1-4 | A76 | 5.09 | 4.55 | 116 |
| Test Example 1-5 | A80 | 5.10 | 4.67 | 112 |
| Test Example 1-6 | A81 | 4.99 | 4.72 | 114 |
| Test Example 1-7 | B2 | 4.88 | 5.30 | 118 |
| Test Example 1-8 | B21 | 5.04 | 5.07 | 115 |
| Test Example 1-9 | B29 | 5.07 | 5.18 | 112 |
| Test Example 1-10 | B76 | 5.05 | 4.67 | 109 |
| Test Example 1-12 | B80 | 5.06 | 4.79 | 105 |
| Test Example 1-12 | B81 | 4.95 | 4.84 | 107 |

In test examples 2-1 to 2-12, the same method as in comparative example 1 is used, except that the compounds shown in Table 4 are used as the material for the hole blocking layer, and corresponding light-emitting devices are produced. The driving voltage and luminous efficiency are measured at an electric current density of 10 $mA/cm^2$, and the time required to achieve 95% of the initial brightness (LT95) is measured at an electric current density of 20 $mA/cm^2$. The results are shown in Table 4.

TABLE 4

| Items | Hole Blocking Layer | Voltage (V) | Electric Current Efficiency (cd/A) | LT95(h) |
|---|---|---|---|---|
| Comparative Example | HB | 5.14 | 4.12 | 94 |
| Text Example 2-1 | A2 | 4.89 | 5.23 | 135 |
| Text Example 2-2 | A21 | 5.05 | 5.00 | 131 |
| Text Example 2-3 | A29 | 5.08 | 5.11 | 129 |
| Text Example 2-4 | A76 | 5.06 | 4.60 | 126 |
| Text Example 2-5 | A80 | 5.07 | 4.72 | 122 |
| Text Example 2-6 | A81 | 4.96 | 4.77 | 124 |
| Text Example 2-7 | B2 | 4.85 | 5.35 | 128 |
| Text Example 2-8 | B21 | 5.01 | 5.12 | 125 |
| Text Example 2-9 | B29 | 5.04 | 5.23 | 122 |
| Text Example 2-10 | B76 | 5.02 | 4.72 | 119 |
| Text Example 2-11 | B80 | 5.03 | 4.84 | 115 |
| Text Example 2-12 | B81 | 4.92 | 4.89 | 117 |

As shown in Table 3 and Table 4, compared with the organic light-emitting devices of the Comparative Example using compounds not represented by Formula 1, certain organic light-emitting device employing the compounds of the present disclosure as the material of the hole blocking layer and the electron transporting layer exhibit desirable device properties, on improving the electron transport rate, balancing the injection of electrons and holes, and improving the efficiency and life span of the organic light-emitting device (OLED).

On organic light-emitting devices, there is a trade-off relationship between the luminous efficiency and lifetime characteristics. Compared with comparative device(s), and when the type of the substituent or atom in Formula 1 is changed, the electron transport rate may be adjusted, the electron transport rate and hence the balance of the device carriers may be changed accordingly, to obtain technical improvement.

The embodiments are described to help with understanding of the method and the idea of the present disclosure. For those skilled in the art, without departing from the principle of the present disclosure, improvements and modifications may be made to the present disclosure, and these improvements and modifications also fall within the protection scope of the claims of the present disclosure.

What is claimed is:

1. A compound, having a structure of Formula II or Formula III:

Formula II

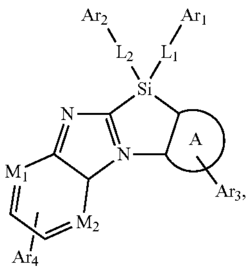

Formula III

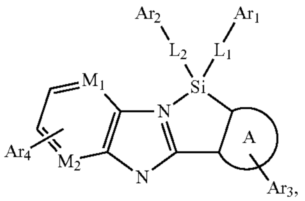

wherein: M1 and M2 are each independently a carbon atom or a nitrogen atom; A is a substituted or unsubstituted aryl group or a substituted or unsubstituted heteroaryl group; $L_1$ and $L_2$ are each independently a single bond, a substituted or unsubstituted aryl group, or a substituted or unsubstituted heteroaryl group; $Ar_1$, $Ar_2$, $Ar_3$, $Ar_4$ are each independently a hydrogen atom, a deuterium atom, a cyano group, a nitro group, an amino group, a hydroxy group, a halogen atom, a substituted or unsubstituted alkyl group, a substituted or unsubstituted aryl group, or a substituted or unsubstituted heteroaryl group.

2. The compound according to claim 1, wherein A is selected from:

a substituted or unsubstituted monocyclic aryl group, a substituted or unsubstituted monocyclic heteroaryl group, a condensed aryl group formed by condensing 2-3 substituted or unsubstituted monocyclic aryl groups, a condensed heteroaryl group formed by condensing 2-3 substituted or unsubstituted monocyclic aryl and monocyclic heteroaryl groups, or a condensed heteroaryl group formed by condensing 2-3 substituted or unsubstituted monocyclic heteroaryl groups, wherein A is a substituted or unsubstituted heteroaryl group including at least one nitrogen atom.

3. The compound according to claim 2, wherein the monocyclic aryl group is a phenyl group, wherein the monocyclic heteroaryl group is a five-membered, six-membered, or seven-membered monocyclic heteroaryl group, and wherein the monocyclic heteroaryl group includes a nitrogen atom, an oxygen atom, or a sulfur atom.

4. The compound according to claim 3, wherein the monocyclic heteroaryl group includes a pyrrolyl group, a furyl group, a thienyl group, an imidazolyl group, a pyrazolyl group, an isothiazolyl group, an isoxazolyl group, an oxazolyl group, a thiazolyl group, a thiadiazole group, a triazole group, a tetrazolyl group, a pyridyl group, a pyranyl group, a pyrimidinyl group, a pyridazinyl group, a pyrazinyl group, or a triazinyl group.

5. The compound according to claim 2, wherein A is a substituted or unsubstituted phenyl group, a substituted or unsubstituted pyrrolyl group, a substituted or unsubstituted furyl group, a substituted or unsubstituted thienyl group, a substituted or unsubstituted imidazolyl group, a substituted or unsubstituted pyrazolyl group, a substituted or unsubstituted isothiazolyl group, a substituted or unsubstituted isoxazolyl group, a substituted or unsubstituted oxazolyl group, a substituted or unsubstituted thiazolyl group, a substituted or unsubstituted triazolyl group, a substituted or unsubstituted tetrazolyl group, a substituted or unsubstituted pyridyl group, a substituted or unsubstituted pyranyl group, a substituted or unsubstituted pyrimidinyl group, a substituted or unsubstituted pyridazinyl group, a substituted or unsubstituted pyrazinyl group, a substituted or unsubstituted triazinyl group, a substituted or unsubstituted naphthyl group, a substituted or unsubstituted quinolinyl group, a substituted or unsubstituted quinoxalinyl group, a substituted or unsubstituted isoquinolinyl group, a substituted or unsubstituted quinazolinyl group, a substituted or unsubstituted benzimidazolyl group, a substituted or unsubstituted benzothiazolyl group, a substituted or unsubstituted benzoxazolyl group, a substituted or unsubstituted imidazo[1,2-a]pyrimidine, 4-azabenzimidazolyl group, a substituted or unsubstituted 5-azabenzimidazolyl, 4,7-Azabenzimidazolyl group, a substituted or unsubstituted benzothiadiazolyl group, a substituted or unsubstituted benzotriazolyl group, a substituted or unsubstituted anthracenyl group, a substituted or unsubstituted phenanthryl group, a substituted or unsubstituted acridinyl group, a substituted or unsubstituted carbazolyl group, a substituted or unsubstituted fluorenyl group, a substituted or unsubstituted dibenzofuranyl group, or a substituted or unsubstituted dibenzothienyl group.

6. The compound according to claim 1, wherein A is a substituted or unsubstituted phenyl group, a substituted or unsubstituted pyrrolyl group, a substituted or unsubstituted furyl group, a substituted or unsubstituted thienyl group, a substituted or unsubstituted imidazolyl group, a substituted or unsubstituted pyrazolyl group, a substituted or unsubstituted isothiazolyl group, a substituted or unsubstituted isoxazolyl group, a substituted or unsubstituted oxazolyl group, a substituted or unsubstituted thiazolyl group, a substituted or unsubstituted triazolyl group, a substituted or unsubstituted tetrazolyl group, a substituted or unsubstituted pyridyl group, a substituted or unsubstituted pyranyl group, a substituted or unsubstituted pyrimidinyl group, a substituted or unsubstituted pyridazinyl group, a substituted or unsubstituted pyrazinyl group, or a substituted or unsubstituted triazinyl group.

7. The compound according to claim 1, wherein $L_1$ and $L_2$ are each independently a single bond, a substituted or unsubstituted C6-C20 aryl group or a substituted or unsubstituted C3-C20 heteroaryl group, the substituted or unsubstituted C3-C20 heteroaryl group includes a nitrogen atom, an oxygen atom, a sulfur atom, or a silicon atom.

8. The compound according to claim 7, wherein $L_1$ and $L_2$ are each independently a single bond, or any one of a substituted or unsubstituted monocyclic aryl group, a substituted or unsubstituted monocyclic heteroaryl group, a condensed aryl group formed by condensing 2-3 substituted or unsubstituted monocyclic aryl groups, a condensed heteroaryl group formed by condensing 2-3 substituted or unsubstituted monocyclic aryl and monocyclic heteroaryl groups, or a condensed heteroaryl group formed by condensing 2-3 substituted or unsubstituted monocyclic heteroaryl groups.

9. The compound according to claim 8, wherein $L_1$ and $L_2$ are each independently the substituted or unsubstituted monocyclic aryl or the substituted or unsubstituted monocyclic heteroaryl, wherein the monocyclic aryl group is a phenyl, and wherein the monocyclic heteroaryl group includes a pyrrolyl, furyl, thienyl, imidazolyl, pyrazolyl, isothiazolyl, isoxazolyl, oxazolyl, thiazolyl, thiadiazole, triazole, tetrazolyl, pyridyl, pyranyl, pyrimidinyl, pyridazinyl, pyrazinyl, or triazinyl.

10. The compound according to claim 8, wherein $L_1$ and $L_2$ are each independently a single bond, a substituted or unsubstituted phenyl group, a substituted or unsubstituted pyrrolyl group, a substituted or unsubstituted furyl group, a substituted or unsubstituted thienyl group, a substituted or unsubstituted imidazolyl group, a substituted or unsubstituted pyrazolyl group, a substituted or unsubstituted isothiazolyl group, a substituted or unsubstituted isoxazolyl group, a substituted or unsubstituted oxazolyl group, a substituted or unsubstituted thiazolyl group, a substituted or unsubstituted triazolyl group, a substituted or unsubstituted tetrazolyl group, a substituted or unsubstituted pyridyl group, a substituted or unsubstituted pyranyl group, a substituted or unsubstituted pyrimidinyl group, a substituted or unsubstituted pyridazinyl group, a substituted or unsubstituted pyrazinyl group, a substituted or unsubstituted triazinyl group, a substituted or unsubstituted naphthyl group, a substituted or unsubstituted quinolinyl group, a substituted or unsubstituted quinoxalinyl group, a substituted or unsubstituted isoquinolinyl group, a substituted or unsubstituted quinazolinyl group, a substituted or unsubstituted benzimidazolyl group, a substituted or unsubstituted benzothiazolyl group, a substituted or unsubstituted benzoxazolyl group, a substituted or unsubstituted imidazo[1,2-a]pyrimidine, 4-azabenzimidazolyl group, a substituted or unsubstituted 5-azabenzimidazolyl, 4,7-Azabenzimidazolyl group, a substituted or unsubstituted benzothiadiazolyl group, a substituted or unsubstituted benzotriazolyl group, a substituted or unsubstituted anthracenyl group, a substituted or unsubstituted phenanthryl group, a substituted or unsubstituted 1-Azaphenanthrenyl group, a substituted or unsubstituted 1,10-phenanthroline group, a substituted or unsubstituted acridinyl group, a substituted or unsubstituted carbazolyl group, a substituted or unsubstituted fluorenyl group, a substituted or unsubstituted dibenzofuranyl group, or a substituted or unsubstituted dibenzothienyl group.

11. The compound according to claim 1, wherein $Ar_1$, $Ar_2$, $Ar_3$, and $Ar_4$ are each independently a hydrogen atom, a deuterium atom, a cyano group, a nitro group, an amino group, a hydroxyl group, a halogen atom, a substituted or unsubstituted C1-C10 alkyl group, a substituted or unsubstituted C6-C20 aryl, or a substituted or unsubstituted C3-C20 heteroaryl group, and the heteroaryl includes a nitrogen atom, an oxygen atom, a sulfur atom, or a silicon atom.

12. The compound according to claim 11, wherein $Ar_1$, $Ar_2$, $Ar_3$, and $Ar_4$ are each independently the hydrogen atom, the deuterium atom, the cyano group, the nitro group, the amino group, the hydroxyl group, the halogen atom, the substituted or unsubstituted C1-C6 alkyl group, or any one of a substituted or unsubstituted monocyclic aryl group, a substituted or unsubstituted monocyclic heteroaryl group, a condensed aryl group formed by condensing 2-3 substituted or unsubstituted monocyclic aryl groups, a condensed heteroaryl group formed by condensing 2-3 substituted or unsubstituted monocyclic aryl and monocyclic heteroaryl groups, or a condensed heteroaryl group formed by condensing 2-3 substituted or unsubstituted monocyclic heteroaryl groups.

13. The compound according to claim 12, wherein $Ar_1$, $Ar_2$, $Ar_3$, and $Ar_4$ are each independently the hydrogen atom, the deuterium atom, the cyano group, the nitro group, the amino group, the hydroxyl group, a fluorine atom, a chlorine atom, a bromine atom, a substituted or unsubstituted methyl group, a substituted or unsubstituted ethyl group, a substituted or unsubstituted n-propyl group, a substituted or unsubstituted isopropyl group, a substituted or unsubstituted n-butyl group, a substituted or unsubstituted isobutyl group, a substituted or unsubstituted tert-butyl group, a substituted or unsubstituted n-pentyl group, a substituted or unsubstituted isopentyl group, a substituted or unsubstituted neopentyl group, a substituted or unsubstituted phenyl group, a substituted or unsubstituted pyrrolyl group, a substituted or unsubstituted furyl group, a substituted or unsubstituted thienyl group, a substituted or unsubstituted imidazolyl group, a substituted or unsubstituted pyrazolyl group, a substituted or unsubstituted isothiazolyl group, a substituted or unsubstituted isoxazolyl group, a substituted or unsubstituted oxazolyl group, a substituted or unsubstituted thiazolyl group, a substituted or unsubstituted triazolyl group, a substituted or unsubstituted tetrazolyl group, a substituted or unsubstituted pyridyl group, a substituted or unsubstituted pyranyl group, a substituted or unsubstituted pyrimidinyl group, a substituted or unsubstituted pyridazinyl group, a substituted or unsubstituted pyrazinyl group, a substituted or unsubstituted triazinyl group, a substituted or unsubstituted naphthyl group, a substituted or unsubstituted quinolinyl group, a substituted or unsubstituted quinoxalinyl group, a substituted or unsubstituted isoquinolinyl group, a substituted or unsubstituted quinazolinyl group, a substituted or unsubstituted benzimidazolyl group, a substituted or unsubstituted benzothiazolyl group, a substituted or unsubstituted benzoxazolyl group, a substituted or unsubstituted imidazo [1,2-a]pyrimidine group, a substituted or unsubstituted 4-azabenzimidazolyl group, a substituted or unsubstituted 5-azabenzimidazolyl group, a substituted or unsubstituted 4,7-Azabenzimidazolyl group, a substituted or unsubstituted benzothiadiazolyl group, a substituted or unsubstituted benzotriazolyl group, a substituted or unsubstituted anthracenyl group, a substituted or unsubstituted phenanthryl group, a substituted or unsubstituted 1-Azaphenanthrenyl group, a substituted or unsubstituted 1,10-phenanthroline group, a substituted or unsubstituted acridinyl group, a substituted or unsubstituted carbazolyl group, a substituted or unsubstituted fluorenyl group, a substituted or unsubstituted dibenzofuranyl group, or a substituted or unsubstituted dibenzothienyl group.

14. The compound according to claim 1, wherein substituents of A, $L_1$, $L_2$, $Ar_1$, $Ar_2$, $Ar_3$, $Ar_4$ are each independently the deuterium atom, the cyano group, the nitro group, the amino group, the hydroxy group, the halogen atom, the substituted or unsubstituted alkyl group, the substituted or unsubstituted aryl group, or the substituted or unsubstituted heteroaryl group.

15. The compound according to claim 14, wherein substituents of A, $L_1$, $L_2$, $Ar_1$, $Ar_2$, $Ar_3$, and $Ar_4$ are each independently the deuterium atom, the cyano group, the nitro group, the amino group, the hydroxy group, the halogen atom, a substituted or unsubstituted C1-C10 alkyl group, a substituted or unsubstituted C6-C20 aryl group, or a substituted or unsubstituted C3-C20 heteroaryl group.

16. The compound according to claim 15, wherein substituents of A, $L_1$, $L_2$, $Ar_1$, $Ar_2$, $Ar_3$, and $Ar_4$ are each independently the deuterium atom, the cyano group, the nitro group, the amino group, the hydroxy group, a fluorine atom, a chlorine atom, a bromine atom, a substituted or unsubstituted phenyl group, a substituted or unsubstituted biphenyl group, a substituted or unsubstituted pyridyl group, a substituted or unsubstituted pyrimidinyl group, a substituted or unsubstituted pyrazinyl group, a substituted or unsubstituted pyridazinyl group, a substituted or unsubstituted triazinyl group, a substituted or unsubstituted furyl group, a substituted or unsubstituted thienyl group, a substituted or unsubstituted pyrrolyl group, a substituted or unsubstituted pyranyl group, a substituted or unsubstituted benzimidazolyl group, a substituted or unsubstituted benzothiazolyl group, a substituted or unsubstituted benzoxazolyl group, a substituted or unsubstituted naphthyl group, a substituted or unsubstituted anthracenyl group, a substituted or unsubstituted phenanthryl group, a substituted or unsubstituted carbazolyl group, a substituted or unsubstituted fluorenyl group, a substituted or unsubstituted dibenzofuranyl group, a substituted or unsubstituted dibenzothienyl group, a substituted or unsubstituted quinolinyl group, a substituted or unsubstituted isoquinolinyl group, a substituted or unsubstituted quinoxalinyl group, or a substituted or unsubstituted quinazolinyl group.

17. A compound selected from the group consisting of:

A1

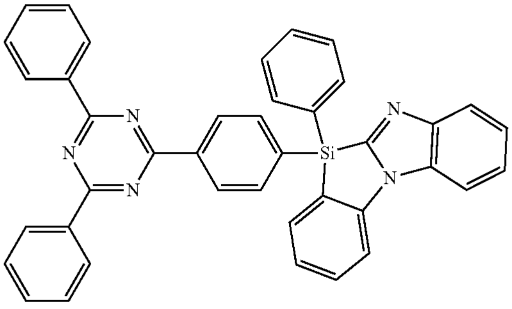

A2

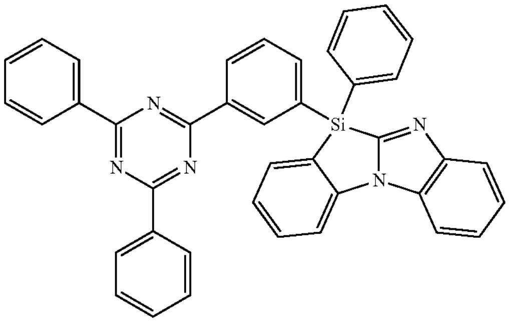

-continued

A3

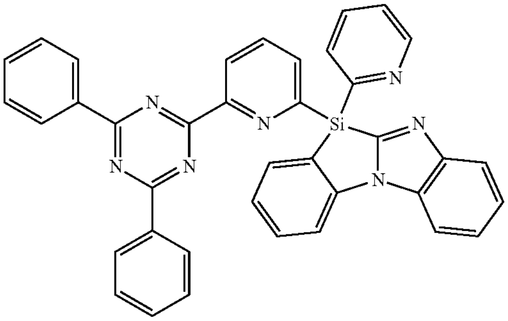

A4

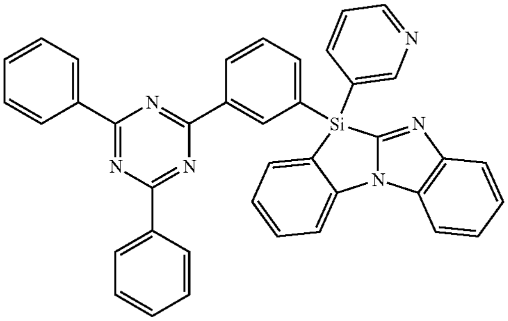

A5

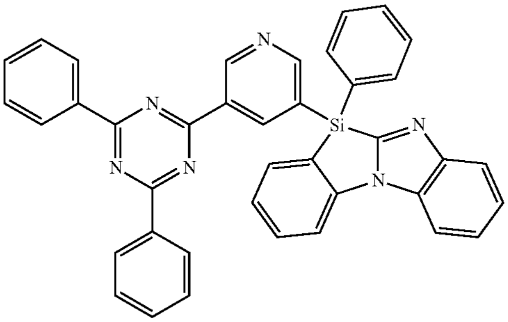

A6

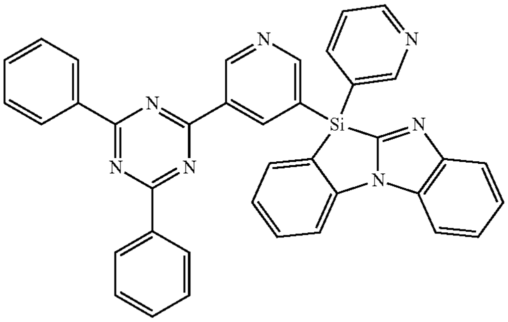

-continued
A7
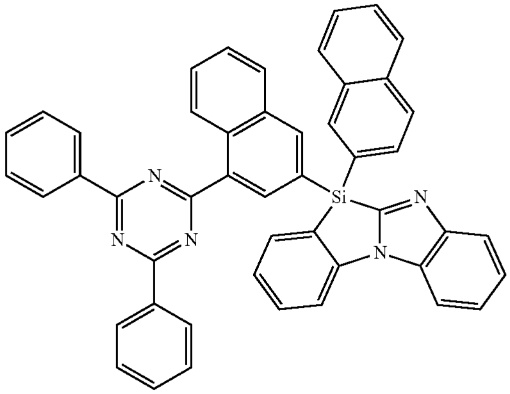
A8
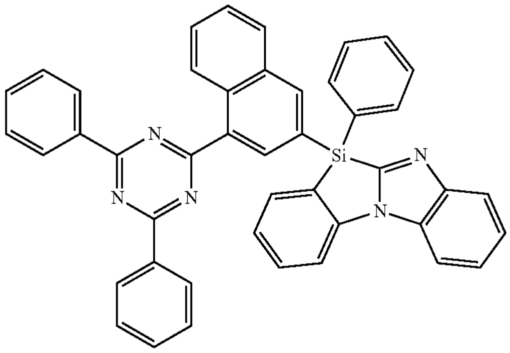
A9
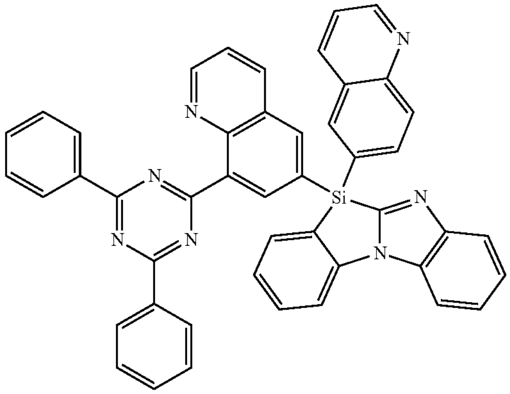
A10
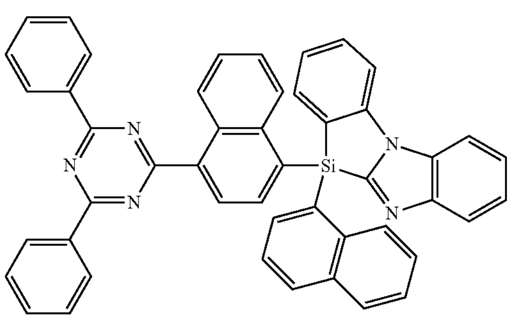
-continued
A11
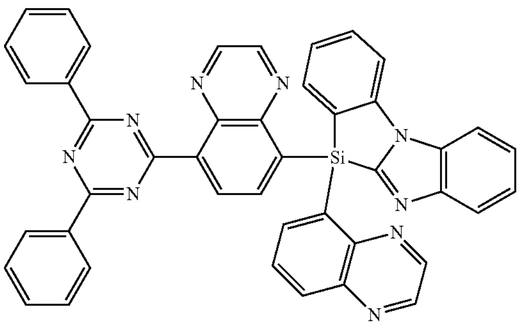
A12
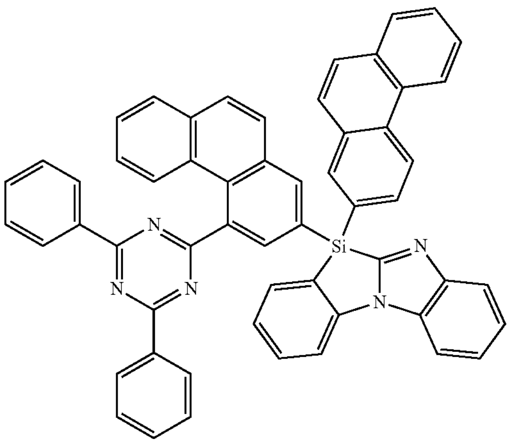
A13
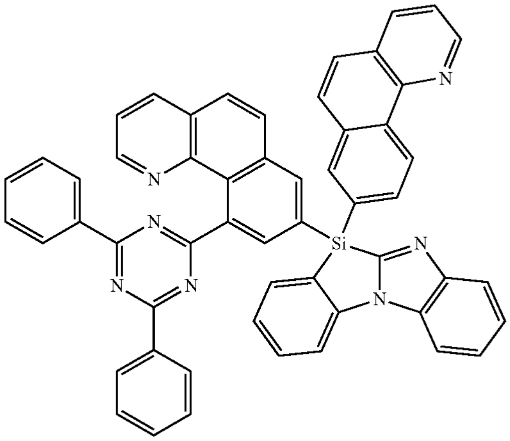

-continued
A14
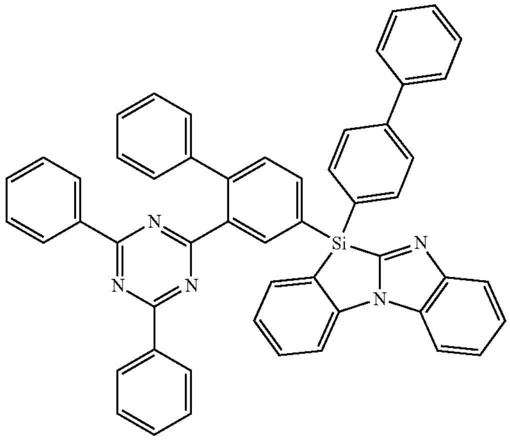
A15
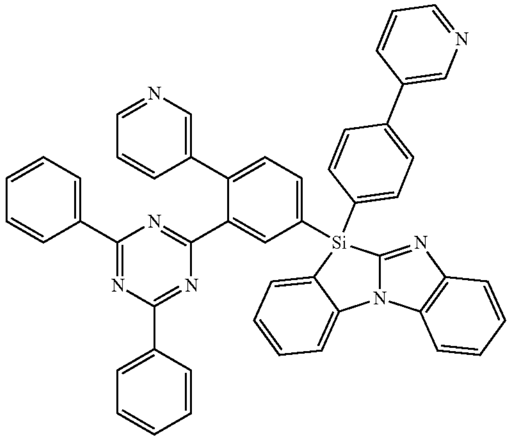
A16
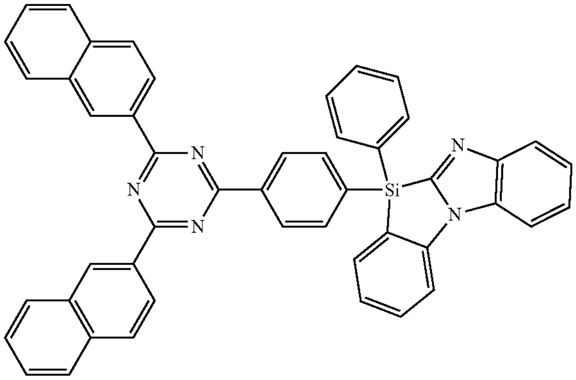
-continued
A17
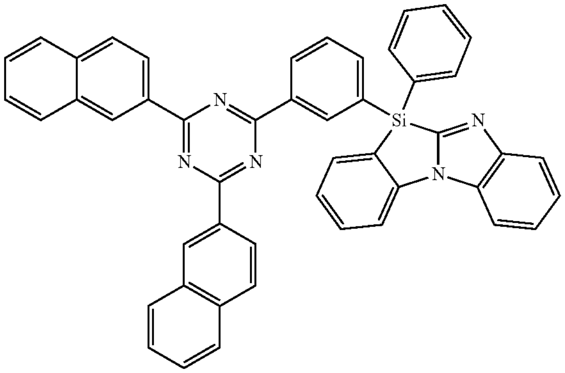
A18
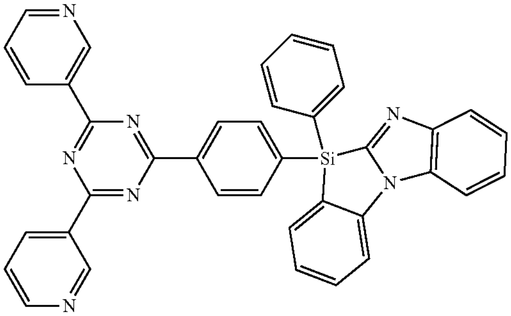
A19
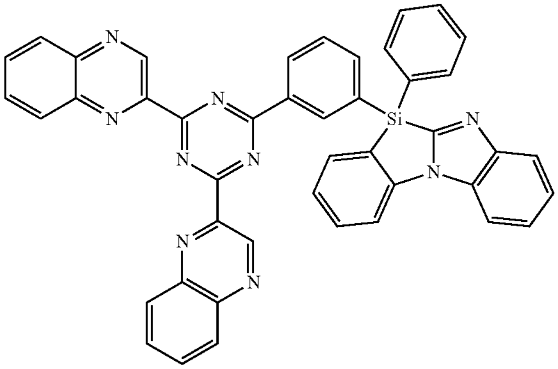
A20
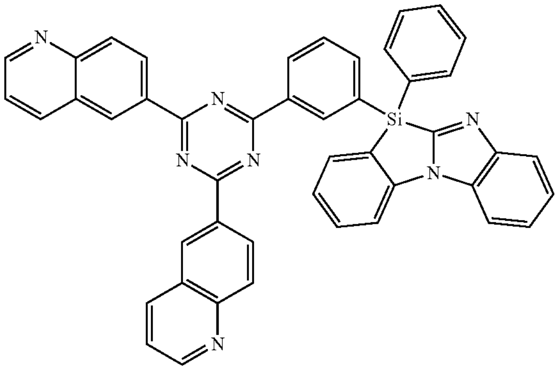

-continued
A21
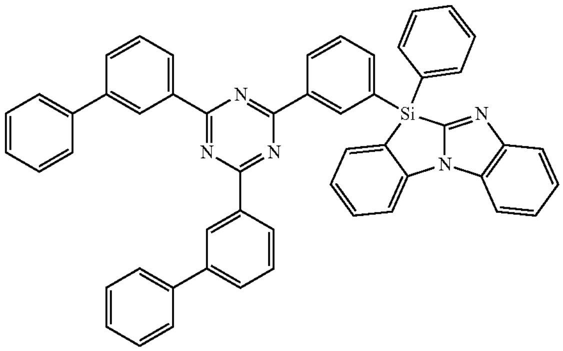
A22
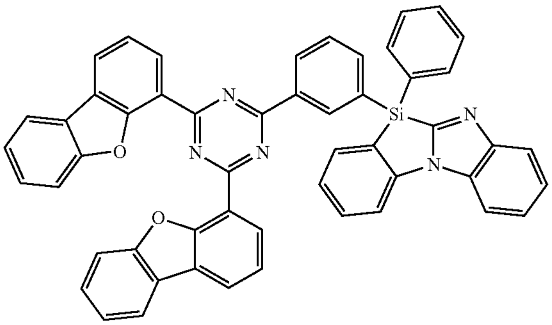
A23
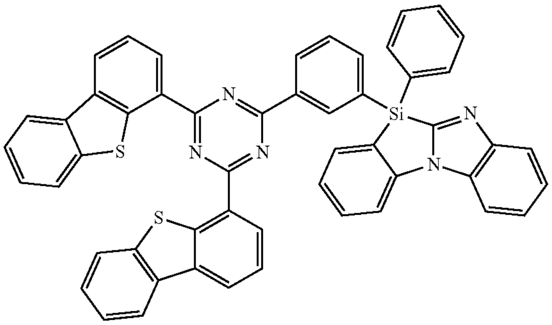
A24
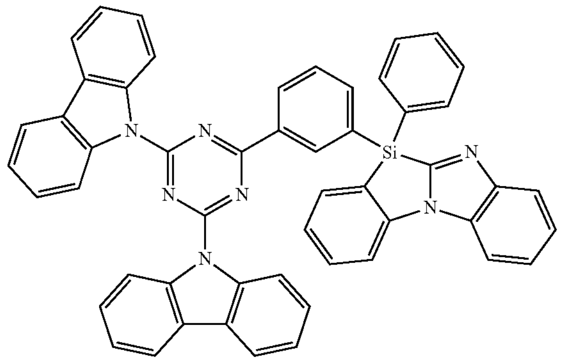
-continued
A25
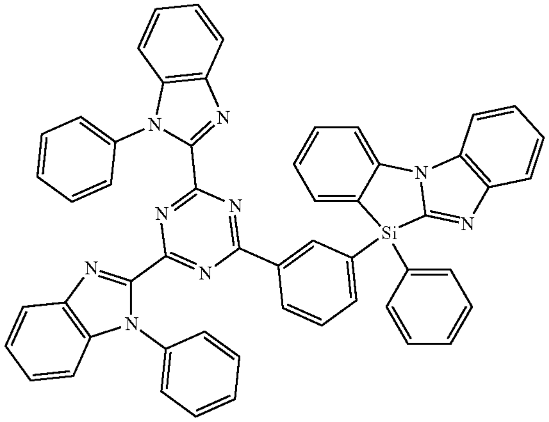
A26
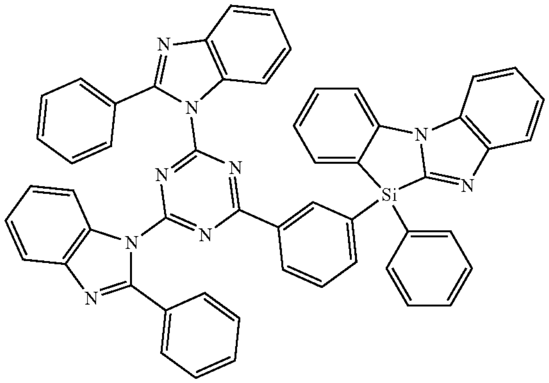
A27
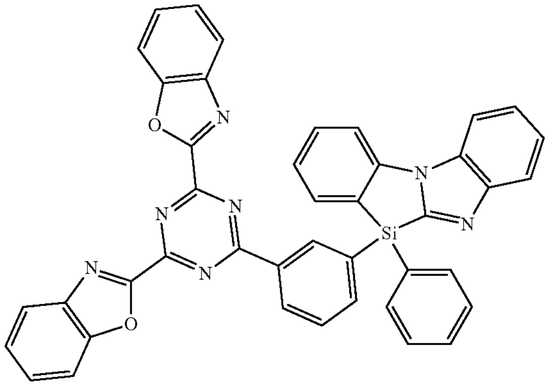

-continued
A28
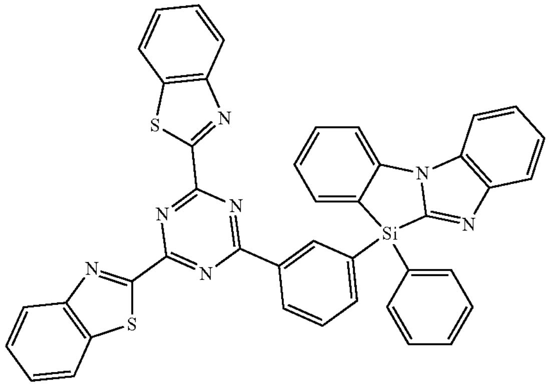
A29
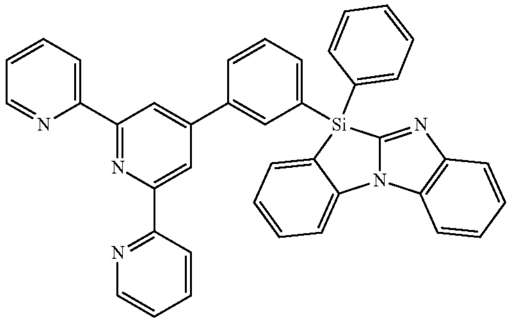
A30
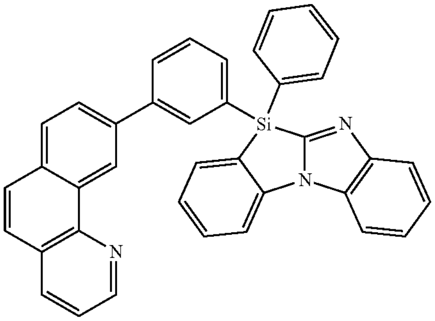
A31
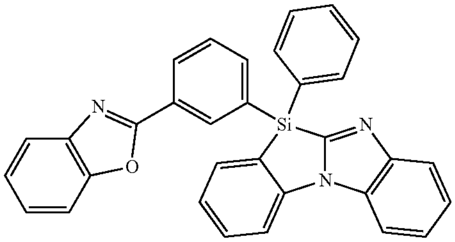
A32
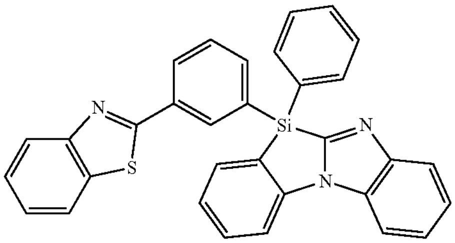
-continued
A33
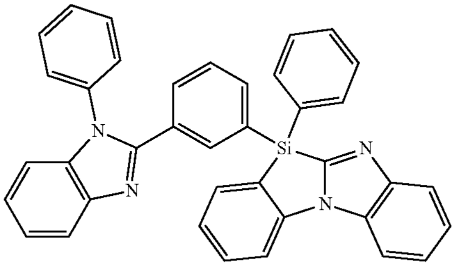
A34
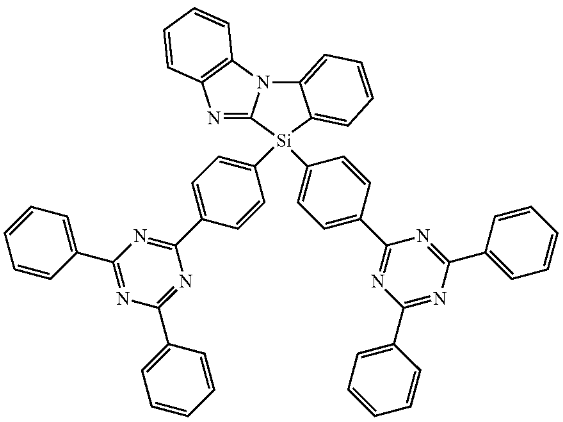
A35
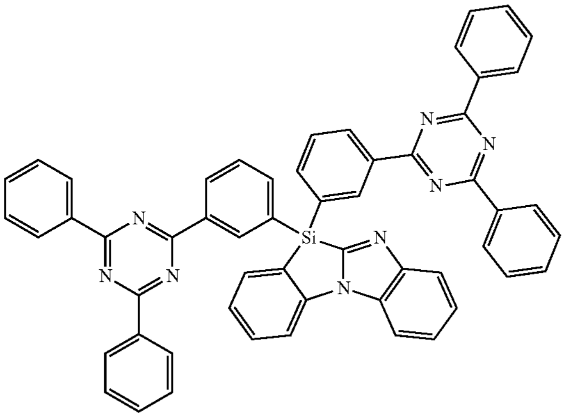
A36
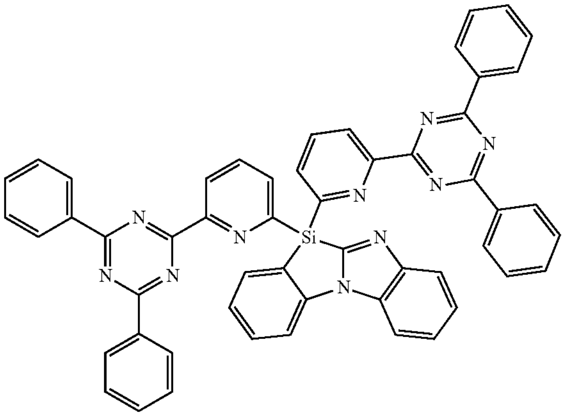

-continued
A37
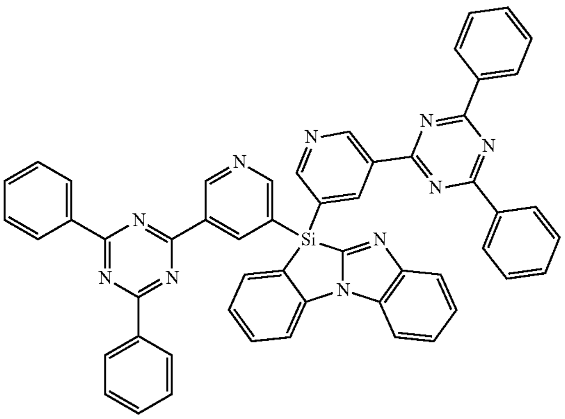
A38
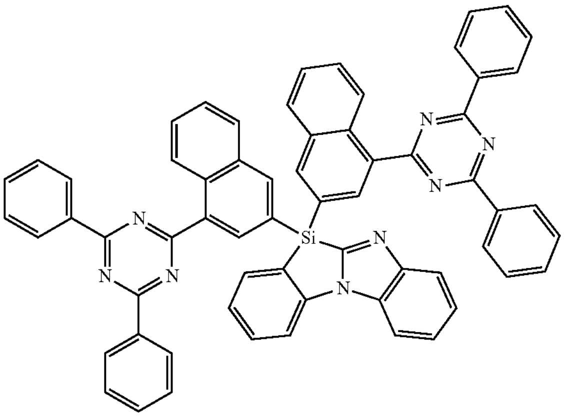
A39
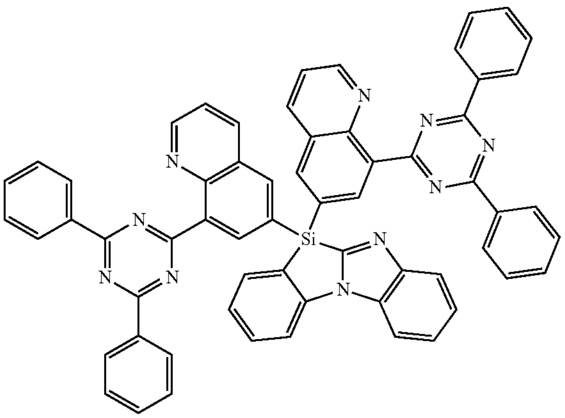
-continued
A40
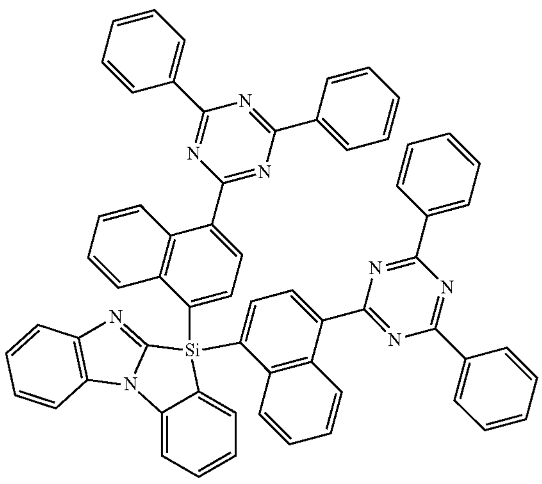
A41
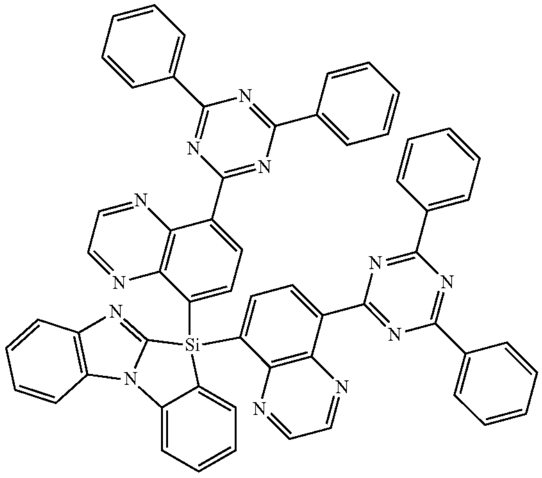
A42
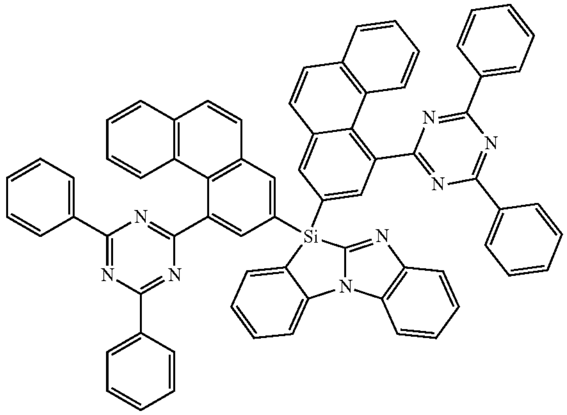

-continued
A43
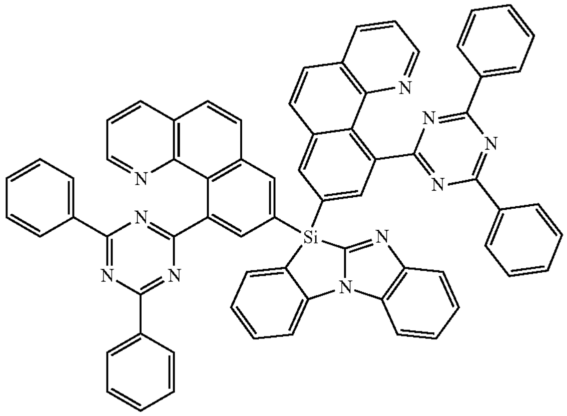
A44
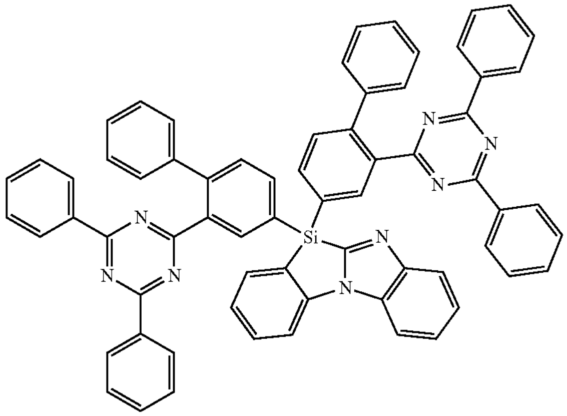
A45
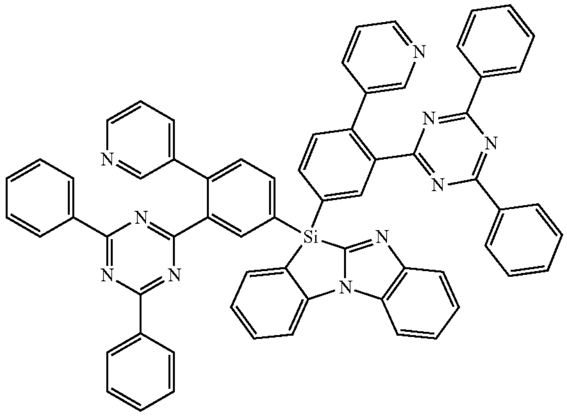
-continued
A46
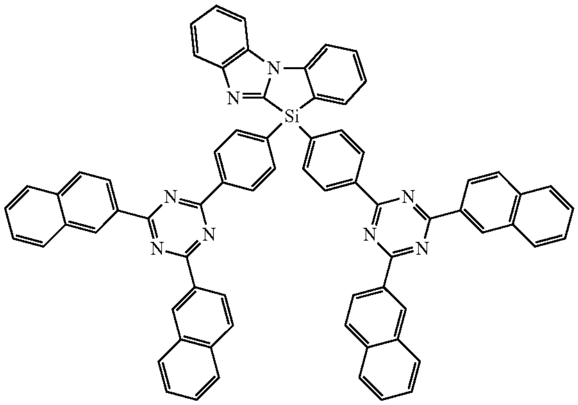
A47
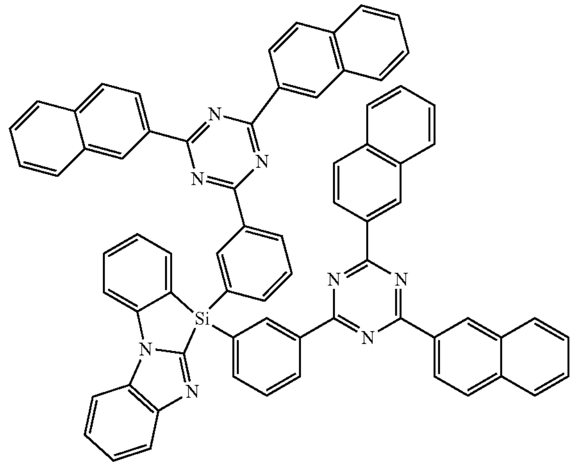
A48
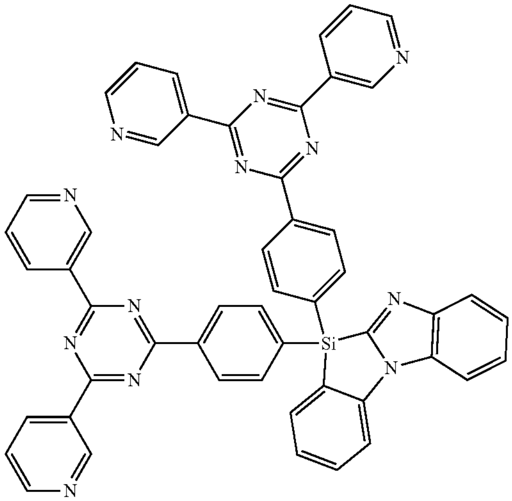

A49
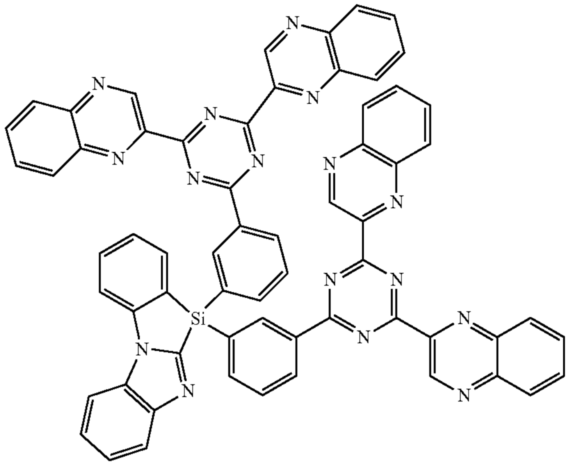
A50
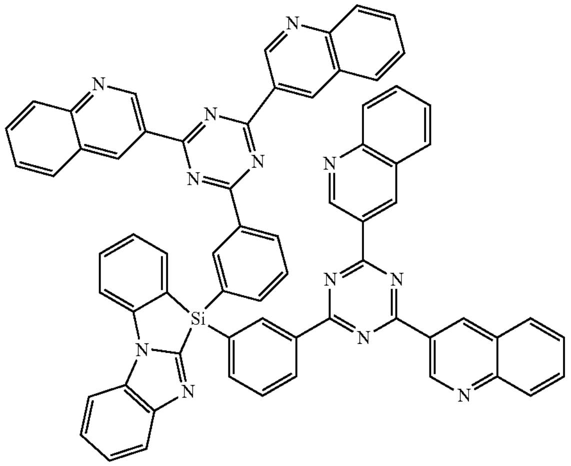
A51
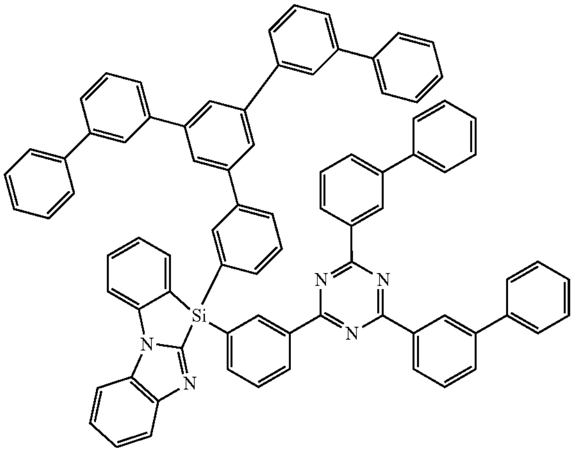
A52
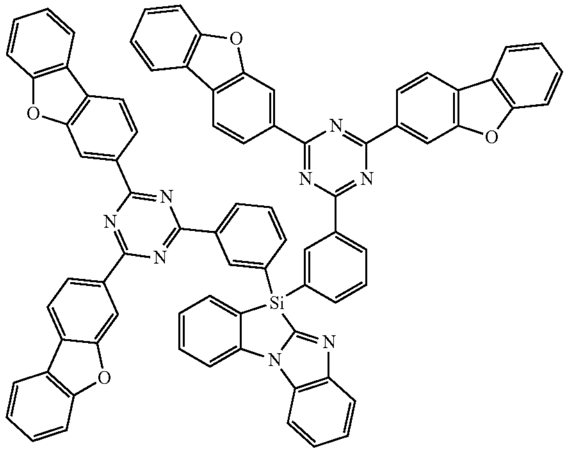
A53
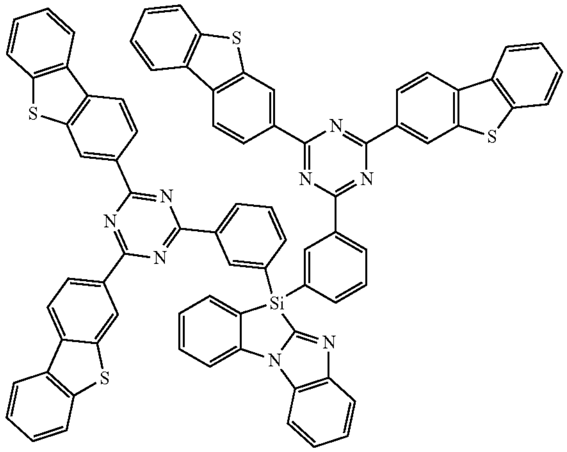
A54
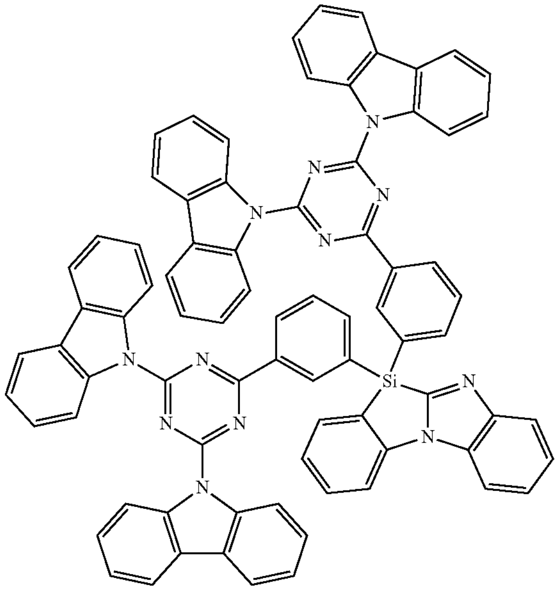

-continued
A55
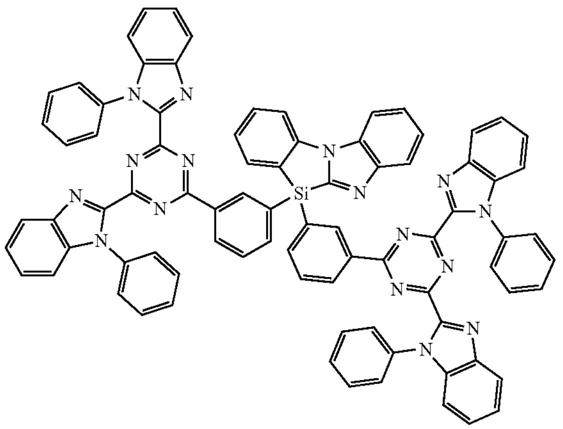
A56
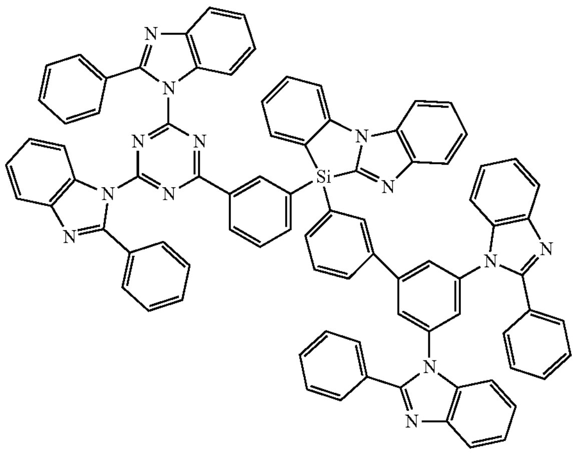
A57
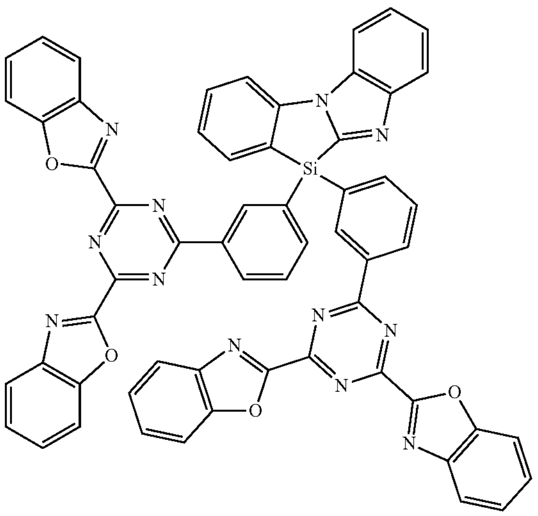
-continued
A58
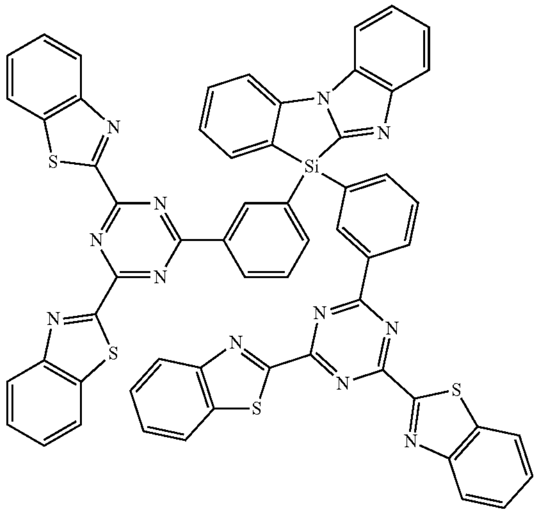
A59
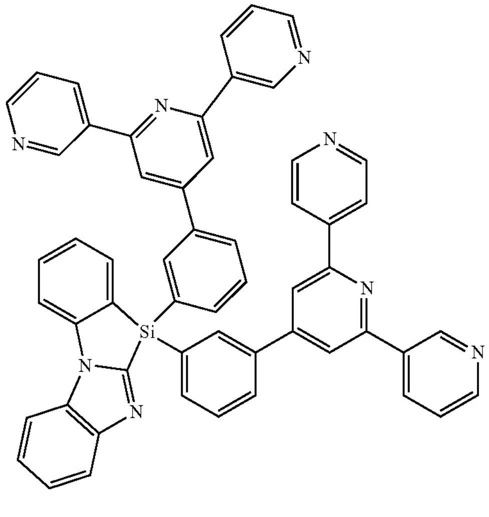
A60
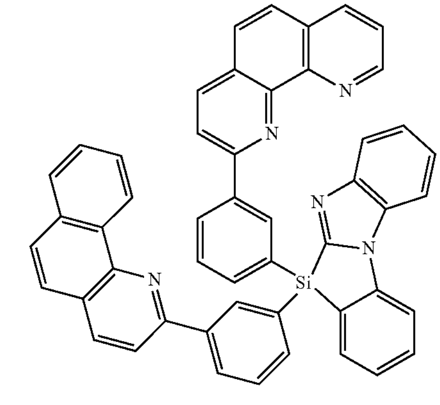

-continued
A61
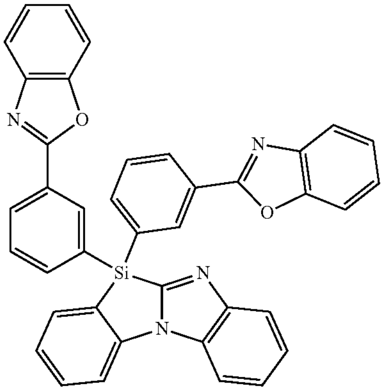
A62
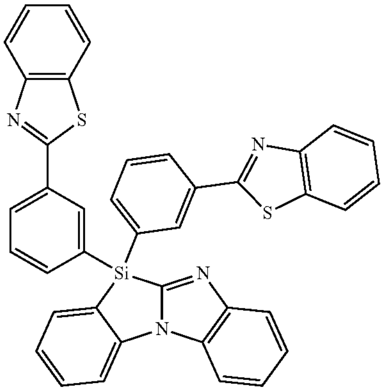
A63
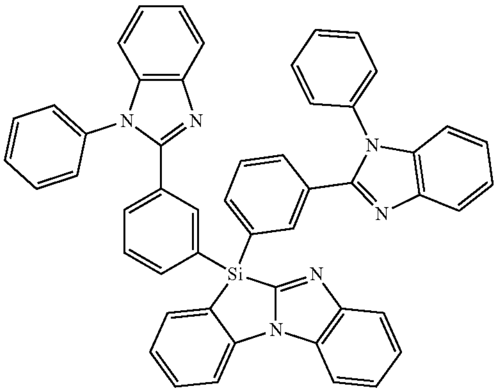
A64
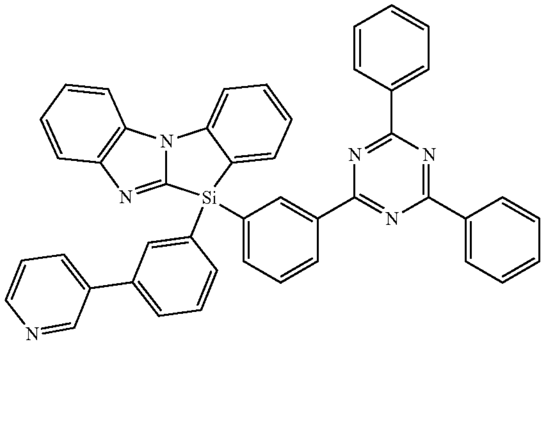
-continued
A65
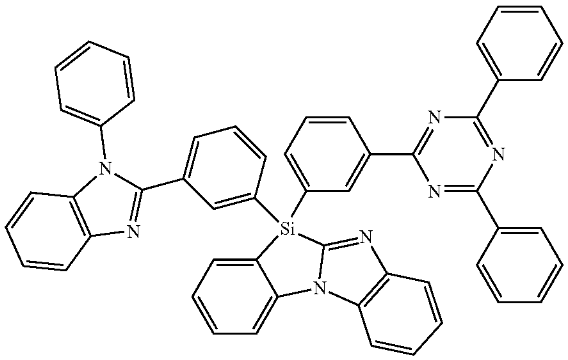
A66
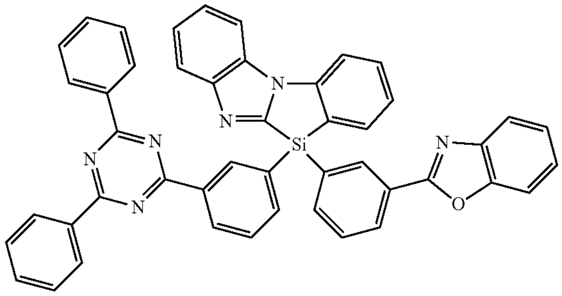
A67
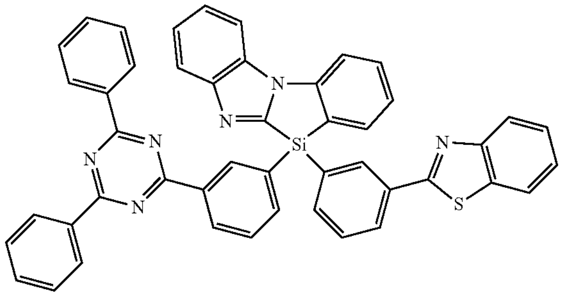
A68
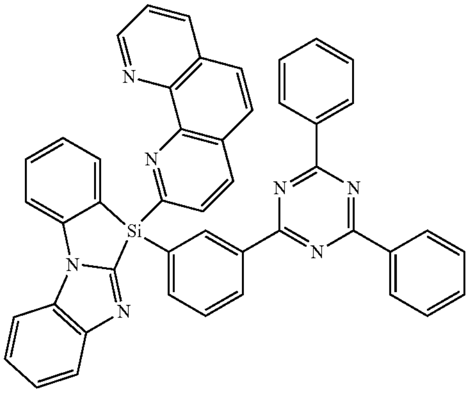

-continued
A69
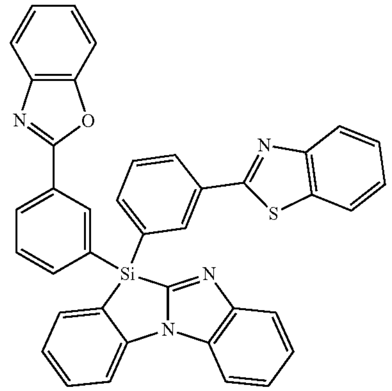
A70
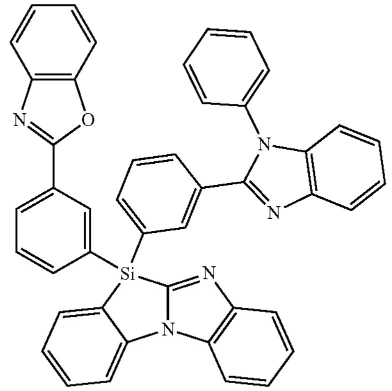
A71
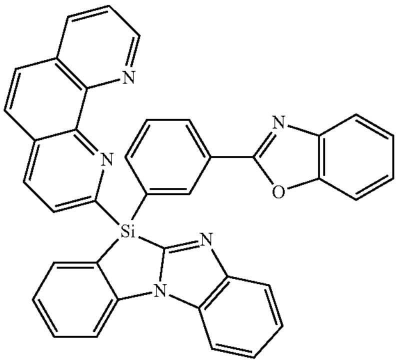
A72
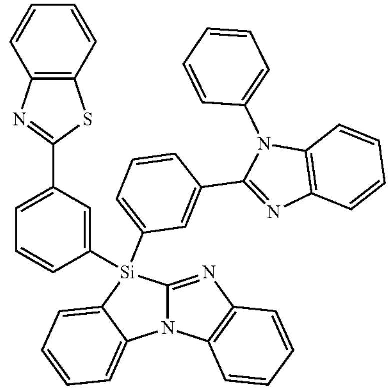
-continued
A73
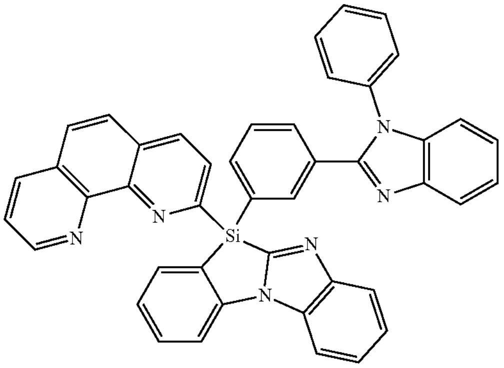
A74
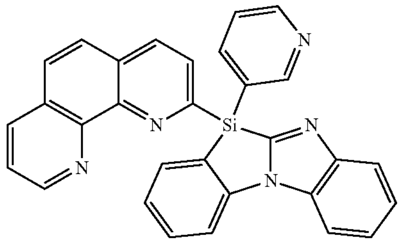
75
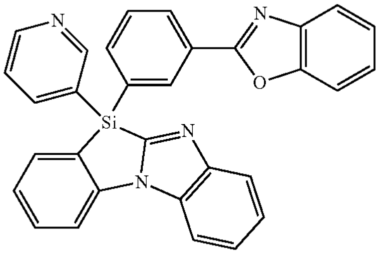
A76
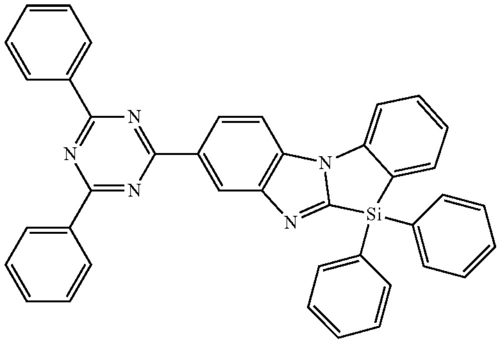
A77
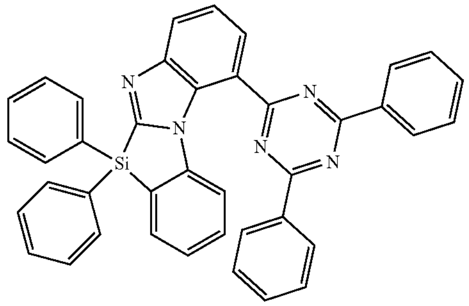

-continued
A78
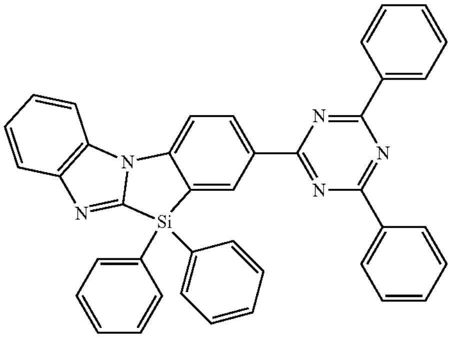
A79
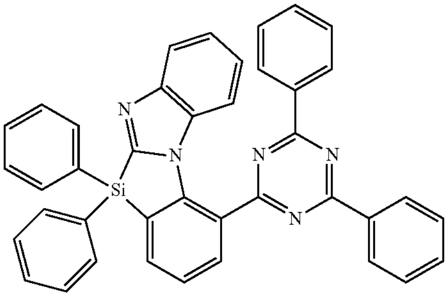
A80
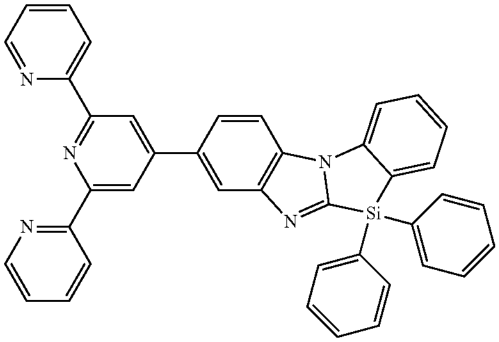
A81
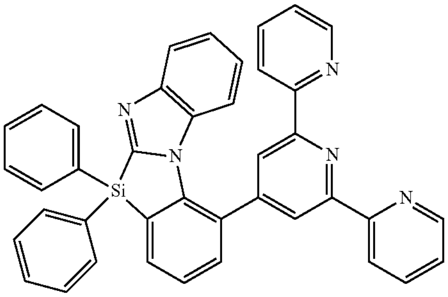
B1
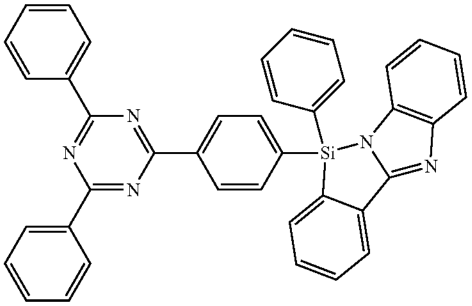
-continued
B2
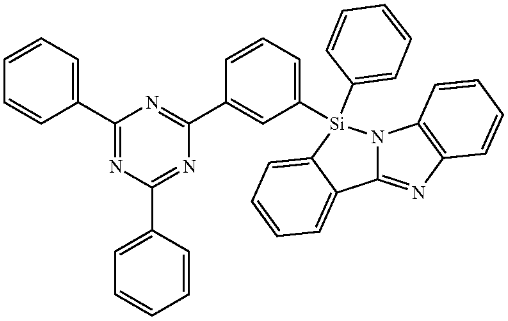
B3
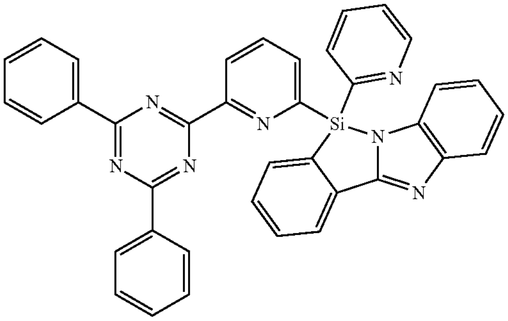
B4
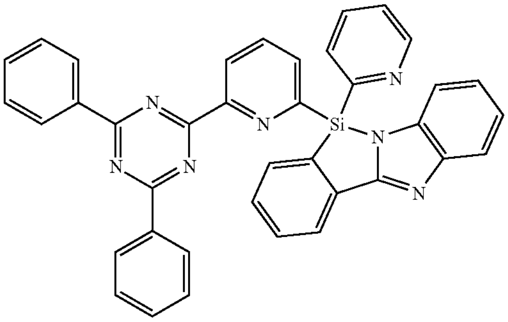
B5
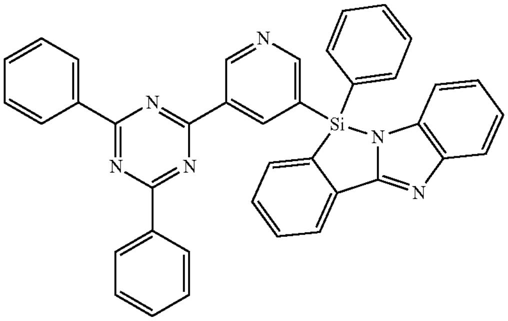
B6
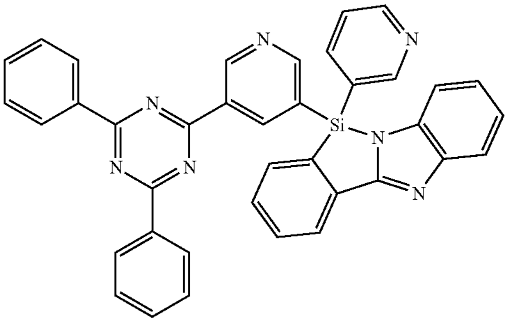

-continued
B7
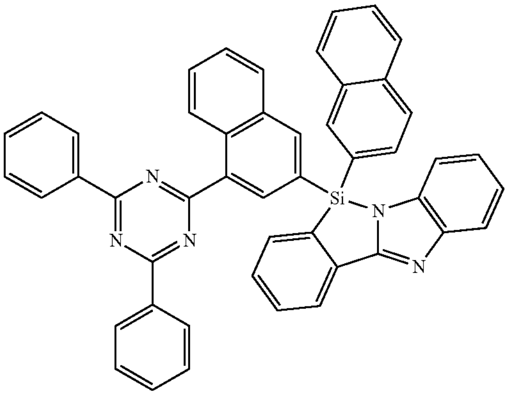
B8
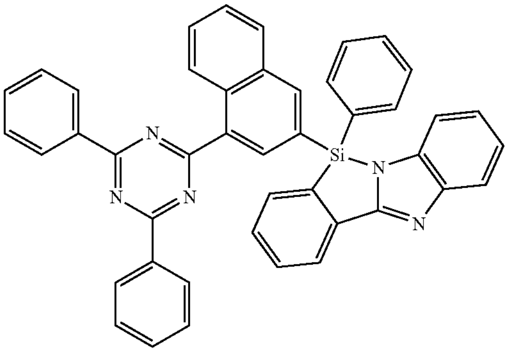
B9
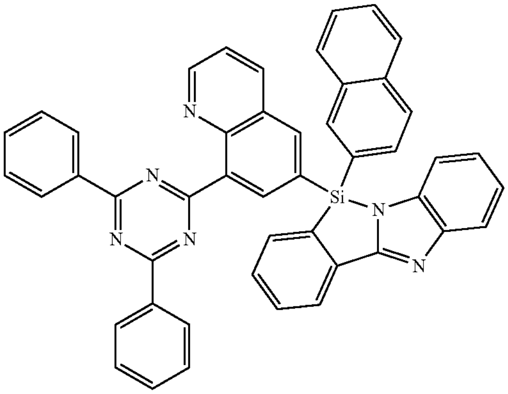
B10
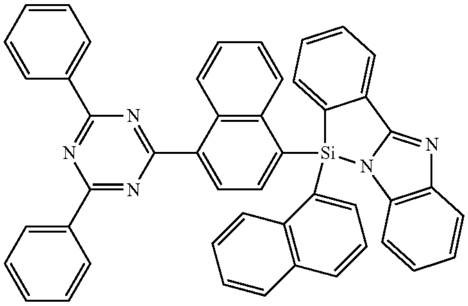
-continued
B11
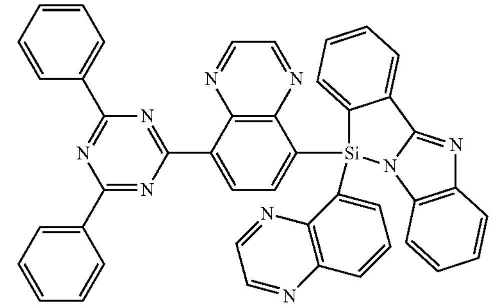
B12
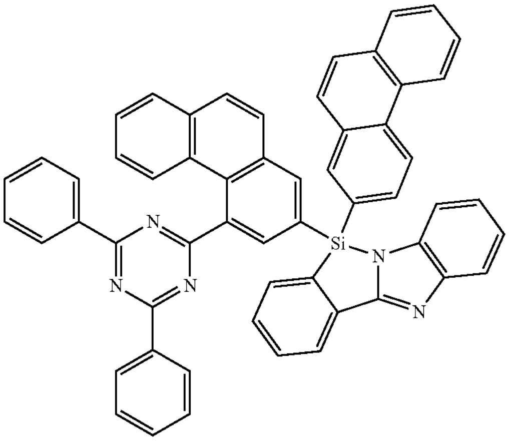
B13
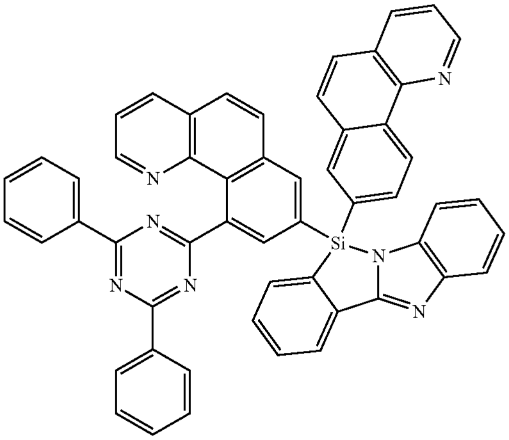
B14
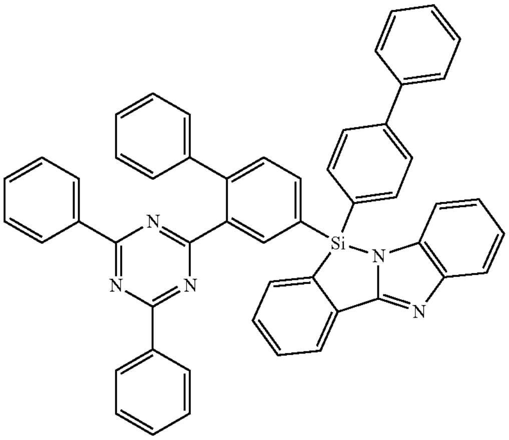

-continued
B15
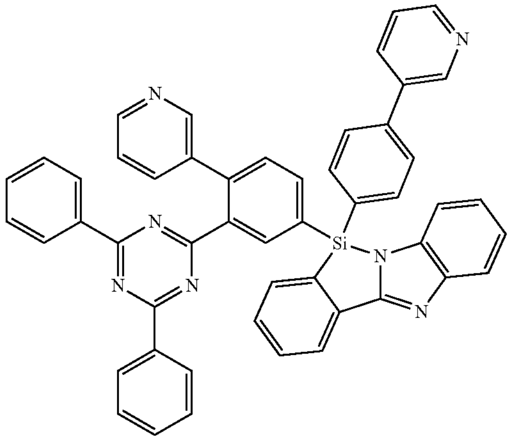
B16
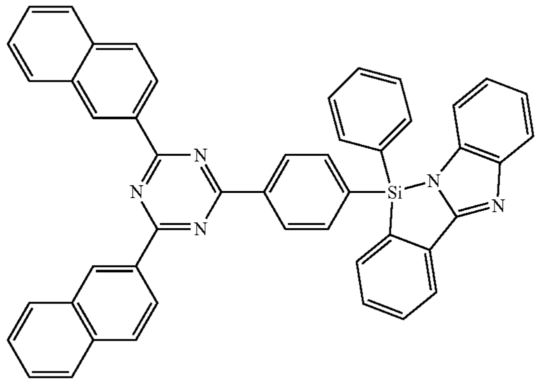
B17
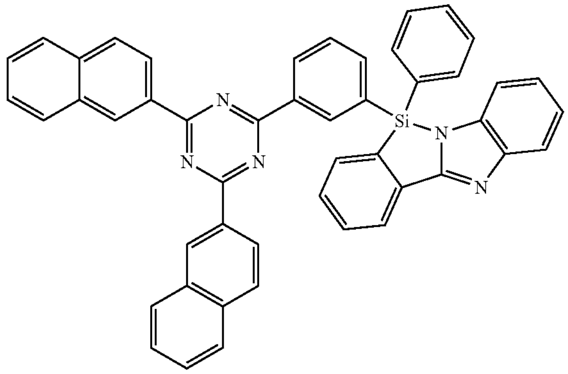
B18
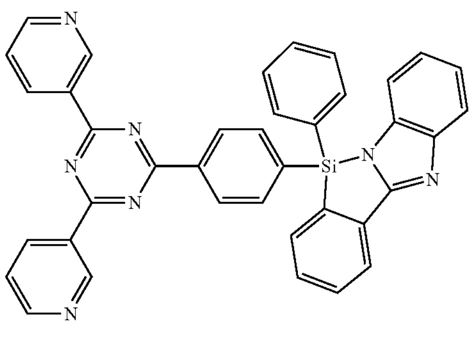
-continued
B19
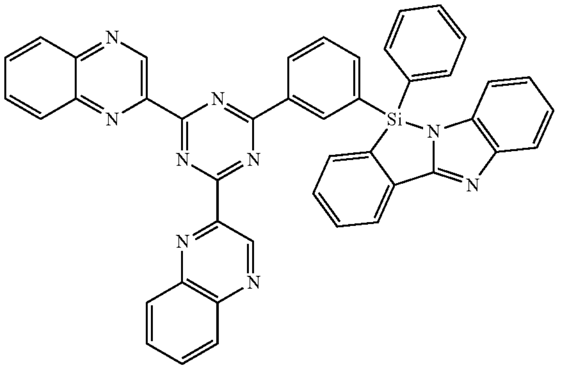
B20
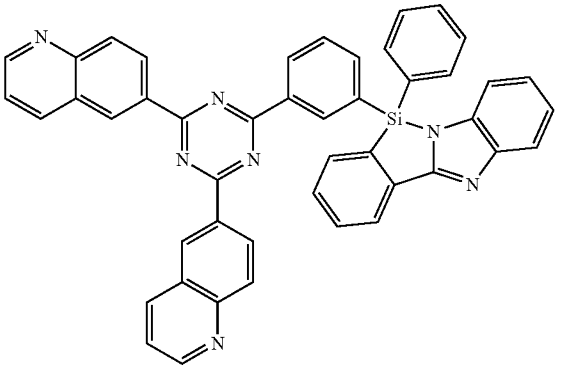
B21
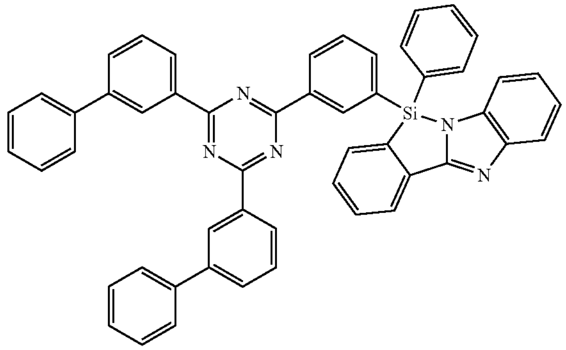
B22
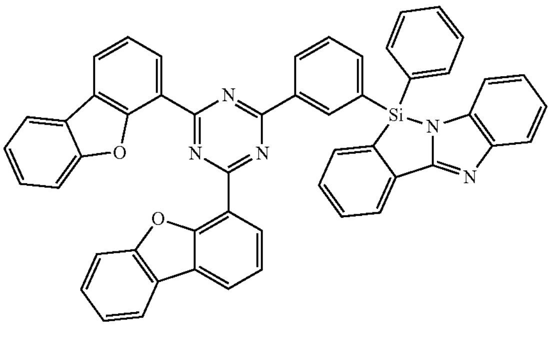

-continued
B23
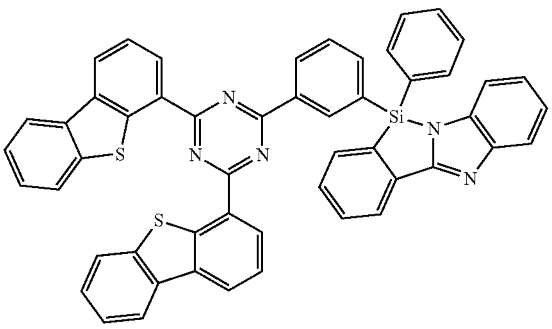
B24
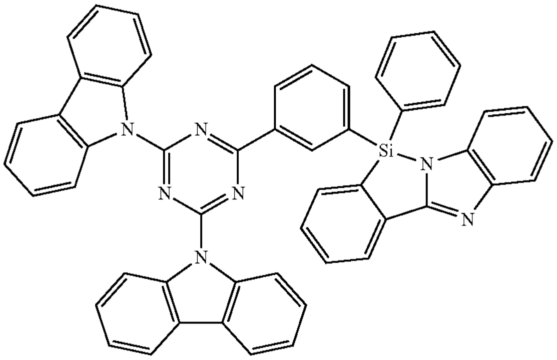
B25
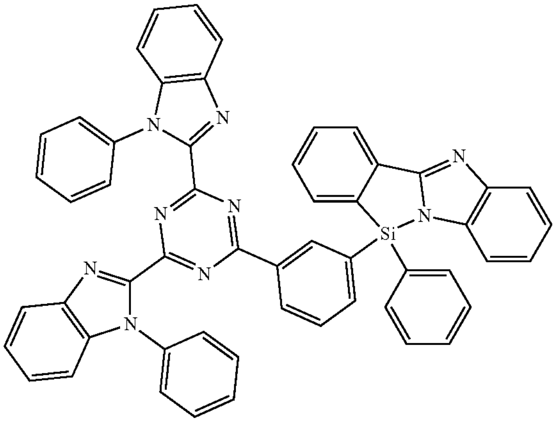
B26
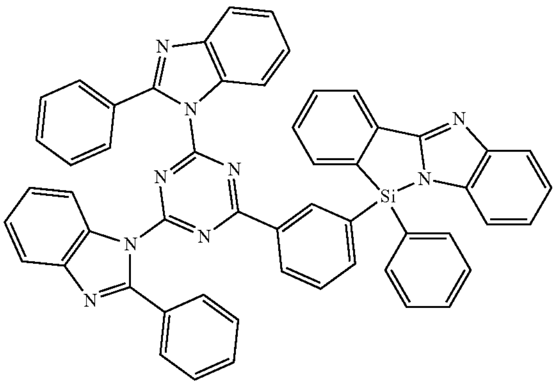
-continued
B27
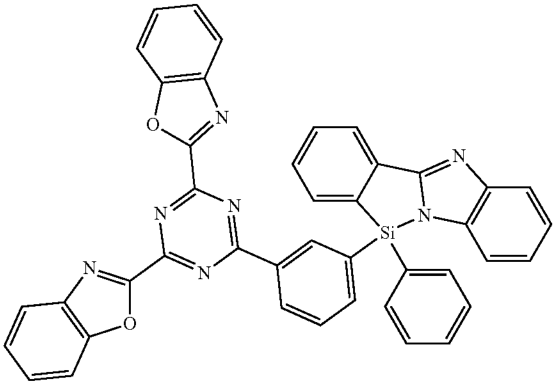
B28
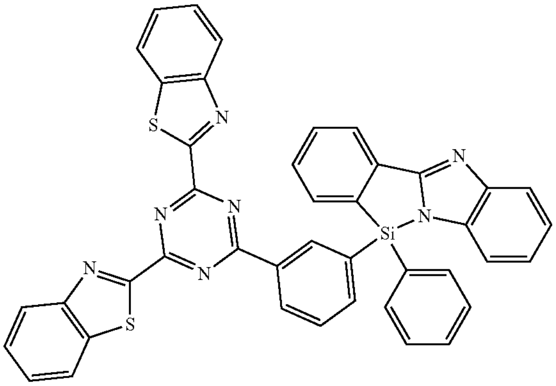
B29
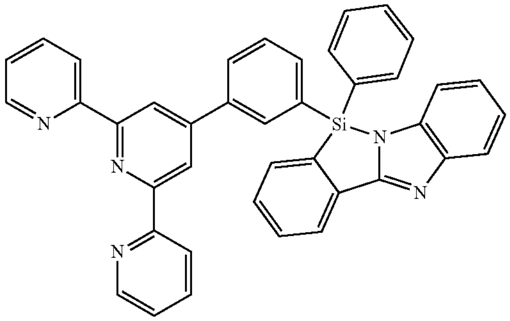
B30
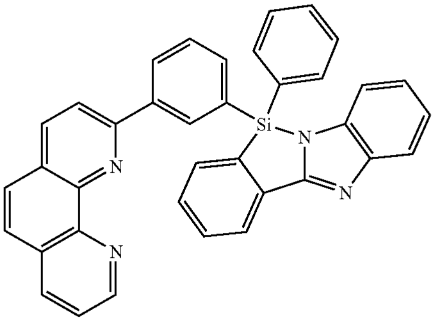

-continued
B31
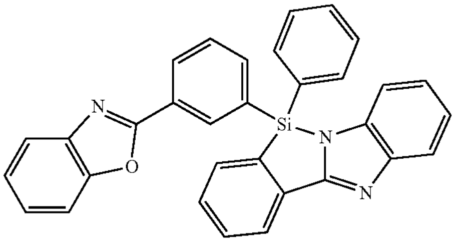
B32
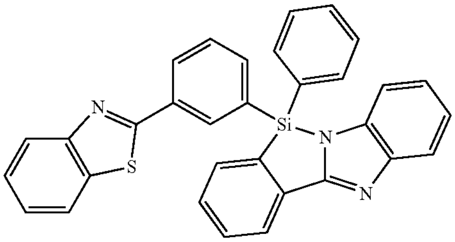
B33
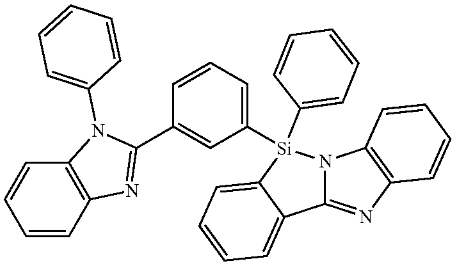
A34
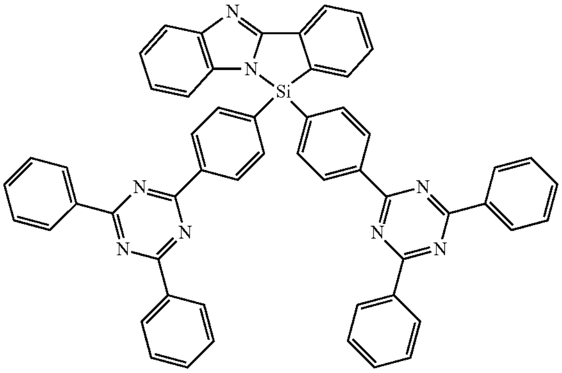
B35
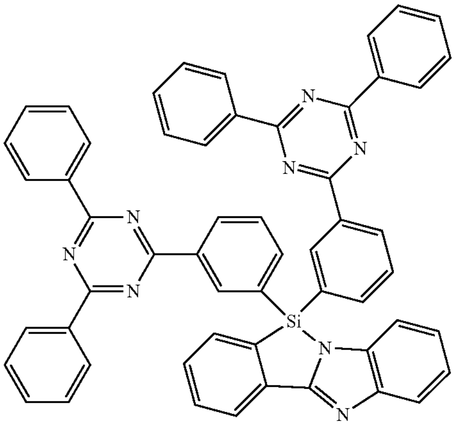
-continued
B36
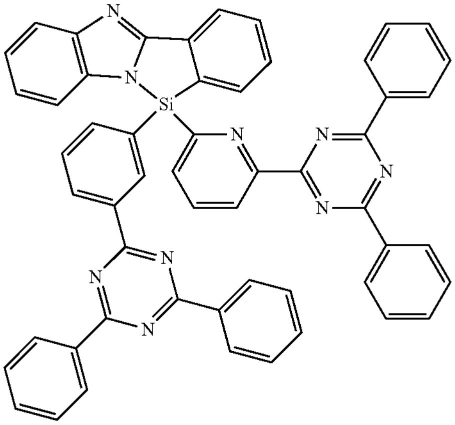
B37
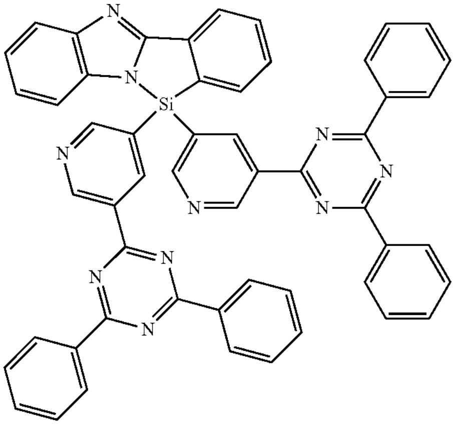
B38
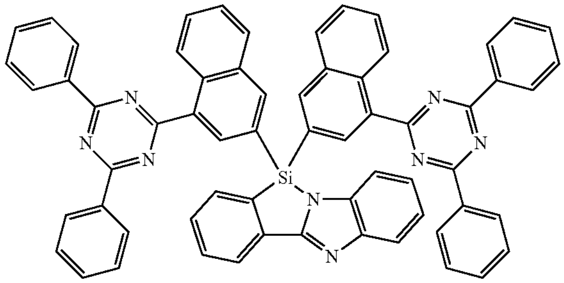
B39
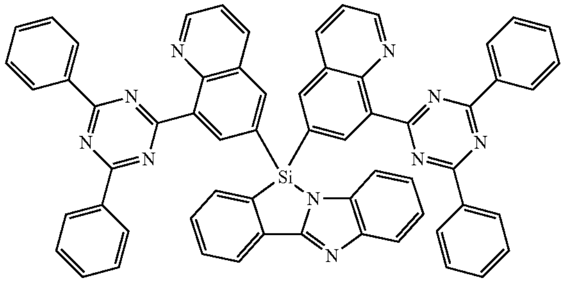

-continued
B40
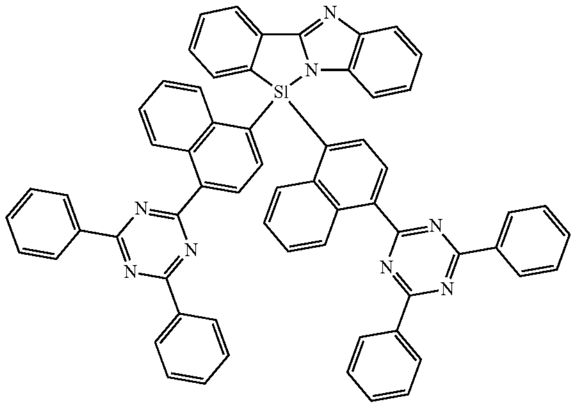
B41
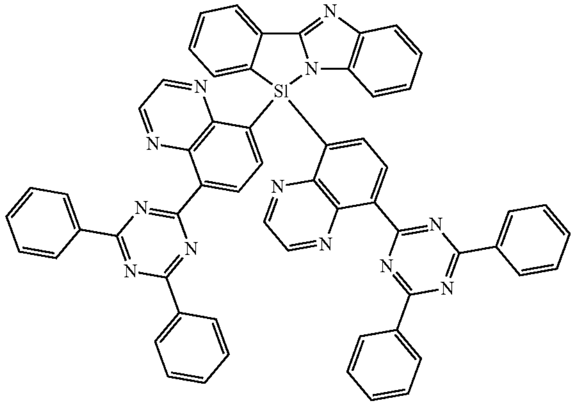
B42
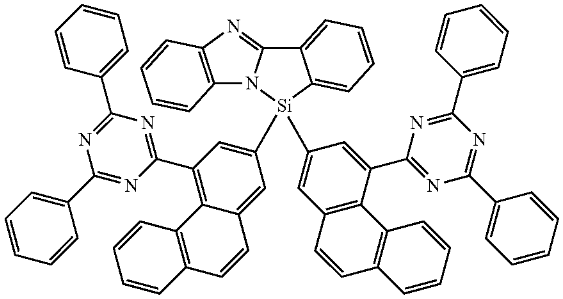
B43
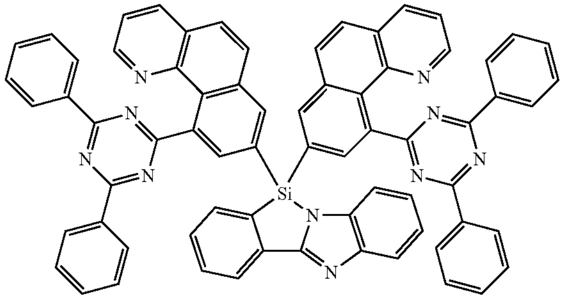
-continued
B44
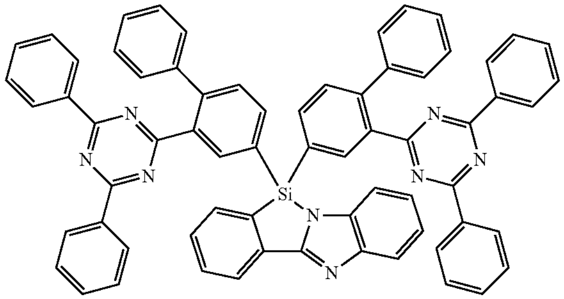
B45
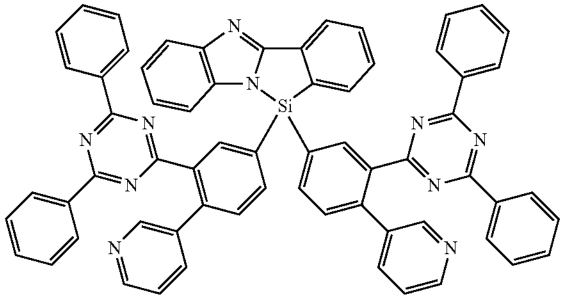
B46
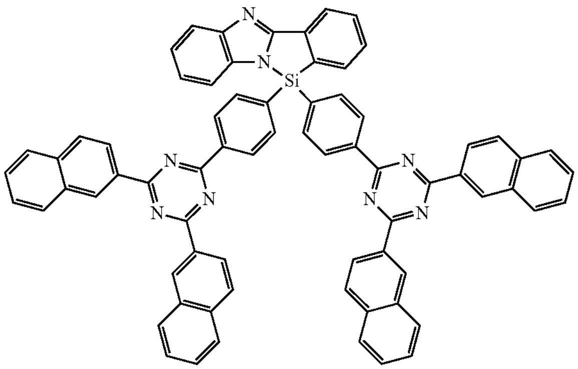
B47
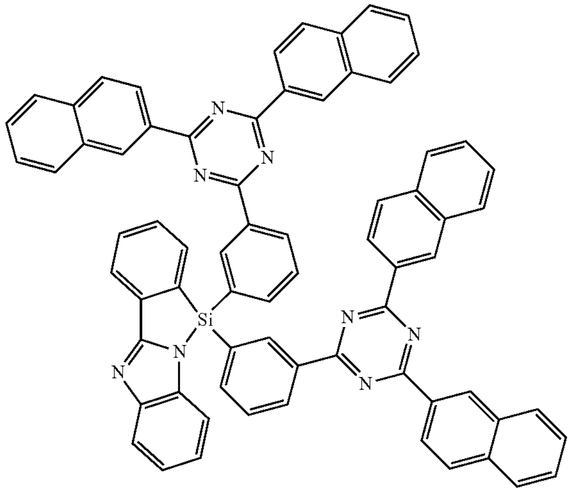

-continued
B48
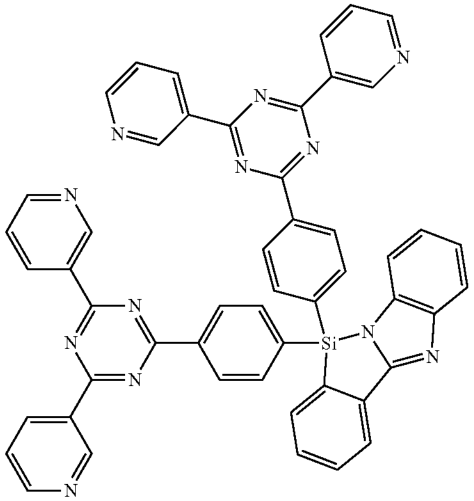
B49
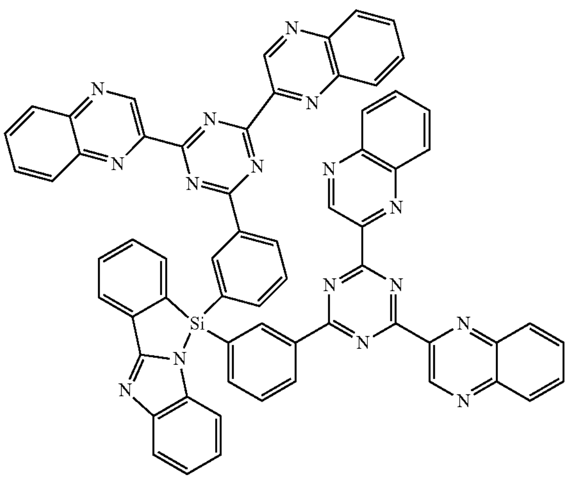
B50
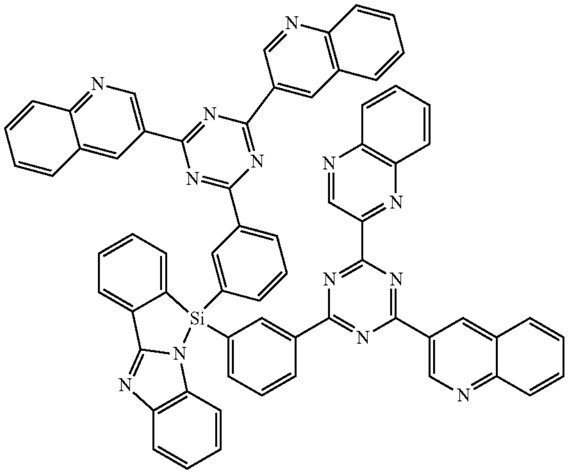
-continued
B51
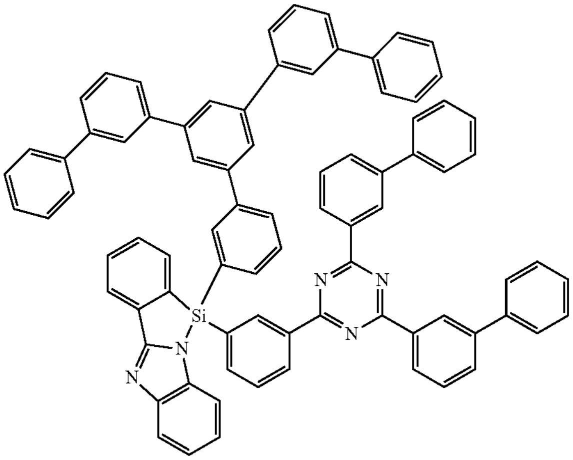
B52
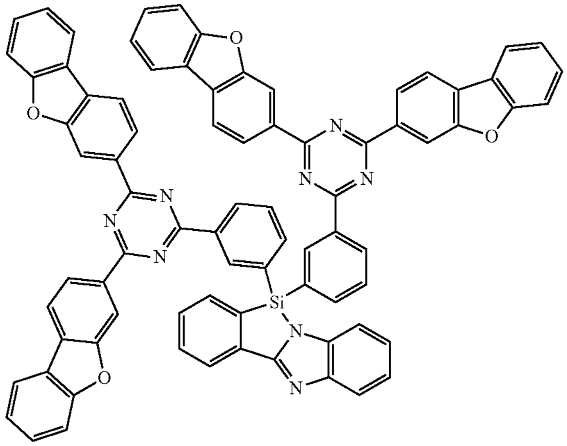
B53
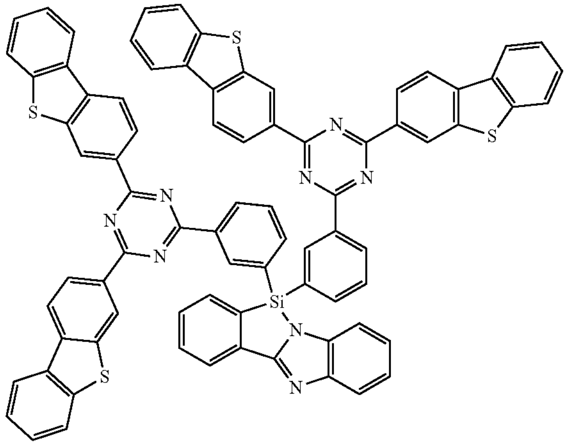

-continued
B54
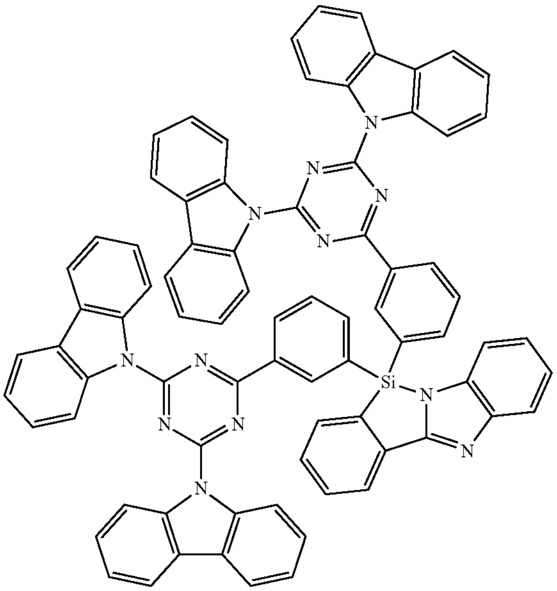
B55
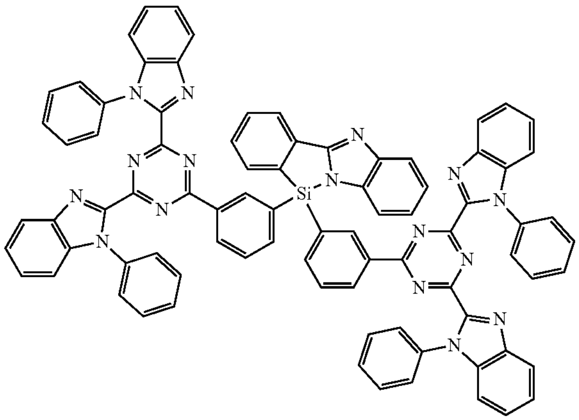
B56
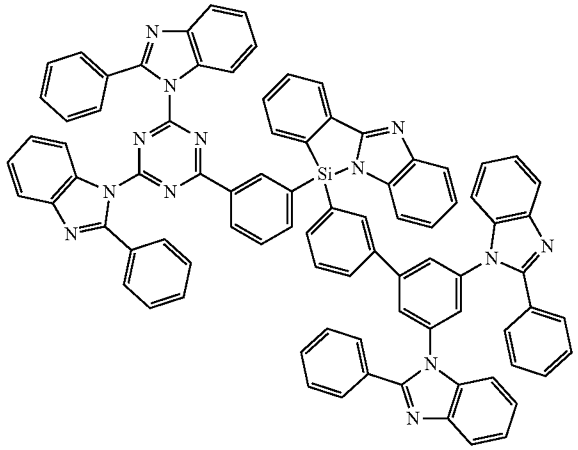
-continued
B57
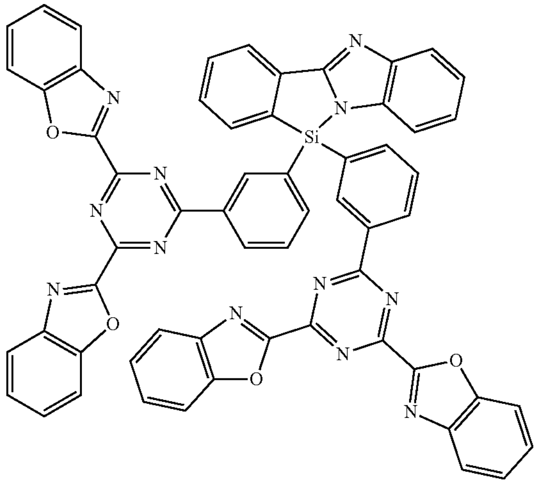
B58
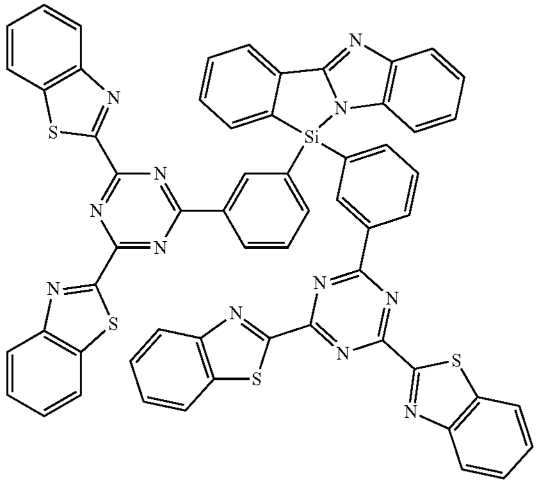
B59
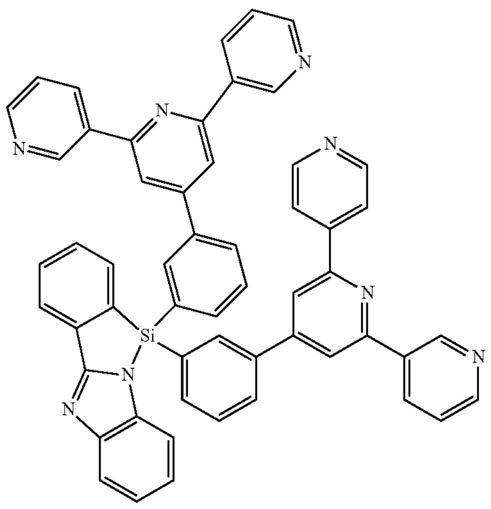

-continued
B60
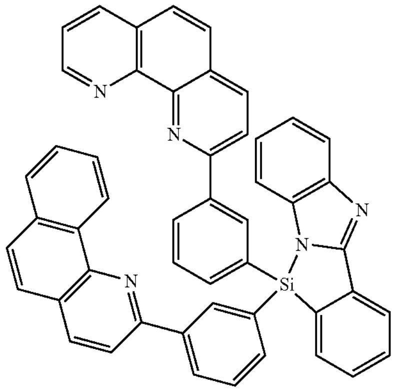
B61
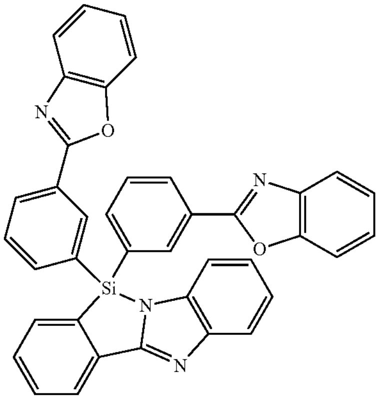
B62
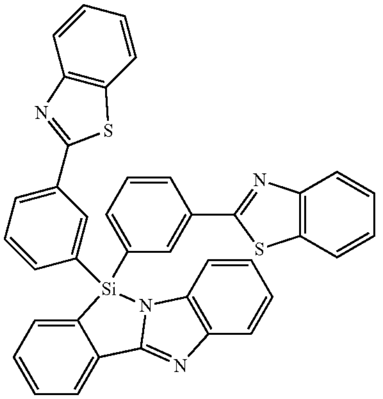
B63
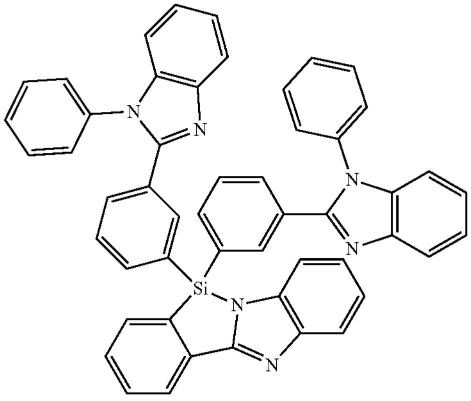
-continued
B64
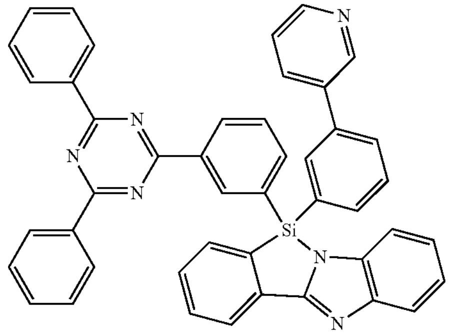
B65
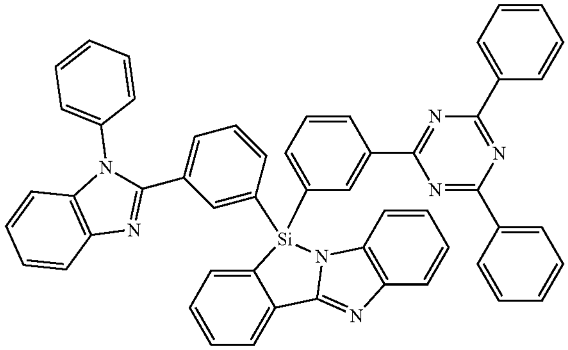
B66
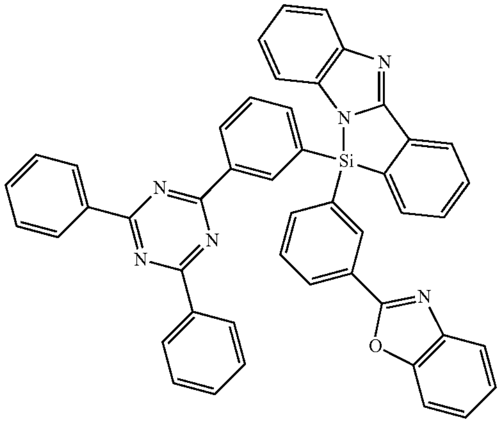
B67
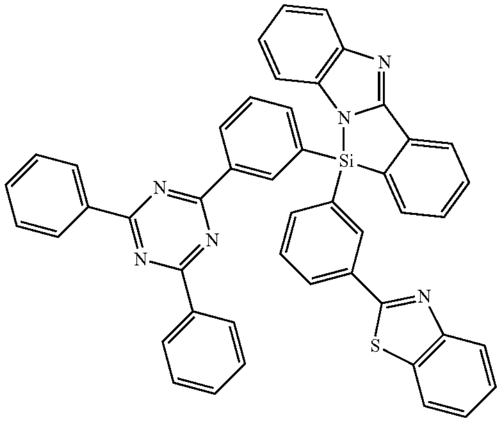

-continued
B68
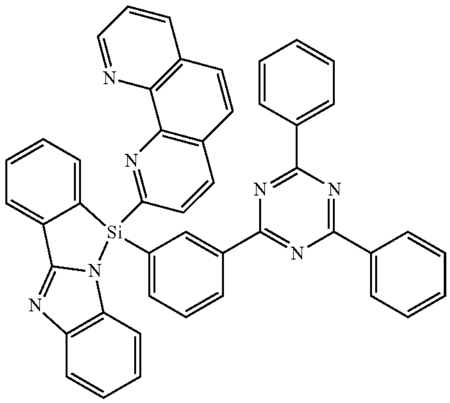
B69
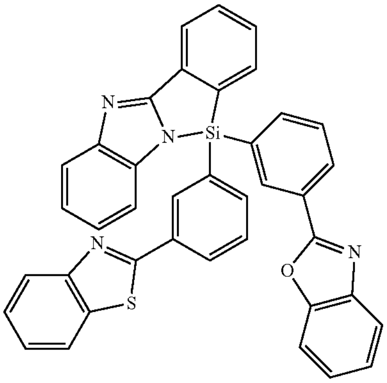
B70
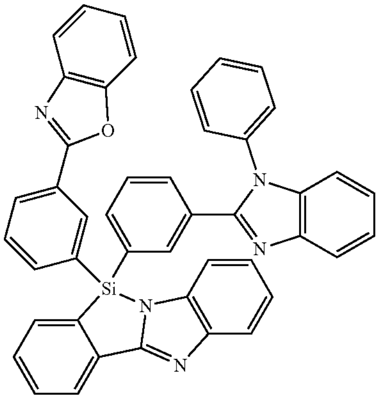
B71
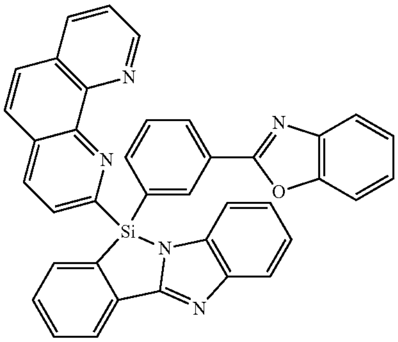
-continued
B72
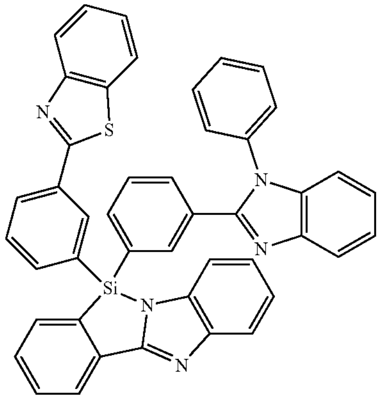
B73
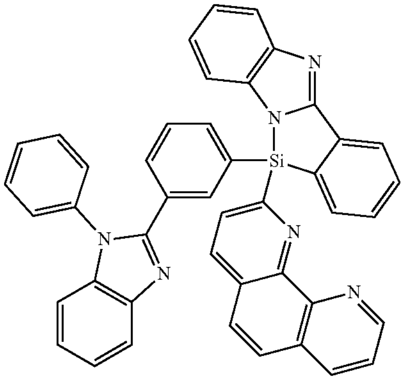
B74
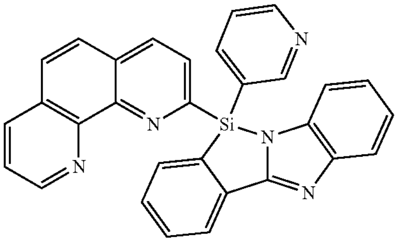
B75
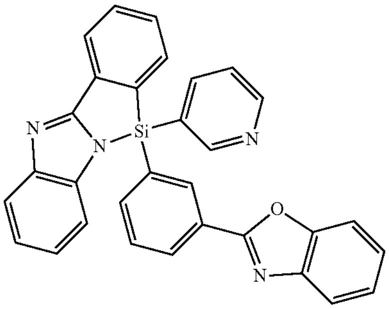

-continued

B76

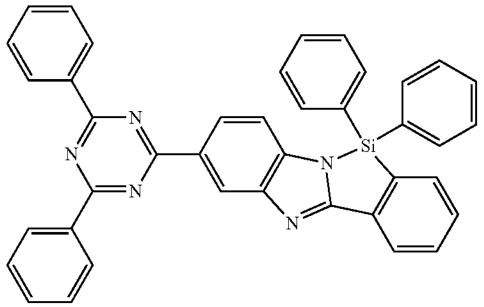

B77

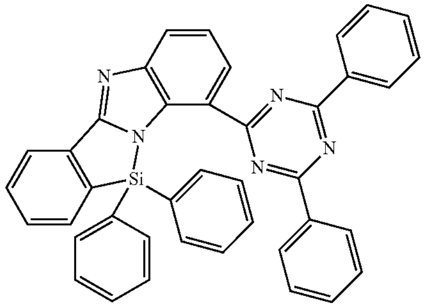

B78

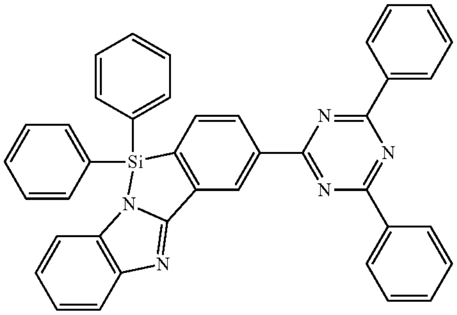

B79

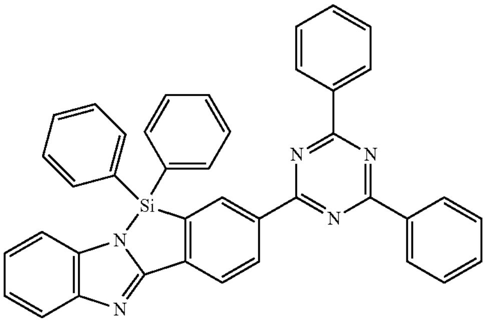

B80

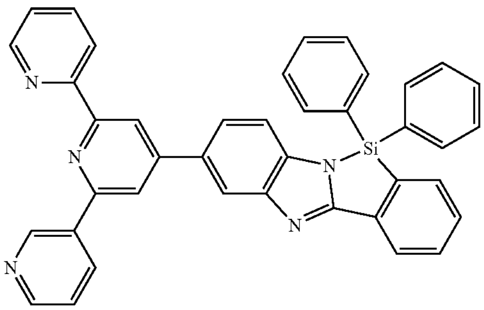

-continued

B81

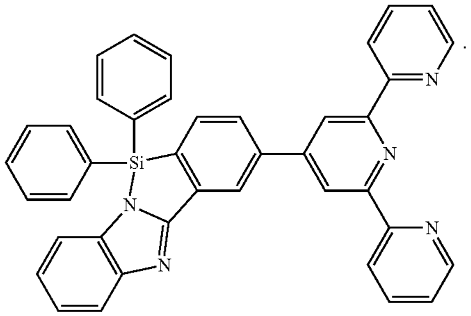

18. An organic light-emitting device, comprising: an anode; a cathode; and an organic thin film layer between the anode and the cathode, the organic thin film layer includes a compound, having a structure of Formula II or Formula III:

Formula III

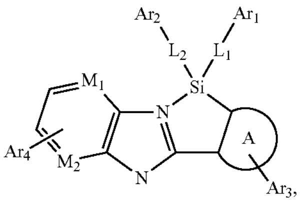

wherein: M1 and M2 are each independently a carbon atom or or a nitrogen atom; Ais a substituted or unsubstituted aryl group or a substituted or unsubstituted heteroaryl group; $L_1$ and $L_2$ are each independently a single bond, a substituted or unsubstituted aryl group, or a substituted or unsubstituted heteroaryl group; $Ar_1$, $Ar_2$, $Ar_3$, and $Ar_4$ are each independently a hydrogen atom, a deuterium atom, a cyano group, a nitro group, an amino group, a hydroxy group, a halogen atom, a substituted or unsubstituted alkyl group, a substituted or unsubstituted aryl group, or a substituted or unsubstituted heteroaryl group.

19. A display panel, comprising: an organic light-emitting device, wherein the organic light-emitting device includes: an anode; a cathode; and an organic thin film layer between the anode and the cathode, the organic thin film layer includes a compound, having a structure of Formula II or Formula III:

Formula II

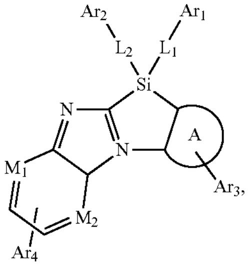

-continued

Formula III

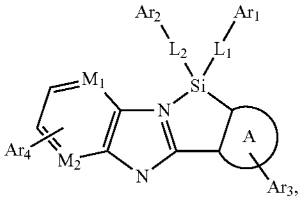

wherein: M1 and M2 are each independently a carbon atom or a nitrogen atom; A is a substituted or unsubstituted aryl group or a substituted or unsubstituted heteroaryl group; $L_1$ and $L_2$ are each independently a single bond, a substituted or unsubstituted aryl group, or a substituted or unsubstituted heteroaryl group; $Ar_1$, $Ar_2$, $Ar_3$, and $Ar_4$ are each independently a hydrogen atom, a deuterium atom, a cyano group, a nitro group, an amino group, a hydroxy group, a halogen atom, a substituted or unsubstituted alkyl group, a substituted or unsubstituted aryl group, or a substituted or unsubstituted heteroaryl group.

* * * * *